United States Patent [19]
Futatsuya et al.

[11] Patent Number: 5,548,557
[45] Date of Patent: Aug. 20, 1996

[54] NONVOLATILE SEMICONDUCTOR MEMORY DEVICE WITH A ROW REDUNDANCY CIRCUIT

[75] Inventors: Tomoshi Futatsuya; Masaaki Mihara; Yasushi Terada; Takeshi Nakayama; Yoshikazu Miyawaki; Shinichi Kobayashi; Minoru Ohkawa, all of Hyogo-ken, Japan

[73] Assignee: Mitsubishi Denki Kabushiki Kaisha, Tokyo, Japan

[21] Appl. No.: 179,731

[22] Filed: Jan. 11, 1994

[30] Foreign Application Priority Data

Jan. 12, 1993 [JP] Japan ................................. 5-003189
Jul. 16, 1993 [JP] Japan ................................. 5-176502
Nov. 4, 1993 [JP] Japan ................................. 5-275544

[51] Int. Cl.$^6$ ................................................ G11C 16/06
[52] U.S. Cl. ...................... 365/201; 365/185.09; 365/200
[58] Field of Search .................................. 365/104, 182, 365/185, 201, 230.06, 200, 189.11, 189.09, 185.22

[56] References Cited

U.S. PATENT DOCUMENTS

| | | | |
|---|---|---|---|
| 4,729,119 | 3/1988 | Dennison et al. | 365/63 X |
| 4,751,679 | 6/1988 | Dehganpour | 365/201 |
| 4,870,618 | 9/1989 | Iwashita | 365/201 |
| 4,954,994 | 9/1990 | Hashimoto | 365/230.06 |
| 4,999,813 | 3/1991 | Ohtsuka et al. | 365/201 |

OTHER PUBLICATIONS

Digital Kairo No Kiso, Saito et al., Tokai Daigaku Shuppan Kai, pp. 8–12.

A New Erasing and Row Decoding Scheme for Low Supply Voltage Operation 16–Mb/64–Mb Flash Memories, Yoshikazu Miyawaki et al., IEEE Journal of Solid–State Circuits, vol. 27, No. 4, Apr. 1992, pp. 583–588.

Primary Examiner—Joseph A. Popek
Attorney, Agent, or Firm—Lowe, Price, LeBlanc & Becker

[57] ABSTRACT

A collective erasure type nonvolatile semiconductor memory device which allows use of redundant structure to word lines is provided. A row address buffer having address converting function simultaneously selects a plurality of physically adjacent word lines from a memory array in programming before erasure. Programming before erasure is effected on the memory cells on the simultaneously selected word lines. Even when physically adjacent word lines are short-circuited between each other, programming high voltage can be transmitted to the defective word lines, as these word lines are selected simultaneously. Therefore, the memory cells on the defective word lines can be programmed before erasure, so that over erasure at the time of collective erasing operation can be prevented. Thus, redundant structure for replacing defecting word lines by spare word lines can be utilized.

39 Claims, 65 Drawing Sheets

(A)

(B)

| STX | ST(X-1) | ST(X-2) | /BOH | /LFIX | /HFIX |
|-----|---------|---------|------|-------|-------|
| L | L | L | H | H | H |
| L | L | H | L | H | H |
| L | H | H | H | H | L |
| H | H | H | H | L | H |

FIG. 22
(A)
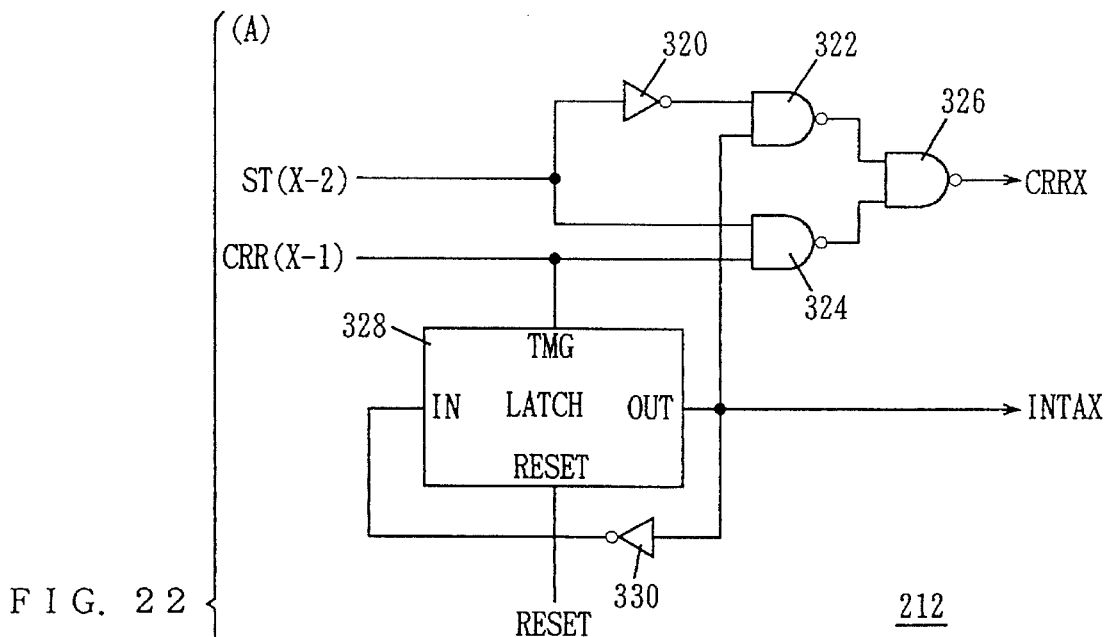
(B)
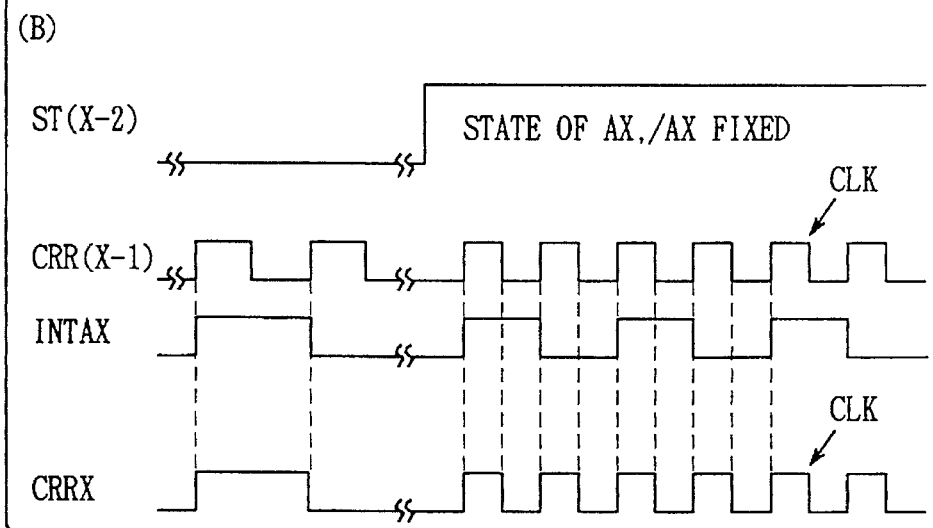

FIG. 31

| DECIMAL NUMBER | BINARY CODE | | | | GRAY CODE | | | | |
|---|---|---|---|---|---|---|---|---|---|
| | $a_3$ | $a_2$ | $a_1$ | $a_0$ | $g_3$ | $g_2$ | $g_1$ | $g_0$ | |
| 0 | 0 | 0 | 0 | 0 | 0 | 0 | 0 | 0 | } 1 BIT |
| 1 | 0 | 0 | 0 | 1 | 0 | 0 | 0 | 1 | |
| 2 | 0 | 0 | 1 | 0 | 0 | 0 | 1 | 1 | } 2 BITS |
| 3 | 0 | 0 | 1 | 1 | 0 | 0 | 1 | 0 | |
| 4 | 0 | 1 | 0 | 0 | 0 | 1 | 1 | 0 | } 3 BITS |
| 5 | 0 | 1 | 0 | 1 | 0 | 1 | 1 | 1 | |
| 6 | 0 | 1 | 1 | 0 | 0 | 1 | 0 | 1 | |
| 7 | 0 | 1 | 1 | 1 | 0 | 1 | 0 | 0 | |
| 8 | 1 | 0 | 0 | 0 | 1 | 1 | 0 | 0 | } 4 BITS |
| 9 | 1 | 0 | 0 | 1 | 1 | 1 | 0 | 1 | |
| 10 | 1 | 0 | 1 | 0 | 1 | 1 | 1 | 1 | |
| 11 | 1 | 0 | 1 | 1 | 1 | 1 | 1 | 0 | |
| 12 | 1 | 1 | 0 | 0 | 1 | 0 | 1 | 0 | |
| 13 | 1 | 1 | 0 | 1 | 1 | 0 | 1 | 1 | |
| 14 | 1 | 1 | 1 | 0 | 1 | 0 | 0 | 1 | |
| 15 | 1 | 1 | 1 | 1 | 1 | 0 | 0 | 0 | |

5,548,557

NONVOLATILE SEMICONDUCTOR MEMORY DEVICE WITH A ROW REDUNDANCY CIRCUIT

BACKGROUND OF THE INVENTION

1. Field of the Invention

The present invention relates to an electrically programmable nonvolatile semiconductor memory device, and more specifically, to a nonvolatile semiconductor memory device requiring programming before erasure. More specifically, it relates to a nonvolatile semiconductor memory (Flash Memory) allowing collective erasure.

2. Description of the Background Art

FIG. 59 is a schematic cross section of a conventional nonvolatile memory cell. Referring to FIG. 59, the memory cell includes a drain region 2 and a source region 3 formed of impurity regions of high impurity concentration in a main surface of a semiconductor substrate 1, a floating gate 6 formed on a channel region 4 between drain region and source region 3 with a gate insulating film 5 interposed therebetween, and a control gate 8 formed on floating gate 6 with an interlayer insulating film 7 interposed therebetween. Floating gate 6 is surrounded by an insulating film, and the memory has a so called "floating gate type transistor" structure.

Threshold voltage of the memory transistor changes dependent on the amount of charges (electrons) stored in floating gate 6. Injection and extraction of electrons to and from floating gate 6 is carried out in the following manner.

(i) Injection of Electrons

For injecting electrons to floating gate 6, a programming high voltage Vpp is applied to control gate 8, programming voltage VBL is applied to drain region 2, and ground potential is applied to source region 3. Under this voltage condition, a high electric field is generated near drain region 2, and electrons flowing from drain region 2 to source region 3 are excited to be hot electrons. The hot electrons are accelerated by the high electric field generated by the high voltage applied to control gate 8, and jump over the potential barrier of gate insulating film 5 to be injected to floating gate 6 to be stored therein. With electrons injected in floating gate 6, the threshold voltage of the memory cell is shifted to the higher voltage side. As shown in FIG. 60 this state is referred to as "programmed state", which corresponds to a state storing information "0".

(ii) Extraction of Electrons

For extracting electrons from floating gate 6, ground potential is applied to control gate 8, drain region 2 is set to a floating state, and programming high voltage Vpp is applied to source region 3. In this state, a high electric field is generated between floating gate 6 and source region 3, and due to Fouhler-Nordheim tunnelling current, electrons are extracted from floating gate 6 to source region 3. With electrons extracted from floating gate 6, threshold voltage of the memory cell transistor is shifted to the lower voltage side. This state, which is shown in FIG. 60, is referred to as "erased state" which corresponds to the state storing information "1".

More specifically, a nonvolatile memory cell stores information "1" or "0" in accordance with the amount of electrons stored in floating gate 6.

In normal operation, data is read in the following manner. A selecting voltage VR at the level of a supply voltage Vcc is applied to control gate 8 of the selected memory cell. Assume that the memory cell is now at the programmed state and has the threshold voltage of Vth1, as shown in FIG. 60, the memory cell transistor is non-conductive, and current does not flow between the drain and the source. If the memory cell is at the erased state, the threshold voltage thereof is Vth2, so that the transistor is rendered conductive and current flows between drain region 2 and source region 3. Information is read by detecting presence/absence of the current Id flowing between drain region 2 and source region 3.

FIG. 61 is a block diagram showing the whole structure of a conventional nonvolatile semiconductor memory device. Referring to FIG. 61, the nonvolatile semiconductor memory device includes a memory array 10 having a plurality of memory cells MC arranged in a matrix of rows and columns. Memory array 10 includes word lines WL to each of which a row of memory cells are connected, and a plurality of bit lines BL to each of which a column of memory cells MC are connected. In FIG. 61, only one memory cell MC is shown as a representative, which is arranged corresponding to a crossing of one bit line BL and one word line W1. The memory cell MC has the structure shown in FIG. 59, and it has its control gate connected to a corresponding word line WL and its drain region connected to a corresponding bit line BL. The source region of the memory cell MC is connected to a source line SL. The source line SL is arranged common to all the memory cells.

The nonvolatile semiconductor memory device further includes an address buffer 12 receiving an external address EXA0 to EXAn for generating an internal address, a row decoder 14 decoding the internal row address from address buffer 12 for generating a word line selecting signal for selecting a corresponding word line in memory cell array 10, a column decoder 16 decoding an internal column address from address buffer 12 for generating a column selecting signal for selecting a corresponding column of memory array 10, a high voltage switch 18 responsive to a row selecting signal from row decoder 14 for transmitting a programming high voltage or a selecting voltage to the selected word line, and a Y gate 20 responsive to the column selecting signal from column decoder 16 for selecting a corresponding bit line of memory array 10. High voltage switch 18 transmits a programming high voltage Vpp to the selected word line in writing operation, and transmits a selecting voltage at the level of the supply voltage Vcc to the selected word line in normal reading operation.

The nonvolatile semiconductor memory device further includes an input/output buffer 22 for inputting/outputting data from and to the outside of the device, a programming circuit latching write data from input/output buffer 22 and generating a programming voltage corresponding to the write data, and a sense amplifier for reading information by detecting presence/absence of a current on the selected bit line during data reading. The programming circuit and the sense amplifier are represented by one block 24 in FIG. 61.

The nonvolatile semiconductor memory device further includes a control signal buffer 26 receiving externally applied control signals for generating internal control signals, a control circuit 28 for generating necessary control signals in accordance with the internal control signals from control signal buffer 26, a high voltage control circuit 30 receiving an externally applied high voltage Vpp for generating a programming high voltage and a programming voltage, and an array source switch 32 for setting the potential of source line SL to the ground potential or to the level of the programming high voltage under the control of control circuit 28. The programming high voltage generated from high voltage control circuit 30 is transmitted to high voltage switch 18 and to array source switch 32, while the programming voltage (VBL) is transmitted to programming circuit (block 24).

Control circuit 28 is shown controlling operations of the write circuit and sense amplifier block 24, row decoder 14, column decoder 16 and address buffer 12. The operation will be described.

The operation of the nonvolatile semiconductor memory device includes programming, erasure and reading. Before programming, it is necessary to erase all the information stored in all the memory cells, that is, all memory cells must be erased.

(i) Programming:

At the time of programming, an address signal designating a memory cell to which data is to be written is applied to address buffer 12, and a control signal enabling data writing is applied to control signal buffer 26.

A high voltage Vpp is applied to high voltage control circuit 30. High voltage control circuit 30 generates a programming high voltage from the applied high voltage and applies the generated voltage to high voltage switch 18, and it also generate programming voltage VBL and applies the same to programming circuit (block 24). Under control of control circuit 28, input/output buffer 22 takes in an externally applied data signal, generates and applies to block 24 an internal write data. In block 24, the programming circuit latches the applied data.

The internal row and column address signals applied from address buffer 12 are decoded by row decoder 14 and column decoder 16, respectively, and a row selecting signal and a column selecting signal are generated. High voltage switch transmits the programming high voltage applied from high voltage control circuit 30 to the selected word line in response to the row selecting signal from row decoder 14. Y gate 20 connects a corresponding bit line to block 24 in response to the column selecting signal from column decoder 16. The programming circuit sets the potential of the selected bit line in accordance with the latched data signal. If the write data is "0", the programming voltage VBL applied from high voltage control circuit 30 is transmitted to the selected bit line. If write data is "1", the potential of 0 V is transmitted to the selected bit line.

In array source switch 32, the source line SL is set to the ground potential (0 V) under the control of control circuit 28. Consequently, when information "0" is to be written in the selected memory cell, electrons are injected to the floating gate. Meanwhile, if information "1" is to be written, the potential on the bit line is at the ground potential (0 V), and if the programming high voltage Vpp is applied to the control gate, a high electric field is not generated near the drain, hot electrons are not generated, and electrons are not injected to the floating gate either. In other words, it corresponds to the erased state (erasing operation is carried out without fail before data writing).

(ii) Erasure:

Erasure includes programming before erasure in which information "0" is written to all memory cells, and collective erasing operation in which information "1" is written to all memory cells. More specifically, the threshold voltage of all memory cells is once set to a high threshold voltage state, and then all memory cells are erased collectively.

In programming before erasure, addresses are successively generated from address buffer (the addresses may be externally applied, or the addresses may be generated using an internal address counter), and the generated addresses are applied to row decoder 14 and column decoder 16. In the programming circuit (block 24), information "0" is latched under the control of control circuit 28. Thus, in the similar manner as the above described programming operation, programming before erasure is carried out. After the threshold voltage of the memory cell is raised, collective erasing operation is effected on all memory cells. In this operation, programming high voltage Vpp from the high voltage control circuit 30 is applied from array source switch 32 to source line SL, Y gate 20 is turned off, bit line BL is set to the floating state, and the potentials of the word lines are all set to 0 V. Thus electrons are ejected from all the floating gates of the memory cells to the source line SL, whereby the threshold voltage of the memory cell is decreased.

Generally, control signals required by control circuit 28 are generated by applying external control signals in the form of commands to control signal buffer 26 for carrying out programming before erasure and erasing operation.

(iii) Reading operation:

In reading operation, a control signal enabling reading is applied through control signal buffer 26 to control circuit 28. Consequently, array source switch 32 sets the source line SL to the ground potential, and high voltage switch 18 is set to the supply voltage Vcc selecting state. Address data EXA0 to EXAn designating addresses of the memory cells holding the information to be read are applied to address buffer 12. Correspondingly, one word line of memory array 10 is selected by row decoder 14, and selecting voltage VR at the level of the supply voltage Vcc is transmitted by high voltage switch 18 to the selected word line. Similarly, column decoder 16 generates a column selecting signal, and Y gate 20 connects the selected bit line to block 24 in response to the column selecting signal.

In block 24, the sense amplifier has been activated under the control of control circuit 28, and by applying read voltage to bit line BL and by detecting presence/absence of a current flowing through the bit line, data is read and the read data is applied to input/output buffer 22. In input/output buffer 22, the output buffer has been activated under the control of control circuit 28, and external read data is generated from the read data applied from sense amplifier (block 24) and the generated data is output.

Now, the necessity of programming before erasure will be described. Assume that collective erasure is effected without programming before erasure, as shown in FIG. 62.

Before collective erasure, the information stored in the memory cell is "0" or "1", and the threshold voltage Vth thereof is at "high state" or "low state" in accordance with the information stored therein.

Erasure of a memory cell is carried out by ejecting electrons from the floating gate electrically (in the form of tunneling current). Therefore, if a memory cell storing information "1" is erased, the threshold voltage thereof is so decreased as to have a negative value, causing "over erased" state. The "over erased" memory cell is normally at a conductive state, causing the following problem.

For the purpose of description, consider memory cells M01 to M33 arranged in four rows and three columns, as shown in FIG. 63. Word lines WLi (i=0~3) are provided for respective rows, and bit lines BLj (j=1~3) are provided for respective columns. Memory cells M01 to M33 have their sources commonly connected to the source line SL.

In the arrangement shown in FIG. 63, assume that memory cell M31 is at "over erased" state. When data stored in memory cell M21, which is information "1", is to be read, source line SL is connected to the ground potential and selecting voltage at the level of the supply voltage Vcc is transmitted to word line WL. The threshold voltage of memory cell M21 is sufficiently lower than the supply voltage Vcc, so that memory cell M21 is rendered conductive, and a current flows to bit line BL1 through memory cell M21. At this time, since the sense amplifier determines whether or not there is a current flowing through the bit line BL1, reading of information "1" is effected even when memory cell M31 is at the "over erased state" and is conductive.

When a memory cell M11 storing information "0" is to be selected, a voltage at the level of the supply voltage Vcc is transmitted to word line WL1. Since the threshold voltage of memory cell M11 is sufficiently higher than the supply voltage Vcc, memory cell M11 is kept at the nonconductive state. However, in this case, even if the potential on word line WL3 is at the ground potential level of 0 V, memory cell M31 is at the conductive state, and hence current flows through memory cell M31. Consequently, the information stored in memory cell M11 is erroneously determined to be "1", resulting in erroneous data reading.

More specifically, if even one of the memory cells connected to one bit line is at the "over erased" state and has negative threshold voltage, current flows to the bit line even if the "over erased" memory cell is not selected, and hence the information of the selected memory cell cannot be read correctly. In order to prevent occurrence of such "over erased" state, programming before erasure is carried out prior to collective erasure. More specifically, as shown in FIG. 64, information "0" is written to the memory cells of all addresses prior to collective erasure, so that the threshold voltages of the memory cells of all addresses are once set to high threshold voltage state, and then collective erasure is effected. For the programming before erasure, addresses are successively incremented externally or internally so as to successively designate all addresses, and information "0" is written to the memory cell corresponding to the designated address.

Since collective erasure is carried out after the threshold voltage of the memory cell of all addresses are once set to the high state, the threshold voltages of the memory cells of all addresses come to have positive values which are sufficiently lower than the supply voltage Vcc, which prevents generation of "over erased" state.

In most semiconductor memory devices, a defective word line or a defective bit line is replaced by a redundant word line or a redundant bit line so as to repair the defective word line or the defective bit line in equivalence, in order to improve production yield.

In a nonvolatile semiconductor memory device, when a defective memory cell which is at the above described "over erased" state is found during testing, for example, the defective memory cell can be repaired by replacing the bit line associated with the defective memory cell by a redundant bit line. If the defect includes short-circuit with adjacent bit line, it can be repaired by replacing the short-circuited defective bit lines by the redundant bit lines. However, when a word line which is formed of a metal interconnection is short-circuited with the adjacent word line because of a particle, a defective insulation film or residue of etching during manufacturing, the word line cannot be repaired generally.

Assume that word lines WL2 and WL3 are short circuited in FIG. 65. In FIG. 65, this short-circuited portion is represented by a circled resistive element R.

When the supply voltage Vcc is transmitted to word line WL2 for reading information, the potential of the selected word line WL2 decreases because of a leak path constituted by resistive element R, as the potential of the adjacent word line WL3 is at the ground potential level, so that the information stored in the memory cells connected to word line WL2 cannot be read correctly. Similarly, when a programming high voltage Vpp is transmitted to word line WL2 for writing information "0", the potential on word line WL2 decreases because of the leak path caused by resistive element R, so that information "0" cannot be written. This also applies to the selection of word line WL3.

Assume that such defective word lines WL2 and WL3 are replaced by redundant word lines WL21 and WL31. If such replacement takes place, word lines WL2 and WL3 are always kept at the non-selected state, and when word line WL2 or WL3 is addressed, word line WL21 or WL31 is selected. Consider erasing operation with such replacement. As mentioned before, programming before erasure is carried out before erasing operation. In this programming before erasure, word lines are successively selected, and the programming high voltage Vpp is transmitted to the selected word line.

However, since the word lines WL2 and WL3 are always kept at the non-selected state, programming before erasure cannot be effected on the memory cells connected to the word lines WL2 and WL3. Though it is possible to modify the circuit so that the defective word lines WL2 and WL3 are successively selected only in the programming before erasure, it is impossible to actually carry out programming before erasure of the memory cells connected to the word lines WL2 and WL3, since there is still the leak path (resistive element R) when the word lines WL2 and WL3 are selected separately.

After the programming before erasure, collective erasing operation is carried out. In this collective erasure, all the memory cells have their sources connected commonly to the source line SL. The high voltage Vpp is applied to the source line, and the ground potential is transmitted to all the word lines as in the non-selected state. Therefore, in this collective erasing operation, the memory cells connected to the defective word lines WL2 and WL3 are erased. That is, the memory cells M21 to M23 and M31 to M33 connected to the defective word lines WL2 and WL3 are erased without writing of information "1", so that these memory cells are set to over erased state.

Accordingly, even if the defective word lines WL2 and WL3 are replaced by the redundant word lines WL21 and WL31, the condition is the same as the above described example in which programming before erasure is not carried out. Thus the set of defective word lines including short-circuit cannot be repaired in the conventional redundancy configuration, and hence production yield cannot be improved.

A method of repairing neighboring defective word lines will be described with reference to the flow chart of FIG. 66. FIG. 66 shows an operation for testing whether the memory cell is defective or not.

Referring to FIG. 66, in the test operation mode, in accordance with an internally generated address or an externally applied address, one word line is selected (step S1). Then, by maintaining the selected word line at the selected state, a bit line is selected in accordance with a column address signal, and data of 1 bit of memory cell is read (step S2). In the testing operation, memory cells are all set to the erased state, and the data stored is "1".

Thereafter, whether the read data is "1" or not is determined (step S3). If there is a defect on the word line and the potential of the word line does not increase, the memory cell transistor does not turn on (in the initial state of testing, there is not the over erased state). If there is a defective word line, the read data would be "0". The address of the memory cell, the data read from which is "0", is stored (step S4).

If the read data is "1", it is determined that the potential of the word line is increased normally, and therefore it is determined whether or not the last bit line connected to the selected word line has been selected (step S5).

If the last bit line has not yet been selected, the bit line address is incremented by one (step S6). Then, steps S2 to S5 are carried out again.

In step S5, if the last bit line has been selected, the flow proceeds to the step S7 in which whether or not the word line which is set to the selected state is the last word line is determined. If it is not the last word line, the word line address is incremented by one (step S8), the flow returns to the step S1 for selecting the word line in accordance with the newly incremented word line address, and the steps S2 to S6 are repeated.

If it is determined in step S7 that the last word line has been selected, the address of the defective bit stored previously is analyzed (step S9). If all read data are "0" for a specific word line address, it is determined to be a short-circuit defect of the word line. The defective line cannot be repaired. The nonvolatile semiconductor memory device is discarded as defective device. If defective memory cells exist concentrated on a specific region of a specific word line, it is regarded as a disconnection of the word line. The defective word line cannot be repaired in this case either, and therefore the nonvolatile semiconductor memory device is discarded as the defective device.

If defective bits (memory cells) exist concentrated on a specific column, the bit line is replaced by a spare bit line.

When the above described method of detecting a defective word line is employed, it is necessary to determine whether the word line is defective or not by reading bit by bit the memory cell data. This results in considerably long time for testing.

SUMMARY OF THE INVENTION

Therefore, an object of the present invention is to provide a nonvolatile semiconductor memory device in which a defective word line can be repaired by a redundant word line.

Another object of the present invention is to provide a nonvolatile semiconductor memory device in which even if there is a short circuit between neighboring word lines, the short-circuited word lines can be surely repaired.

A still further object of the present invention is to provide a nonvolatile semiconductor memory device in which short-circuit between neighboring word lines can be detected effectively.

Briefly stated, the nonvolatile semiconductor memory device, in accordance with the present invention is adapted such that programming before erasure or test is carried out simultaneously on the memory cells arranged at crossings between at least two neighboring word lines and a bit line crossing at least these two word lines, among a plurality of word lines including redundant word lines.

In the nonvolatile semiconductor memory device in accordance with the present invention, memory cells on neighboring word lines are set to the selected state simultaneously. Therefore, all memory cells are set to the programmed state, whereby over erased state can be prevented during erasure. Since a plurality of memory cells are tested simultaneously, defective word lines can be easily identified in a short period of time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 shows a structure and operational waveforms of an increment determining circuit shown in FIGS. 15 and 16.

FIG. 31 shows, in a table, correspondence between binary codes and gray codes.

DESCRIPTION OF THE PREFERRED EMBODIMENTS

[Embodiment 1]

Figure 67:
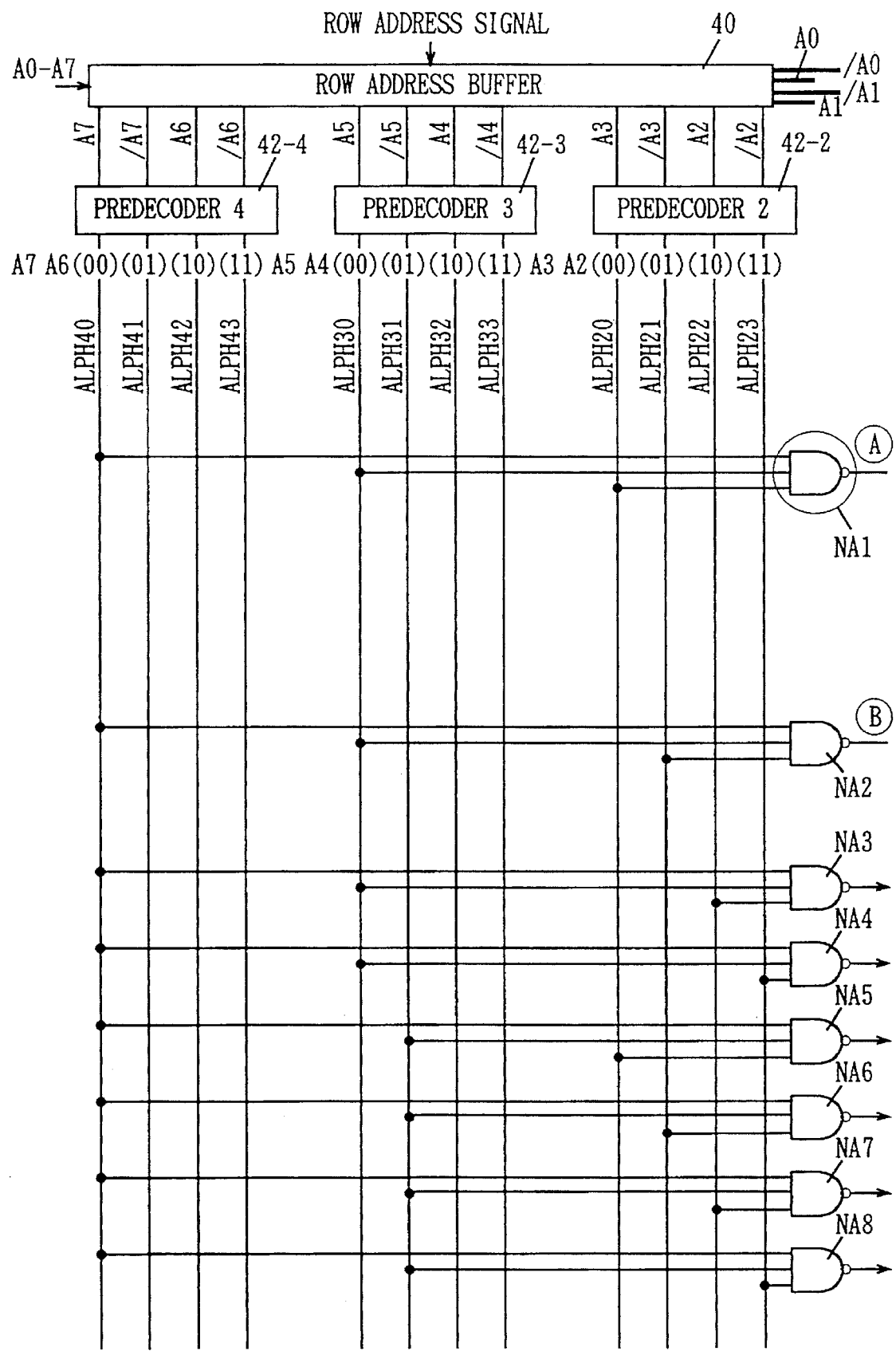
FIG. 67 shows a structure of a predecoder portion and a row decoder input portion of a conventional nonvolatile semiconductor memory device.
Figure 68:
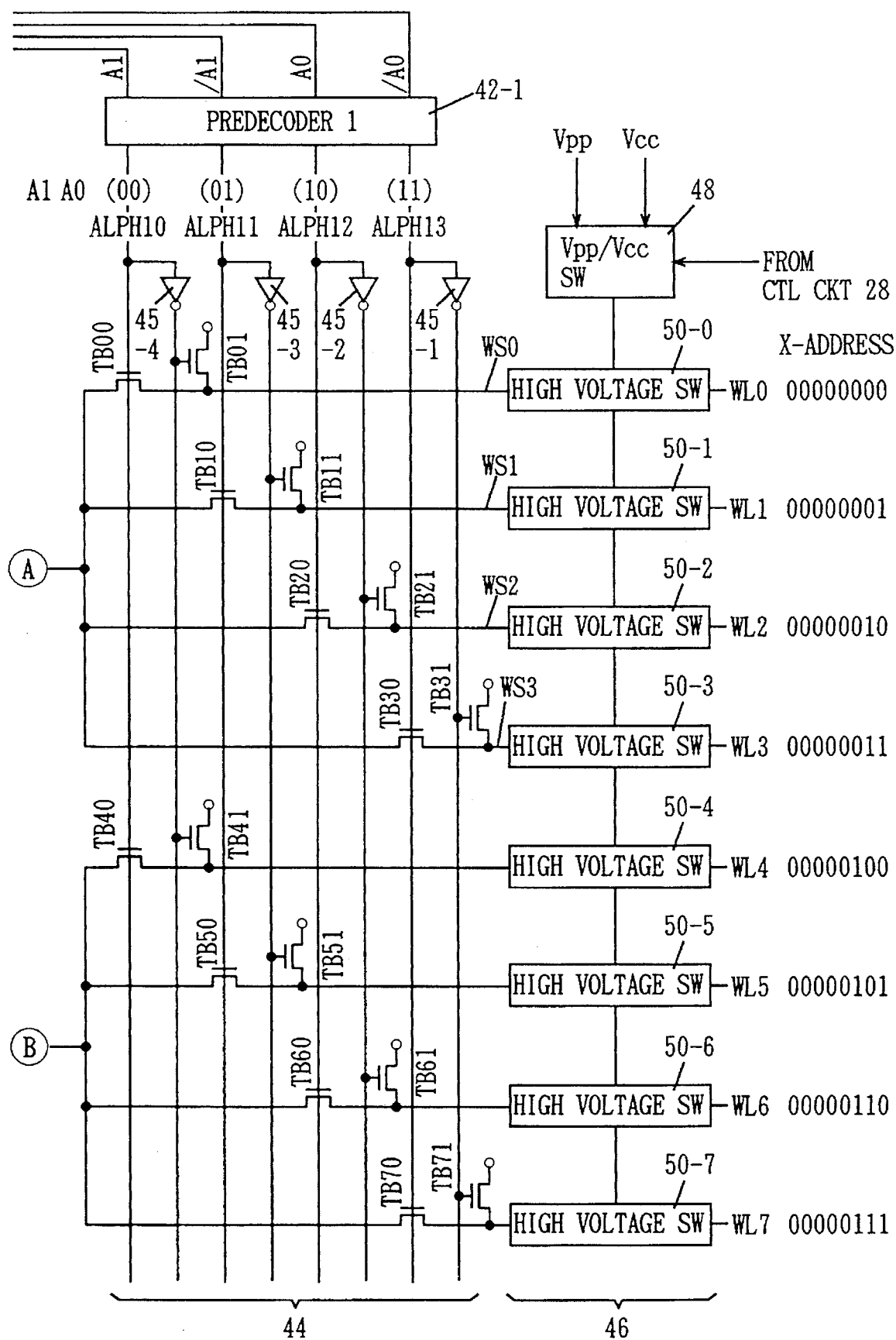
FIG. 68 shows a structure of a row decoder portion of a conventional nonvolatile semiconductor memory device.
Figure 69:
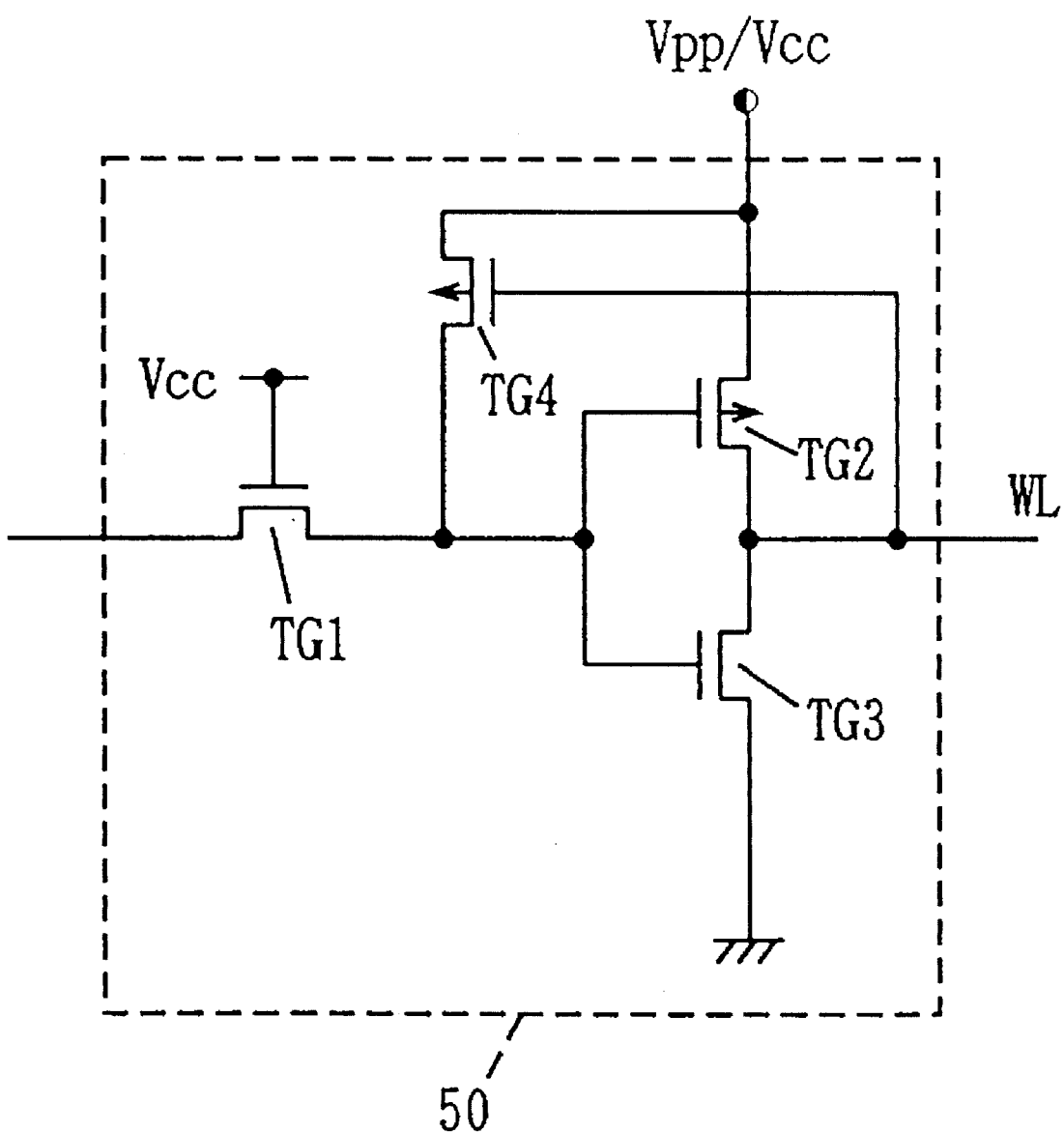
FIG. 69 shows a specific structure of a conventional high voltage switch circuit.

For the purpose of comparison, structures of a conventional row address buffer and a row decoder will be briefly described with reference to FIGS. 67 to 69. FIGS. 67 and 68 show structures of the row address buffer and the row decoder when applied row address (X address) includes 8 bits (A7–A0), and FIG. 69 shows a specific structure of the high voltage switch.

Referring to FIGS. 67 and 68, row address buffer 40 generates internal complementary address signals A0, /A0 to A7, /A7 from the applied address A7 to A0. One predecoder is provided for 2 bits of address signals (more correctly, 4 bits of complementary internal address signals). A predecoder 42-1 decodes internal address bits A1, /A1, A0 and /A0, and drives any of output signal lines ALPH10 to ALPH13 in accordance with the result of decoding.

A predecoder 42-2 decodes internal address bits A3, /A3, A2 and /A2 and set one of output signal lines ALPH20–ALPH23 to the selected state, in accordance with the result of decoding. A predecoder 42-3 decodes internal address bits A5, /A5, A4 and A/4 and sets one of output signal lines ALPH30–ALPH33 to the selected state in accordance with the result of decoding. A predecoder 42-4 decodes address bits A7, /A7, A6, and /A6 and sets one of output signal lines ALPH40–ALPH43 to the selected state in accordance with the result of decoding.

FIGS. 67 and 68 also show the combinations of output signal lines and the address bits when the respective output signal lines are set to the selected state in respective predecoders 42-1 to 42-4. For example, if address bits A1 and A0 are both 0, a signal line ALPH10 is set to the selected state by the predecoder 42-1.

In this predecoder configuration, 256 word lines are divided into 64 groups each including 4 neighboring word lines, and one word line group is selected by predecoders 42-2 to 42-4. One word line is selected in each group by predecoder 42-1.

A 3-input NAND gate NA is provided for selecting one word line group, at the input portion of row decoder 44. FIG. 67 shows 8 NAND gates NA1–NA8. Neighboring 8 NAND gates NA1 to NA8 each have the first input connected to the same output signal line (in FIG. 67, ALPH40) of the output signal lines of the predecoder 42-4. Four adjacent NAND gates each have the second input connected to the same output signal line of predecoder 42-3. As for the third input of the NAND gate NA, different output signal lines of predecoder 42-2 are connected to adjacent NAND gates.

In row decoder 44, four word line selecting signal transmitting lines WS0 to WS3 are arranged corresponding to respective NAND gates NA. For each of word line selecting signal transmitting lines WS0 to WS3, a transfer gate TBk0 (k=0~7) which is turned on in response to an output from predecoder 42-1, and a gate transistor TBk1 which is turned on in response to the output from inverter circuits 45-1 to 45-4 receiving the output from predecoder 42-1, are provided. Gate transistor TBk1 charges the non-selected word line selecting signal transmitting line to the level of the supply potential Vcc. When selected by the predecoder 42-1, transfer gate TBk0 transmits the word line selecting signal from the corresponding NAND gate NA.

Figure 61:
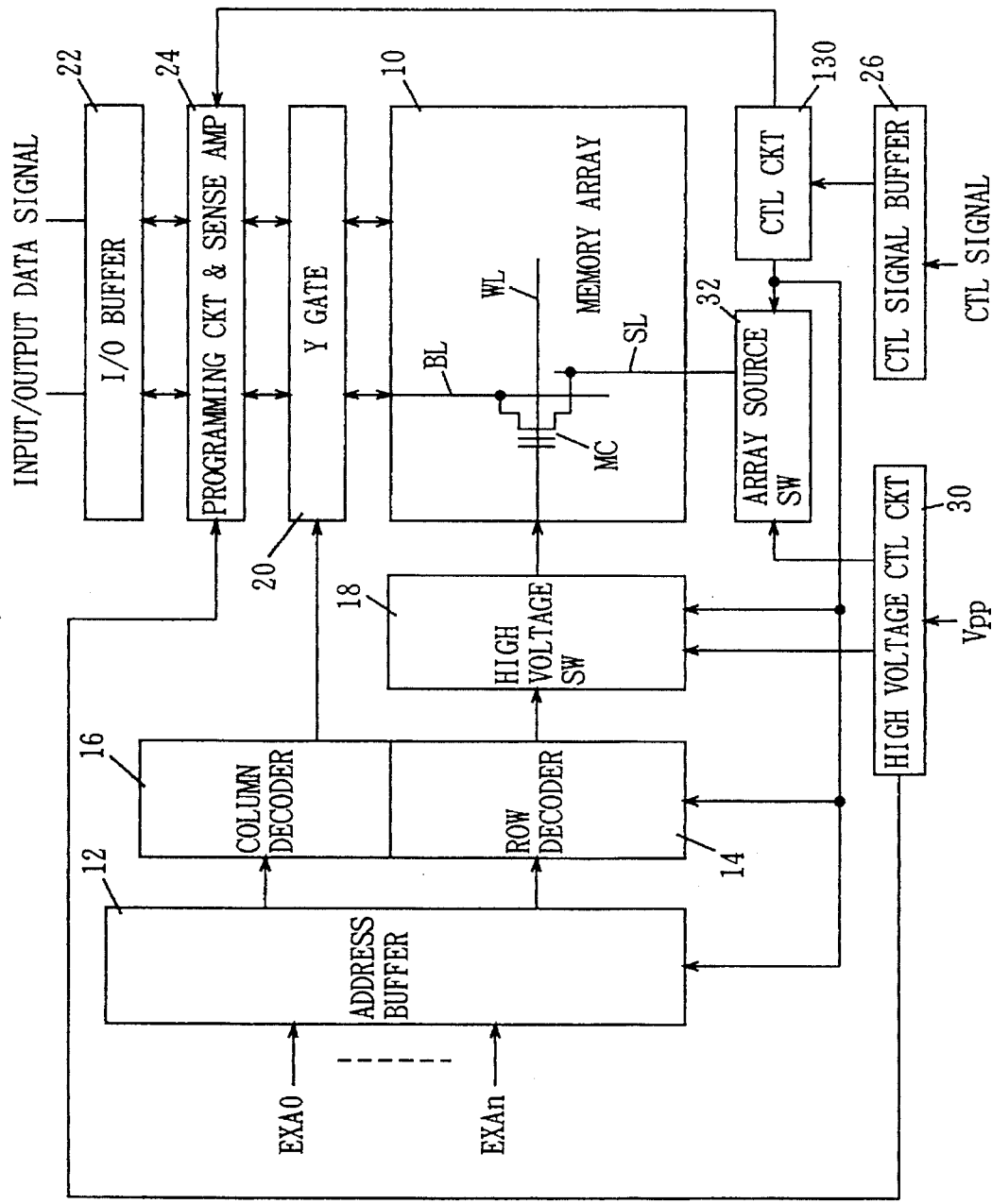
FIG. 61 shows a whole structure of a conventional nonvolatile semiconductor memory device.
Figure 62:
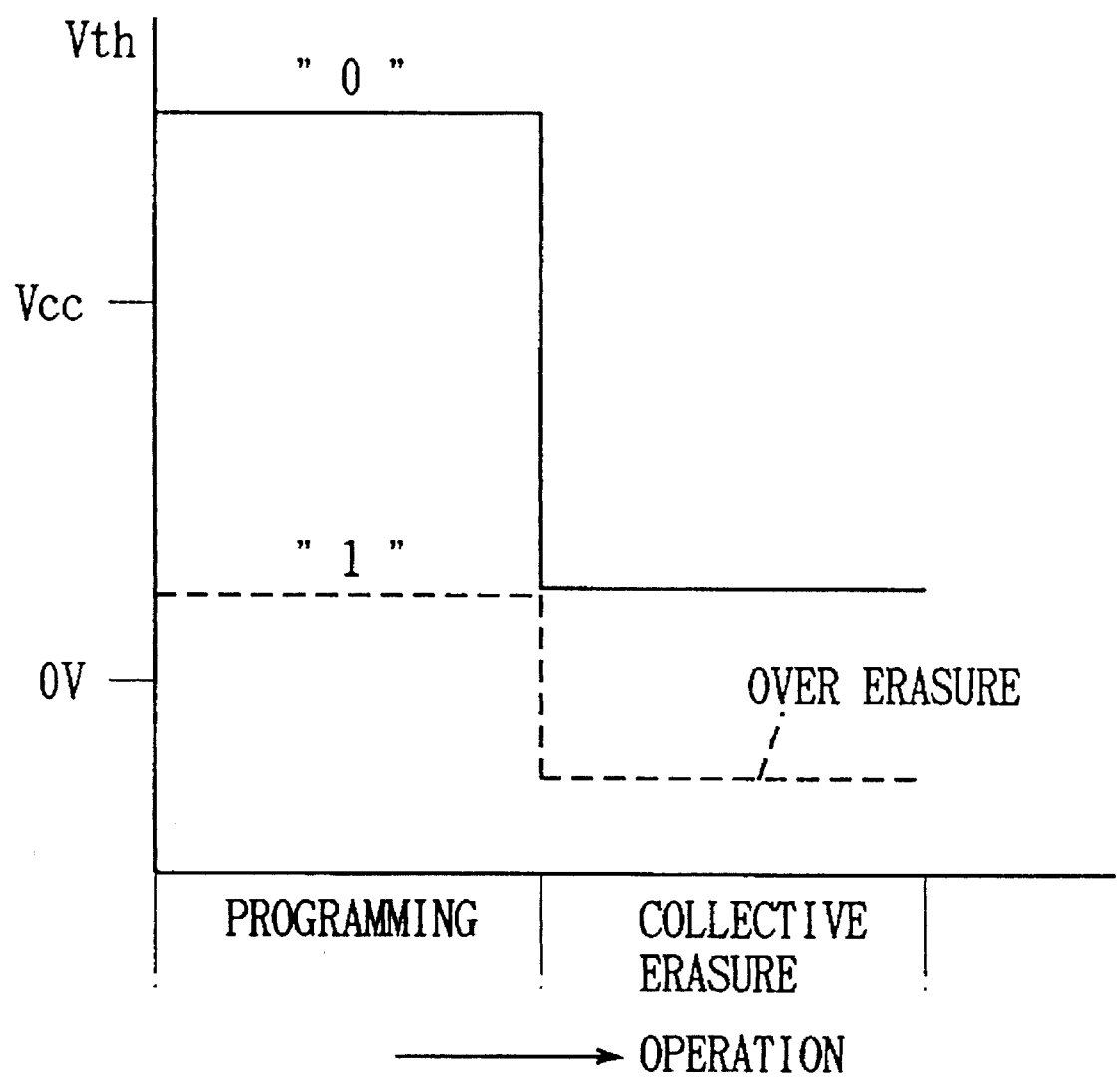
FIG. 62 is a diagram for explaining the reason why programming before erasure is carried out.
Figure 63:
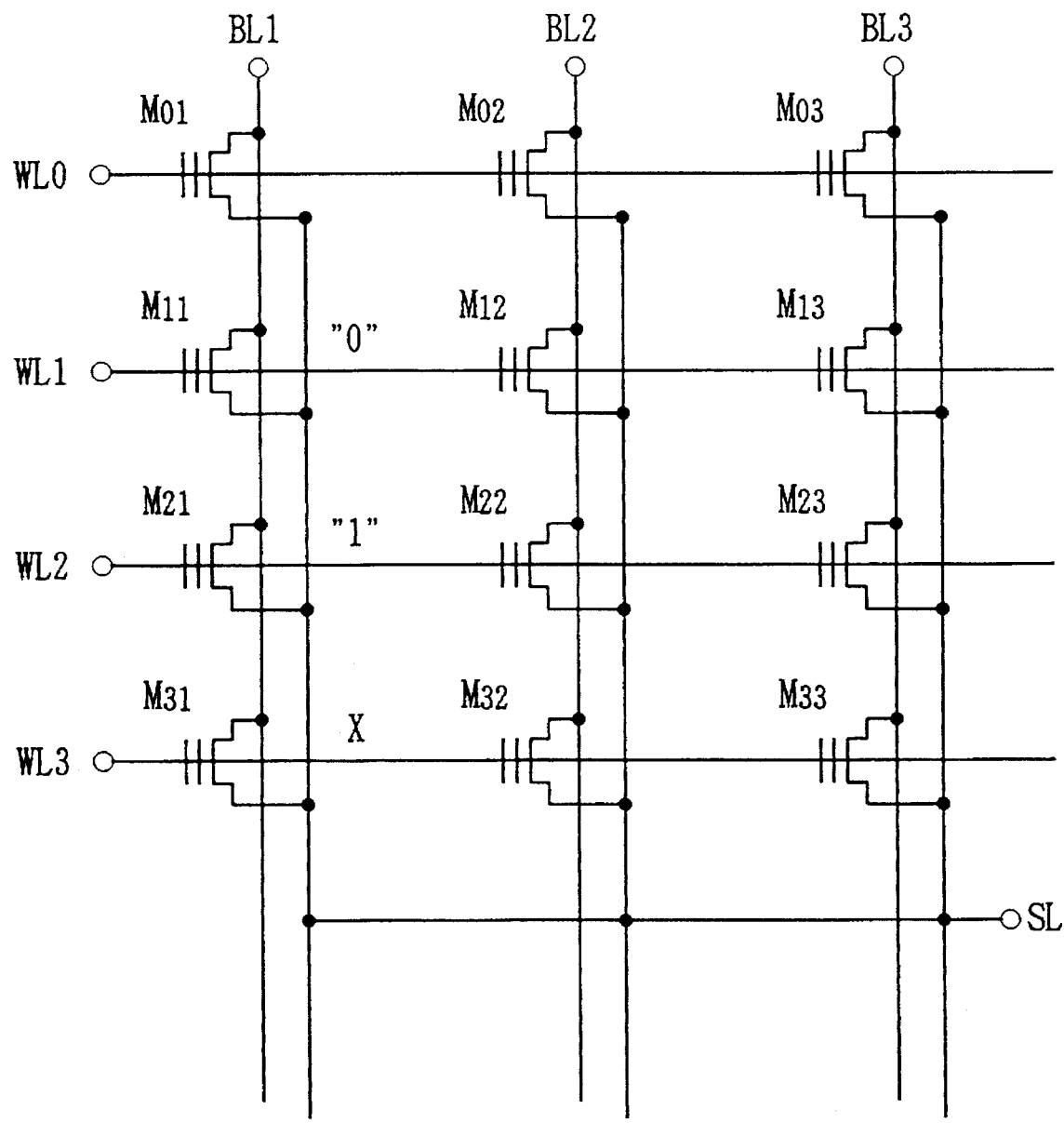
FIG. 63 is an illustration of the problem of an over erased memory cell.
Figure 64:
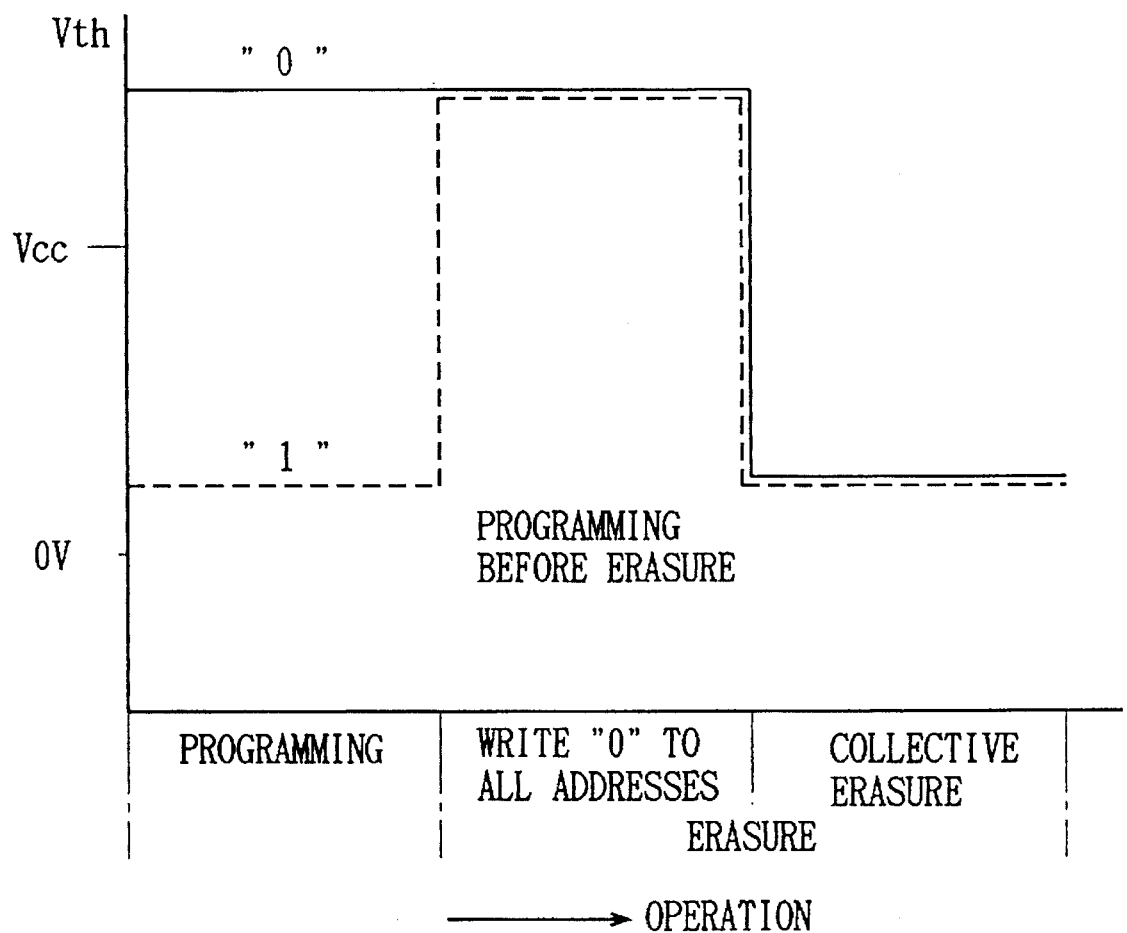
FIG. 64 shows sequence of erasing operation in nonvolatile semiconductor memory device.
Figure 65:
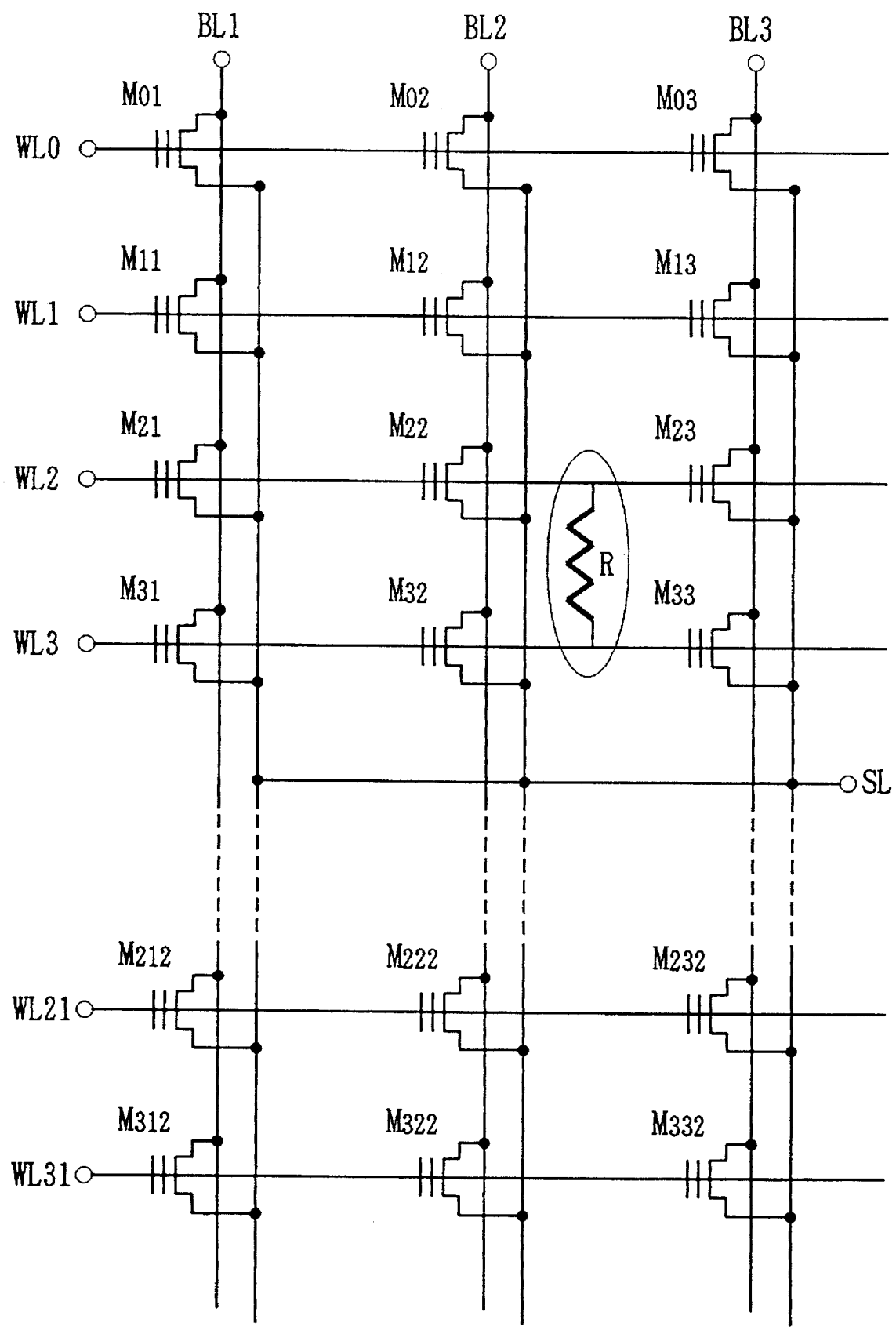
FIG. 65 shows problems of a conventional nonvolatile semiconductor memory device.
Figure 66:
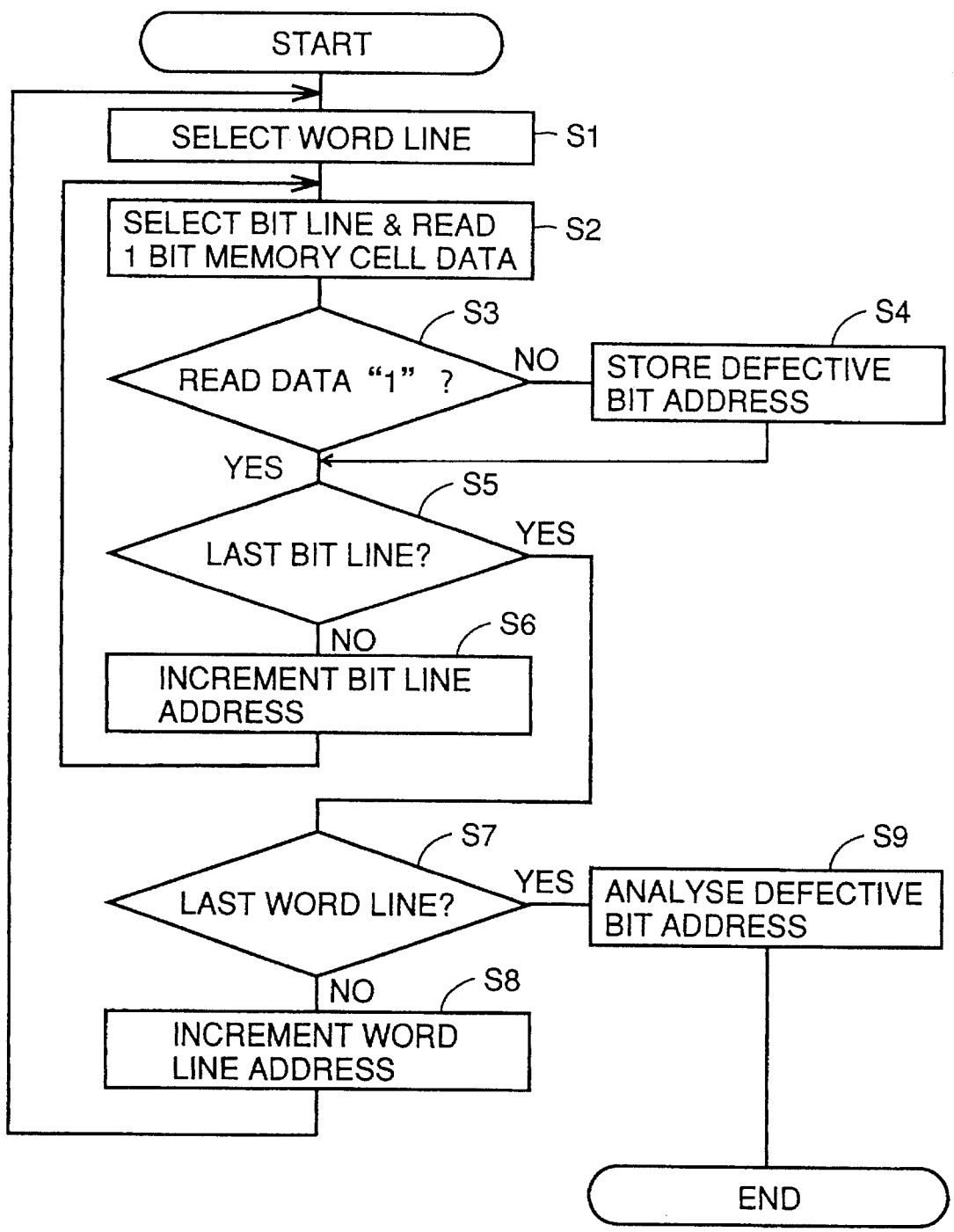
FIG. 66 shows a method of a repairing a defective word line in a conventional nonvolatile semiconductor memory device.

Between the word line selecting signal transmitting line and each of the word lines, there is provided a high voltage switch circuit 50. FIG. 68 shows high voltage switch circuits 50-0 to 50-7 arranged corresponding to word lines WL0 to WL7. High voltage switch circuit 50 transmits the voltage Vpp/Vcc transmitted from Vpp/Vcc switch 48 to the selected word line. Vpp/Vcc switch 48 transmits either the programming high voltage Vpp or the supply voltage vcc in accordance with the operation mode, in response to the control signal applied from control circuit 28 (see FIG. 61).

An X address is applied to the word line WL. In the conventional structure, the X address of the word line is incremented successively by one. FIG. 68 shows X addresses allotted to word lines WL0 to WL7. FIG. 69 shows an example of a specific structure of the high voltage switch circuit 50. In FIG. 69, high voltage switch circuit 50 includes a gate transistor TG1 passing a signal applied to the word line selecting signal transmitting line, a p channel MOS (insulated gate type field effect) transistor TG2 and an n channel MOS transistor TG3, driving word line WL in response to the output from gate transistor TG1, and a p channel MOS transistor TG4 for setting the potential of the gates of transistors TG2 and TG3 in response to the potential on word line WL. Gate transistor TG1 has its gate connected to receive the supply voltage Vcc, so as to prevent the gate potentials of transistors TG2 and TG3 (programming high voltage Vpp) from being transmitted to the row decoder. The operation of the high voltage switch circuit will be briefly described.

When a signal of "L" level is transmitted through gate transistor TG1, transistor TG3 is turned off and transistor TG2 is turned on. Consequently, the voltage Vpp/Vcc (programming high voltage Vpp or the supply voltage Vcc, transmitted in accordance with operation mode) is transmitted to the word line WL through transistor TG2. When the potential on the word line WL increases, transistor TG4 turns off, and the gate potentials of transistors TG2 and TG3 are kept at the "L" level.

When a signal of "H" level is transmitted through gate transistor TG1, transistor TG2 is rendered shallowly off, and transistor TG3 is turned on, thus the potential on the word line WL is discharged to the ground potential level. As the potential on the word line WL decreases, transistor TG4 turns on, so that the gate potentials of transistors TG2 and TG3 are set to the voltage Vpp/Vcc level, so that the transistor TG2 is surely maintained at the off state. Thus the potential on word line WL is surely discharged to the ground potential level.

More specifically, when the output from the row decoder is "L", the high voltage switch circuit drives the potential of the corresponding word line WL to the level of Vpp/Vcc. The word line selecting operation will be briefly described with reference to FIGS. 67 and 68.

When row address bits A7 to A0 are applied, the output of one NAND gate attains "L" by means of the predecoders 42-2 to 42-4. The outputs of remaining non-selected NAND gates are at "H". In a word line group, one transfer gate TBk0 is rendered conductive by predecoder 42-1, and other transfer gates are rendered non-conductive. Thus, the high voltage switch circuit 50 corresponding to the selected word line is set to the operative state by means of the predecoders 42-1 to 42-4, and transmits the voltage Vpp/Vcc to the selected word line.

For example, when the address bits A7 to A0 are all "L", signal lines ALPH10, ALPH20, ALPH30 and ALPH40 are driven to the "H" level, and the output of NAND gate NA1 attains to "L". Transfer gate TB00 turns on, and word line driving signal transmitting lines WS1 to WS3 are charged to the "H" level by the transistor TBk1 which is turned on in accordance with the output from inverters 45-1 to 45-3. Meanwhile, a signal at the "L" level is transmitted to word line selecting signal transmitting line WS0 by transfer gate TB00. Thus the high voltage switch circuit 50-0 is rendered operative and the voltage Vpp/Vcc is transmitted to the word line WL0.

In the conventional decoder structure, only one word line is selected. The present invention provides a structure in which at least two adjacent word lines are selected at one time.

Figure 2:
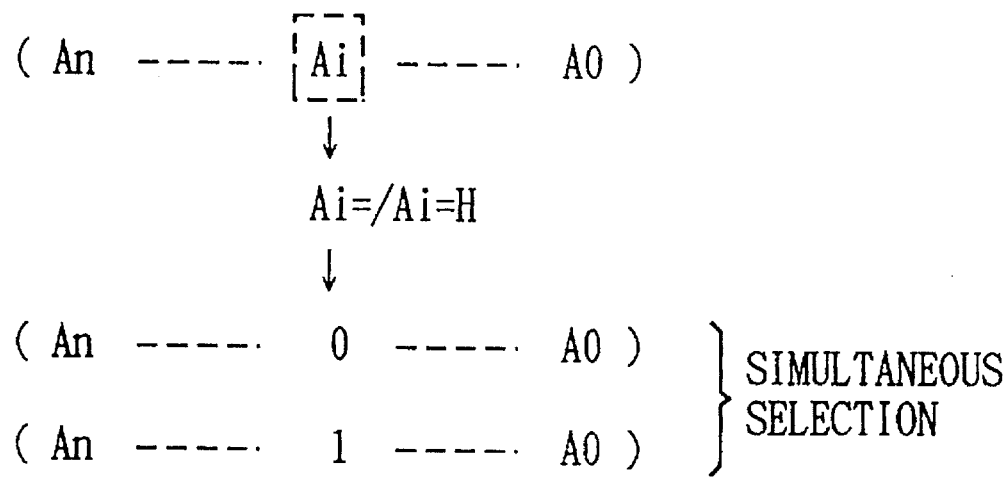
FIG. 2 shows the principal of operation of the first embodiment of the present invention.

FIG. 2 shows the principal of operation of the first embodiment of the present invention. In this first embodiment, the Hamming distance of addresses of physically adjacent word lines is set to 1. The Hamming distance represents the distance between two multiple bit binary numbers. If the Hamming distance is 1, it means that the values of two numbers differ in only 1 bit.

More specifically, if the Hamming distance is 1, only one bit Ai of address An to A0 differs as shown in FIG. 2. Therefore, when this address bit Ai is invalidated, that is, when bits Ai and /Ai are set to the selected state of "H", addresses (An . . . 0 . . . A0) and (An . . . 1 . . . A0) can be both set to the selected state.

Figure 3:
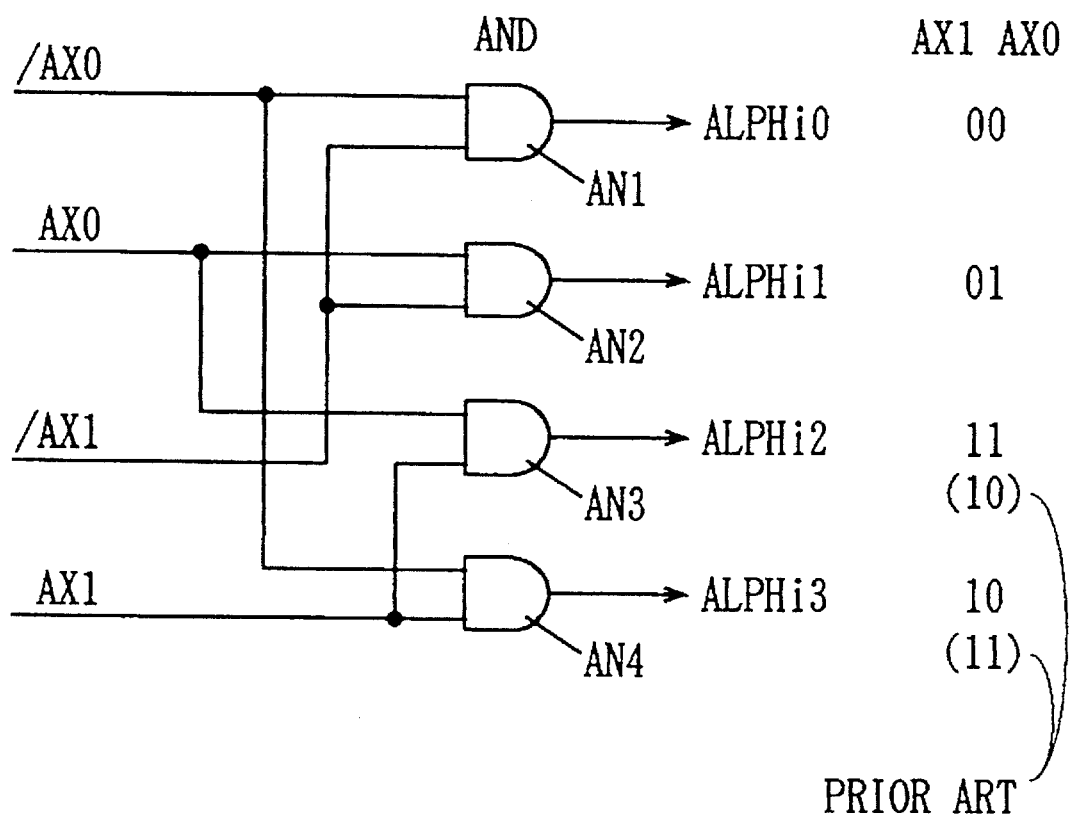
FIG. 3 shows a structure of a predecoder used in the first embodiment of the present invention.

FIG. 3 shows a structure of a predecoder used in the first embodiment of the present invention. Referring to FIG. 3, the predecoder decodes an address of 2 bits in the similar manner as in the prior art. AND gates AN 1 to AN4 are provided for predecoder output signal lines ALPHi0 to ALPHi3, respectively. Address bits AX0, /AX0, AX1 and /AX1 of different combinations are applied to AND gates AN1 to AN4. Address bits AX1 and AX2 represent the upper and lower bits of the internal address (true internal address) applied to the predecoder, respectively.

When address bits AX1 and AX0 are both 0, AND gate AN1 outputs a signal of "H". When address bits AX1 and AX0 assume 0 and 1, respectively, AND gate AN2 provides an output of "H". When address bits AX1 and AX0 are both 1, AND gate AN3 provides an output of "H". When address bits AX1 and AX0 assume 1 and 0, respectively, AND gate AN4 provides an output of "H".

In the normal operation, address bit AX0 and address bit /AX0 have different logics. In the present embodiment, in programming before erasure, the address bit AX0 (or AX1) and the complementary address bit /AX0 (or /AX1) are both invalidated, that is, both set to "H". Thus adjacent word lines of arbitrary combination can be set to the selected state simultaneously.

When address bits AX0 and /AX0 are both set to "H", for example, the set of signal lines ALPHi0 and ALPHi1 or the set of signal lines ALPHi2 and ALPHi3 is selected, in accordance with whether the address bit AX1 is at "0" or "1".

When address bits AX0 and /AX0 are set to "H" and "L", respectively, and address bits AX1 and /AX1 are both set to "H", signal lines ALPHi1 and ALPHi2 are selected. Conventionally, signal line ALPHi2 is set to the selected state when the address bits AX1 and AX0 are at 1 and 0, respectively, as shown in the parenthesis in FIG. 3. In such a case, the signal lines ALPHi1 and ALPHi2 cannot be set to a selected state at one time (since the Hamming distance is 2, it becomes necessary to set two bits of addresses AX0 and AX2 to the selected state together with the complementary signals thereof). The first embodiment of the present invention employs the predecoder shown in FIG. 3.

Figure 1:
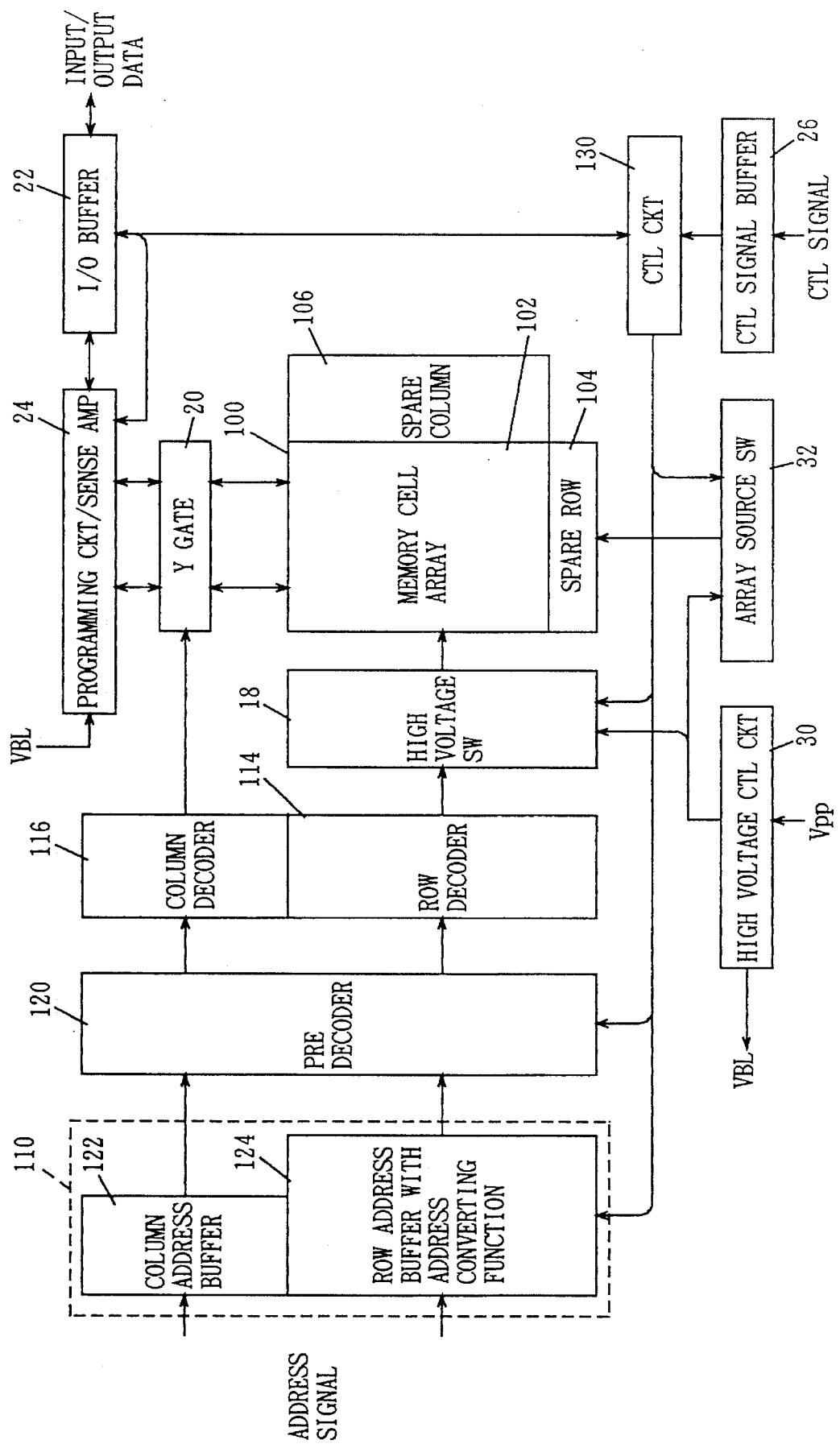
FIG. 1 shows a whole structure of a nonvolatile semiconductor memory device in accordance with a first embodiment of the present invention.

FIG. 1 schematically shows the whole structure of the nonvolatile semiconductor memory device in accordance with the first embodiment of the present invention. Referring to FIG. 1, the nonvolatile semiconductor memory device includes a memory array 100 including a plurality of a nonvolatile memory cells arranged in a matrix of rows and columns. The memory array 100 includes a memory array 102 in which common memory cells are arranged, a spare row region 104 in which redundant word lines for repairing defective bits are arranged, and a spare column region 106 in which spare bit lines for repairing defective bits are arranged. In the following description, the word lines included in the memory cell array 102 will be referred to as normal word lines.

The nonvolatile semiconductor memory device further includes an address buffer 110 for generating an internal address (complementary address bit) in accordance with the applied address signal, a predecoder 120 for predecoding the complementary internal address bits from address buffer 110, and a row decoder 114 and a column decoder 116 for generating signals for selecting a corresponding word line and a corresponding bit line in memory array 100 in accordance with the output from predecoder 120. Row decoder 114 and column decoder 116 includes a spare row decoder and a spare column decoder for selecting a spare word line and a spare bit line in the spare row region 104 and the spare column region 106, respectively. However, for simplicity of drawings, the spare row decoder and the spare column decoder are represented together with the normal row decoder and the normal column decoder for selecting normal word line and normal bit line, as one row decoder and one column decoder.

Nonvolatile semiconductor memory device further includes high voltage switch 16 as word line driving means for transmitting the voltage Vpp/Vcc to the selected word line in accordance with the output from row decoder 114, a Y gate 20 for connecting the selected bit line in memory array 100 to read circuit/sense amplifier block 24 in accordance with the output from column decoder 116, and an input/output buffer 22 for inputting/outputting data from and to the outside of the device. Y gate 20, read circuit/sense amplifier block 24 and input/output buffer 22 have the same structures as in the prior art.

The nonvolatile semiconductor memory device further includes a control signal buffer 26 receiving external control signals for generating internal control signals, a control circuit 130 for generating various control signals in accordance with the control signal from control signal buffer 26, an array source switch 32 for setting the potential of a source line of memory array 100 under control of control circuit 10, and a high voltage control circuit 30 receiving the programming high voltage Vpp for generating programming high voltage Vpp and programming voltage VBL. Array source switch 32 and high voltage control circuit 30 has the same structure as the prior art.

Control circuit 130 generates a signal necessary for setting adjacent plurality of word lines simultaneously, successively in programming before erasure. Control circuit 130 also controls input/output operation of data input/output buffer 22, and controls operation with respect to write circuit/sense amplifier block 24. At this time, since control circuit 130 also has a function of detecting whether or not the erasing operation is surely carried out and whether or not the write data is correctly written, control circuit 230 is shown also to received signals from block 24.

Address buffer 110 includes a row address buffer 124 having address converting function for generating an address to set a plurality of adjacent word lines simultaneously in programming before erasure, and a column address buffer 122 for generating an internal column address for selecting a bit line. Column address buffer 122, column predecoder (included in block 120) for predecoding the column address and column decoder 116 may have the same structure as the prior art.

The programming high voltage Vpp may be externally applied, or it may be generated internally. Alternatively, an external high voltage Vpp may be transmitted to portions which consume much power, and an internally generated high voltage Vpp may be applied to portions which do not much consume power.

As for the word lines in memory array 100, such addresses that provide the Hamming distance of 1 between adjacent word lines are allotted.

Figure 4:
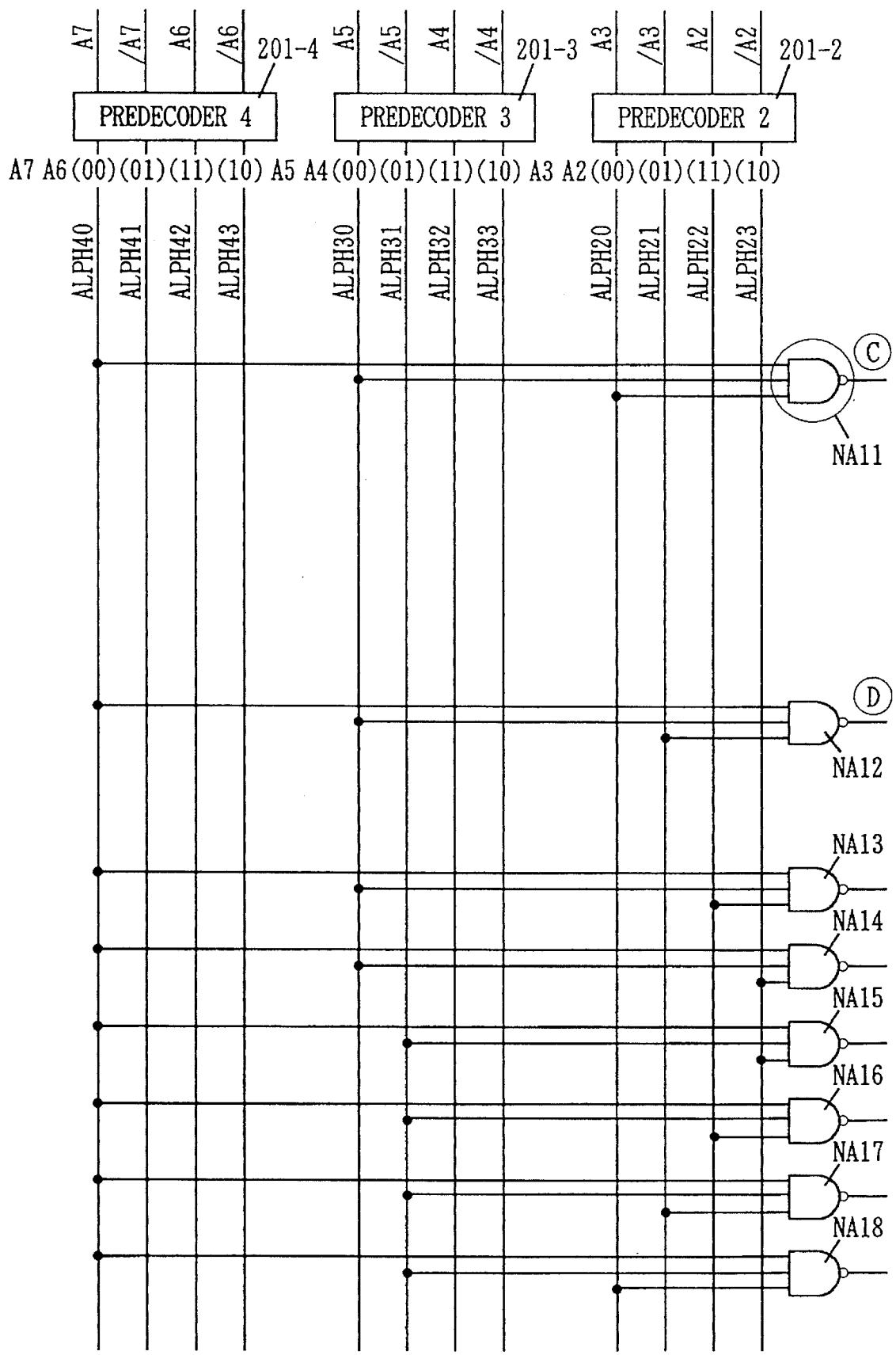
FIG. 4 shows a structure of a predecoder output portion and a row decoder input portion in the first embodiment of the present invention.
Figure 5:
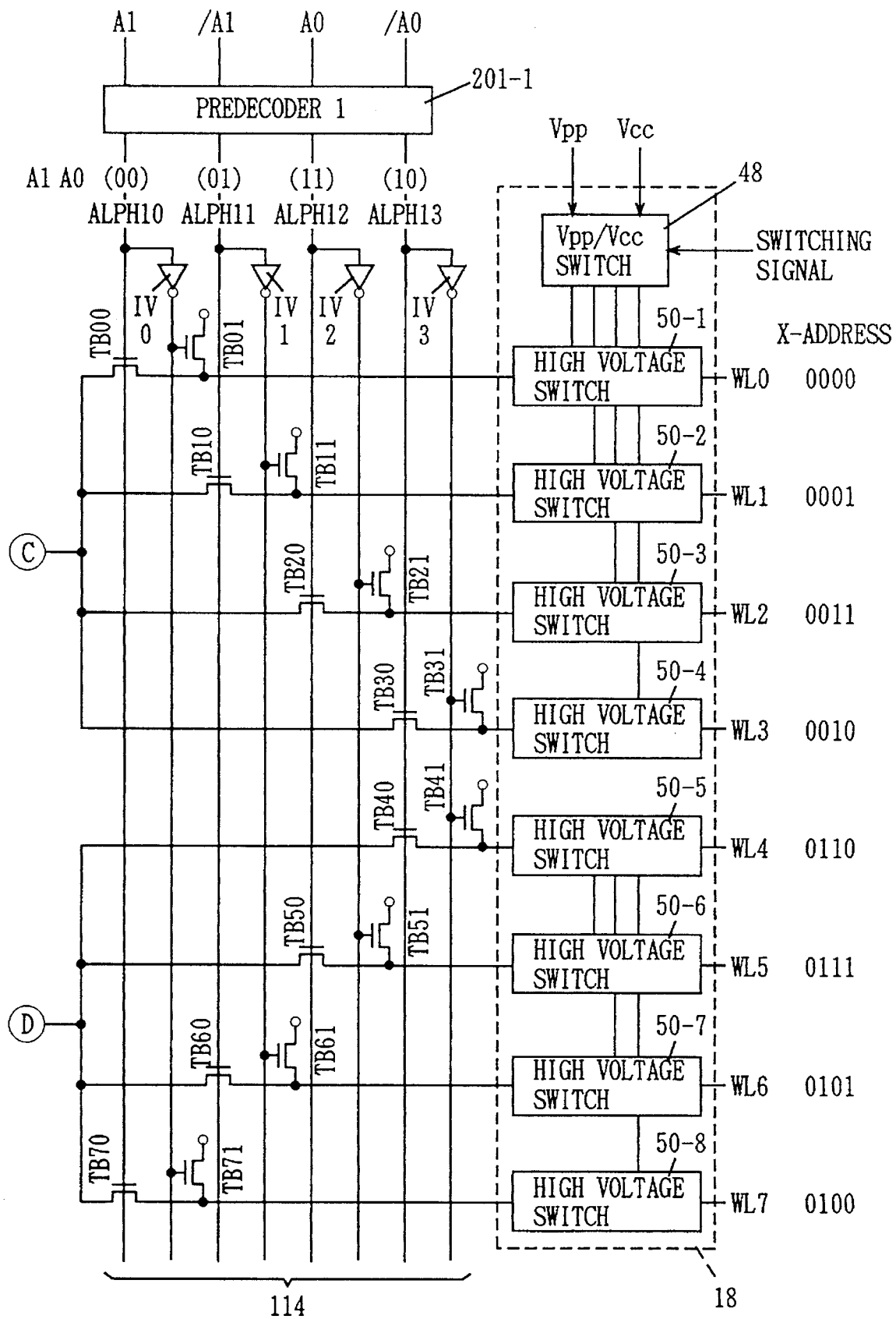
FIG. 5 shows a structure of a predecoder and a row decoder portion in the first embodiment of the present invention.

FIGS. 4 and 5 show structures of the predecoder, the row decoder and the high voltage switch shown in FIG. 1.

Referring to FIG. 4, predecoders 201-1 to 201-4 have such a structure as shown in FIG. 3. Internal address bits A0, /A0, A1 and /A1 are applied to predecoder 201-1. Internal address bits A2, /A2, A3 and /A3 are applied to predecoder 201-2. Address bits A4, /A4, A5 and /A5 are applied to predecoder 201-3. Address bits A6, /A6, A7 and /A7 are applied to predecoder 201-4. In FIGS. 4 and 5, states of input address bits when output signal lines ALPHi0 to ALPHi3 (i=1~4) of predecoders 210-1 to 201-4 are set to the selected states are shown.

In the structure shown in FIGS. 4 and 5, different from the prior art, signal line ALPHi2 is set to the selected state when corresponding address bits (true address bits) are both at 1, while signal line ALPHi3 is set to the selected state when upper one of the two address bits is at 1 and the lower one is at 0.

Four word lines are arranged as one set. For each set of word lines, a 3-input AND gate NA receiving output from predecoders 201-2 to 201-4 is provided. FIG. 4 shows 8 NAND gates NA11 to NA18 as representatives.

Row decoder 114 includes a transfer gate TBk0 provided for each word line selecting signal transmitting line and turned on in response to an output from predecoder 201-1, and a charging transistor TBk1 for surely setting the non-selected word line to the non-selected state in response to an output from predecoder 201-1. The transfer gate are arranged in a zigzag manner with respect to the word line selecting signal transmitting line in order to set adjacent word line to the selected state simultaneously.

More specifically, referring to FIG. 5, transfer gates TBk0 are arranged from upper left portion to the lower right portion for the word lines WL0 to WL3, and transfer gates are arranged from the upper right portion to the lower left portion for word lines WL4 to WL7. The same applies to the connection between input of NAND gates NA and output signal lines of predecoders 201-2 to 201-4, respectively. By arranging transfer gates TBk0 in such zigzag manner and the connection between input of NAND gates and predecoders 201-2 to 201-4 in the zigzag manner also, a plurality of neighboring word lines can be arbitrarily set to the selected state simultaneously.

The Vpp/Vcc switch 48 and high voltage switch 50 have the same structure as in the prior art.

As for the word lines WL, row addresses (X addresses) are allotted such that the Hamming distance between addresses allotted to arbitrary two neighboring word lines is 1. FIG. 5 shows an example in which a gray code is used as the X address.

By utilizing the above described structure, an arbitrary set of neighboring word lines can be set to the selected state in one word line group, and neighboring word lines can be also set to the selected state in the adjacent word line groups.

Figure 6:
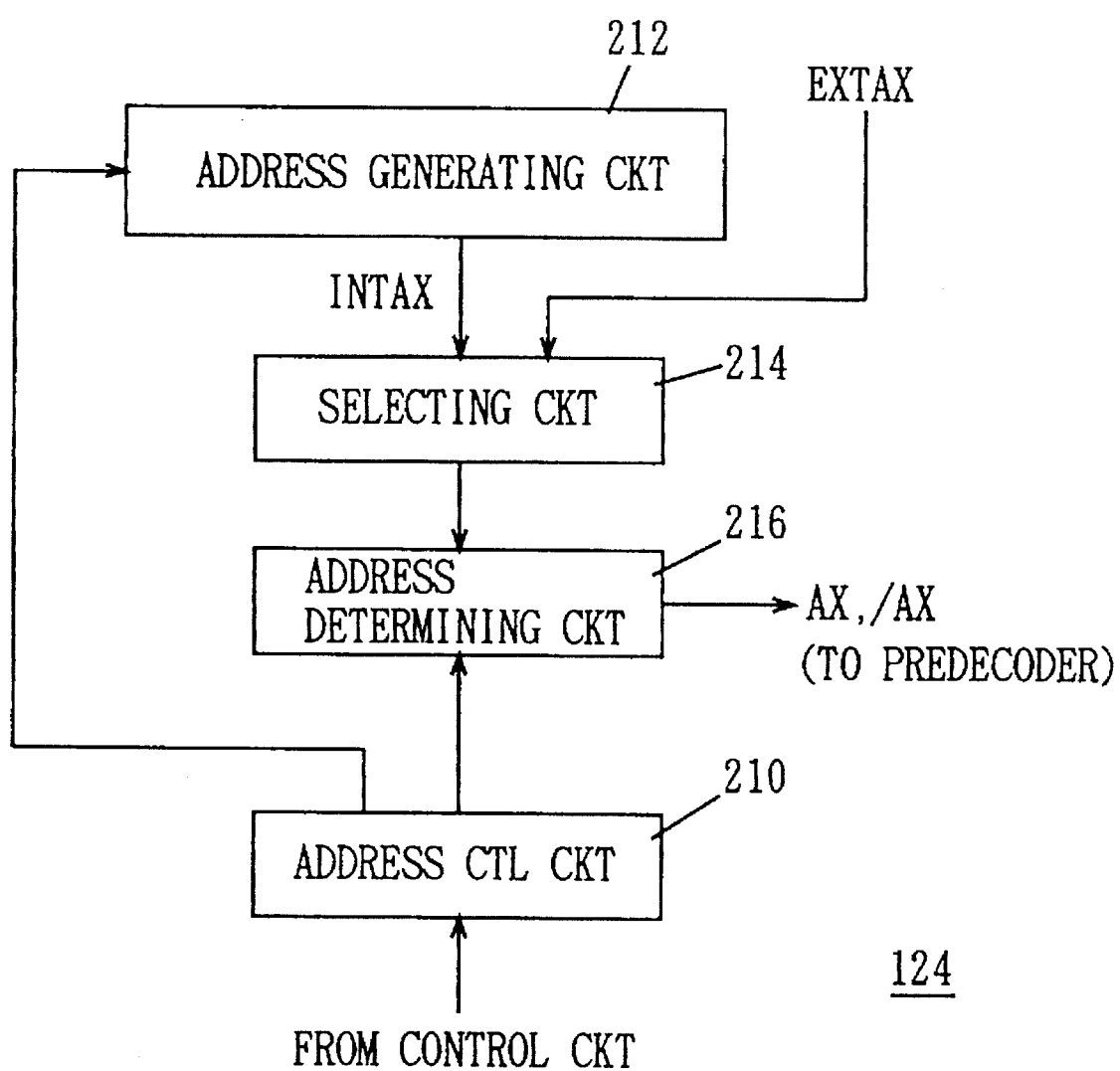
FIG. 6 shows functional structure of a row address buffer having address converting function shown in FIG. 1.

FIG. 6 is a block diagram showing a structure of a row address buffer having address converting function. Referring to FIG. 6, row address buffer 124 having address converting function includes an address generating circuit 212 successively generating address signals for selecting word lines in programming before erasure, a selecting circuit 214 receiving an address from address generating circuit 212 and an externally applied address for passing either of these two addresses, an address determining circuit 216 for generating a complementary internal address signal in accordance with the address applied from selecting circuit 214, and an address control circuit 210 controlling generation of the internal address INTAX in address generating circuit 212 and controlling the address generated from address determining circuit 216. A structure in which selecting circuit 214 and address determining circuit 216 only are included in row address buffer 124 having address converting function and address determining circuit 212 and address control circuit 210 are included in control circuit 130 may be employed. In FIG. 6, address control circuit 210 is shown to carry out various controls for generating necessary addresses in accordance with control signals from control circuit 130.

Figure 7:
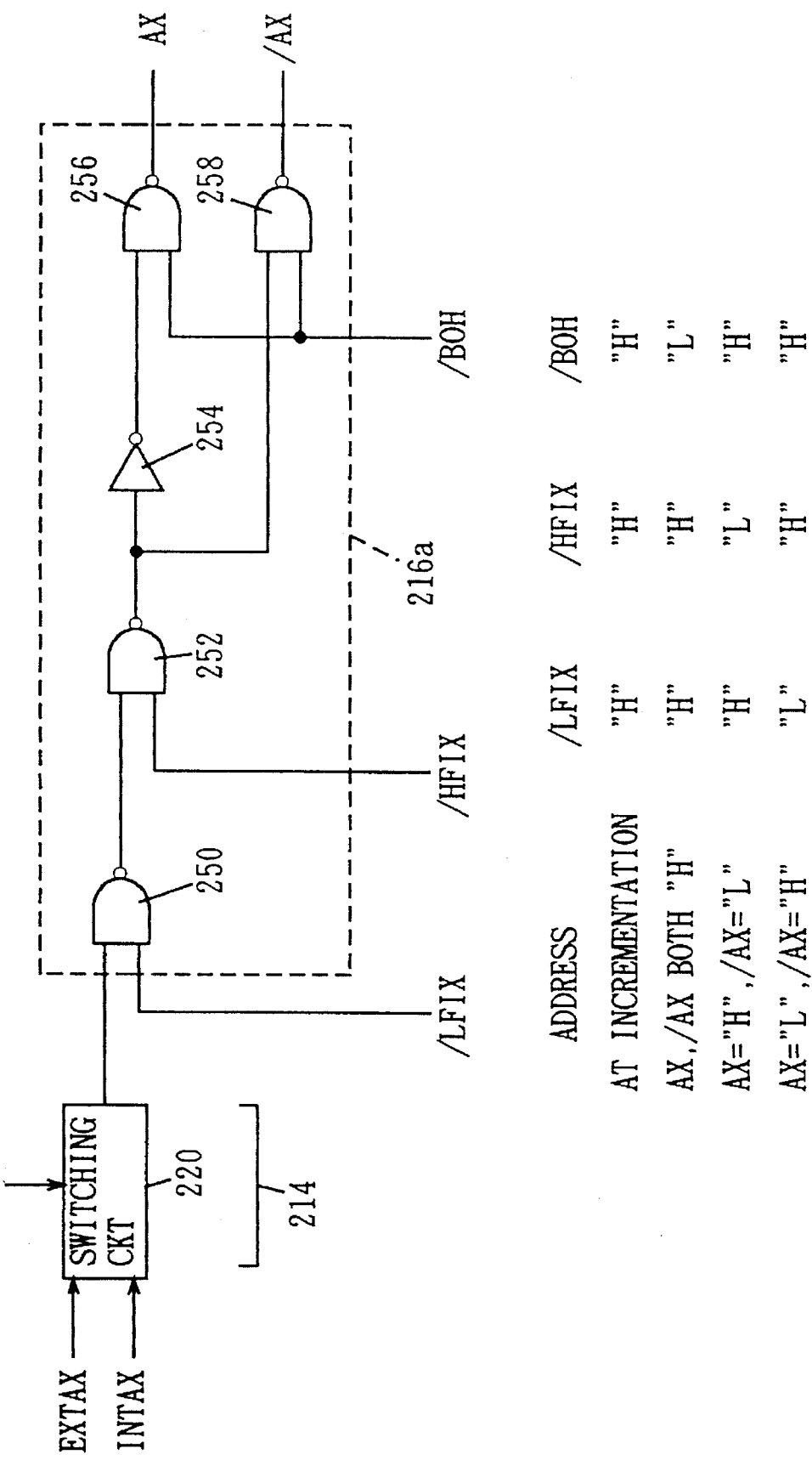
FIG. 7 shows a structure of an address determining circuit shown in FIG. 6.

FIG. 7 shows a specific structure of the address determining circuit shown in FIG. 6. FIG. 7 shows only a portion related to one bit of address signal (complementary address signals AX and /AX). Referring to FIG. 7, address determining circuit 216 includes a 2-input NAND gate 250 receiving an output from a switching circuit 220 included in selecting circuit 214 and a control signal /LFIX, and a 2-input NAND gate receiving an output from NAND gate 250 and a control signal /HFIX. Control signal /LFIX is a signal for forcing and fixing address bit AX to "L". Control signals /HFIX is a signal for forcing and setting address bit AX to "H".

Address generating circuit 216a further includes an inverter circuit 254 receiving an output from AND gate 252, a 2-input NAND gate 256 receiving an output from inverter circuit 254 and a control signal /BOH, and a 2-input NAND gate 258 receiving control signal /BOH and an output from NAND gate 252. Control signal /BOH forces and sets address bits AX and /AX both to "H" and invalidates address bits AX and /AX in effect. Address bit AX is provided from NAND gate 256 and address bit /AX is provided from NAND gate 258.

When control signals /LFIX, /HFIX and /BOH are all at "H", AND gates 250, 252, 256 and 258 all function as inverter circuits. In that case, a complementary internal address is generated from the address applied from switching circuit 220. In this state, address determining circuit 216a functions as a normal address buffer. When a plurality of word lines are to be selected simultaneously, states of control signals /LFIX, /HFIX and /BOH are changed so as to generate an internal address bit which is needed. Word line selecting operation in the first embodiment of the present invention will be described with reference to FIGS. 4, 5 and 7. Specific structures of address control circuit 210 and address generating circuit 212 will be described in detail later.

In programming before erasure, a programming before erasure designating signal is applied from control circuit 130 (see FIG. 1) to switching circuit 220. Consequently, switching circuit 220 passes an address INTAX applied from address generating circuit 212 (see FIG. 6).

Now, control signal /BOH is set to "L" and other control signals /LFIX and /HFIX are set to "H" for the address determining circuit 216a which corresponds to address bit A0. Other address bits A1 to A7 are set to "L", and corresponding control signals /LFIX, /HFIX and /BOH are all set to "H". At this time, internal address bits A1, /A1 to A7 and /A7 come to have values corresponding to the applied addresses INTAX1 to INTAX7. At this state, signal lines ALPH10 and ALPH11 shown in FIG. 5 are set to the selected state simultaneously. Meanwhile, in predecoders 210-2 to 201-4, signal lines ALPH20, ALPH30 and ALPH40 are set to the selected state.

AND gate NA11 is set to the selected state, and a signal of "L" level is transmitted through transfer gates TB00 and TB10 to high voltage switch circuits 50-1 and 50-2. Thus two neighboring word lines WL0 and WL1 can be set to the selected state simultaneously. Then, when address bit A1 is set to "H" at this state, signal lines ALPH12 and ALPH13 are set to the selected state. In response, a signal of "L" is transmitted through transfer gates TB20 and TB30 to high voltage switch circuits 50-3 and 50-4, so that word lines WL2 and WL3 are selected.

Figure 8:
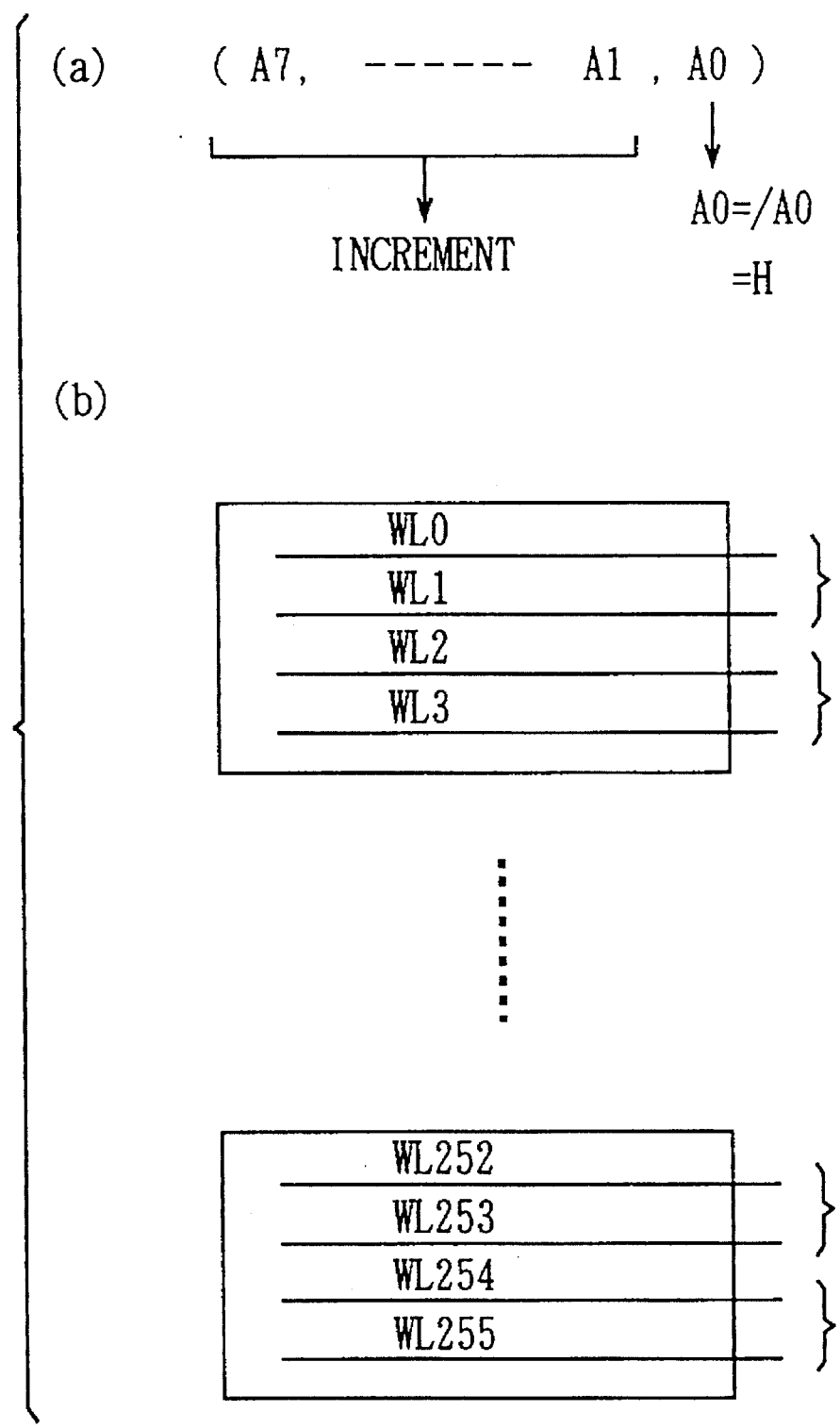
FIG. 8 shows word line selecting operation in programming before erasure in accordance with the first embodiment of the present invention.

More specifically, by fixing the least significant address bit A0 at the state of A0=/A0="H" while successively incrementing remaining address bits A7 to A1 as shown in FIG. 8, physically neighboring word lines are simultaneously set to the selected state two by two, such as word lines WL0 and WL1, WL2 and WL3, WL252 and WL253 and WL254 and WL255.

When address bits A0 and /A0 are both set to "H", an operation equivalent to the decoding operation with the least significant address bit neglected is carried out, so that the set of word lines WL2j and WL2j+1 (j=0, ... ) is constantly kept at the selected state. The programming high voltage Vpp is transmitted to high voltage switch circuit 50 to the two word lines which are set to the selected state. At least one of the bit lines is set to the selected state. The address for selecting the bit line may be externally applied, or a structure in which addresses are successively generated by using an address counter internally may be used.

Programming before erasure can be carried out in the similar manner as in the prior art. More specifically, with these neighboring word lines being set to the selected state, the programming voltage VBL is transmitted to the selected bit line by column decoder 116, Y gate 20 and programming circuit (block 24) shown in FIG. 1, and writing to the memory cell is effected. If the word line selected simultaneously are short-circuited, programming high voltage is transmitted to the short-circuited word lines, and therefore programming before erasure can be surely carried out on the short-circuited word lines.

Figure 9:
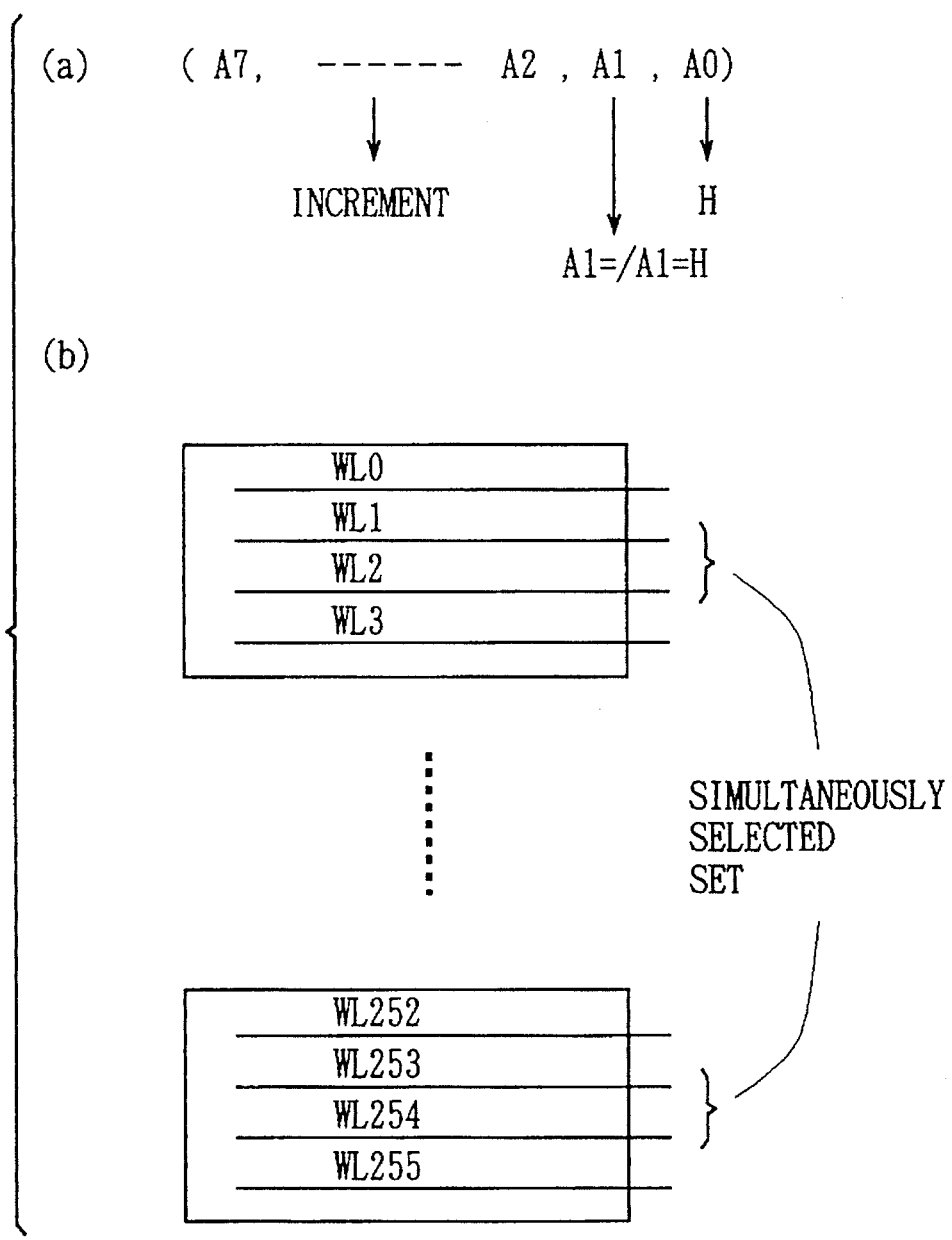
FIGS. 9 to 14 show word line selecting operation in the first embodiment of the present invention.

Thereafter, an operation for simultaneously selecting a set of word lines such as word lines WL1 and WL2 successively is carried out. For this operation, control signal /HFIX is set to "L" and other control signals /LFIX and /BOH are set to "H" for the least significant address bit A0. Consequently, address bit A0 is fixed at "H", while address bit /A0 is fixed at "L". For the next address bit A1, only the control signal /BOH is set to active "L", and address bits A1 and /A1 are both set to "H". In this case, in predecoder 201-1 shown in FIG. 5, signal lines ALPH11 and ALPH12 are set to the selected state. Therefore, by successively incrementing remaining address bits A7 to A2 by one, sets of word lines WL1 and WL2, . . . are successively selected in respective word line groups, as shown in FIG. 9.

By the above described operation, a state in which neighboring word lines of every combination are selected simultaneously for the word lines sharing the NAND gate provided at the input portion of row decoder 114 is realized. Thereafter, word lines adjacent to each other but belonging to different word line groups are selected simultaneously. This is because the word lines WL3 and WL4 are not set to the selected state at one time in the example of FIG. 5.

Figure 10:
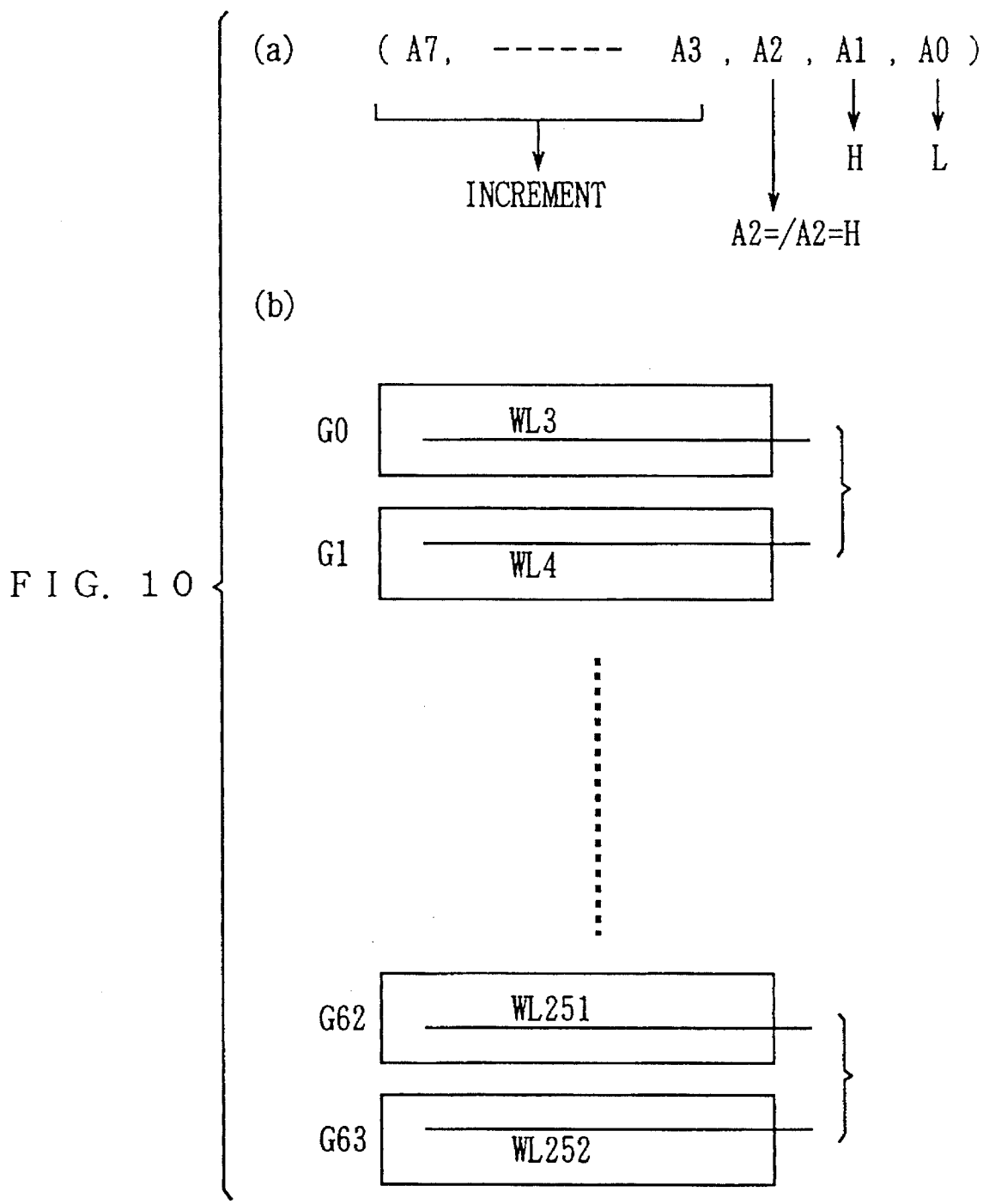

In order to simultaneously select adjacent word lines belonging to different word line groups, address bits A0 and A1 are set to "L" and "H", as shown in FIG. 10(a). As for address bit A2, address bits A2 and /A2 are both set to "H". Consequently, signal line ALPH13 shown in FIG. 5 is selected, and either the set of signal lines ALPH20 and ALPH21 or the set of signal lines ALPH22 and ALPH23 is set to the selected state simultaneously, in accordance with the value of address bit A3. Therefore, in this case, the word line groups G0 and G1 including four word lines are selected simultaneously as shown in FIG. 10(b), adjacent word lines in the simultaneously selected word line groups are selected, and then programming before erasure is carried out.

Figure 11:
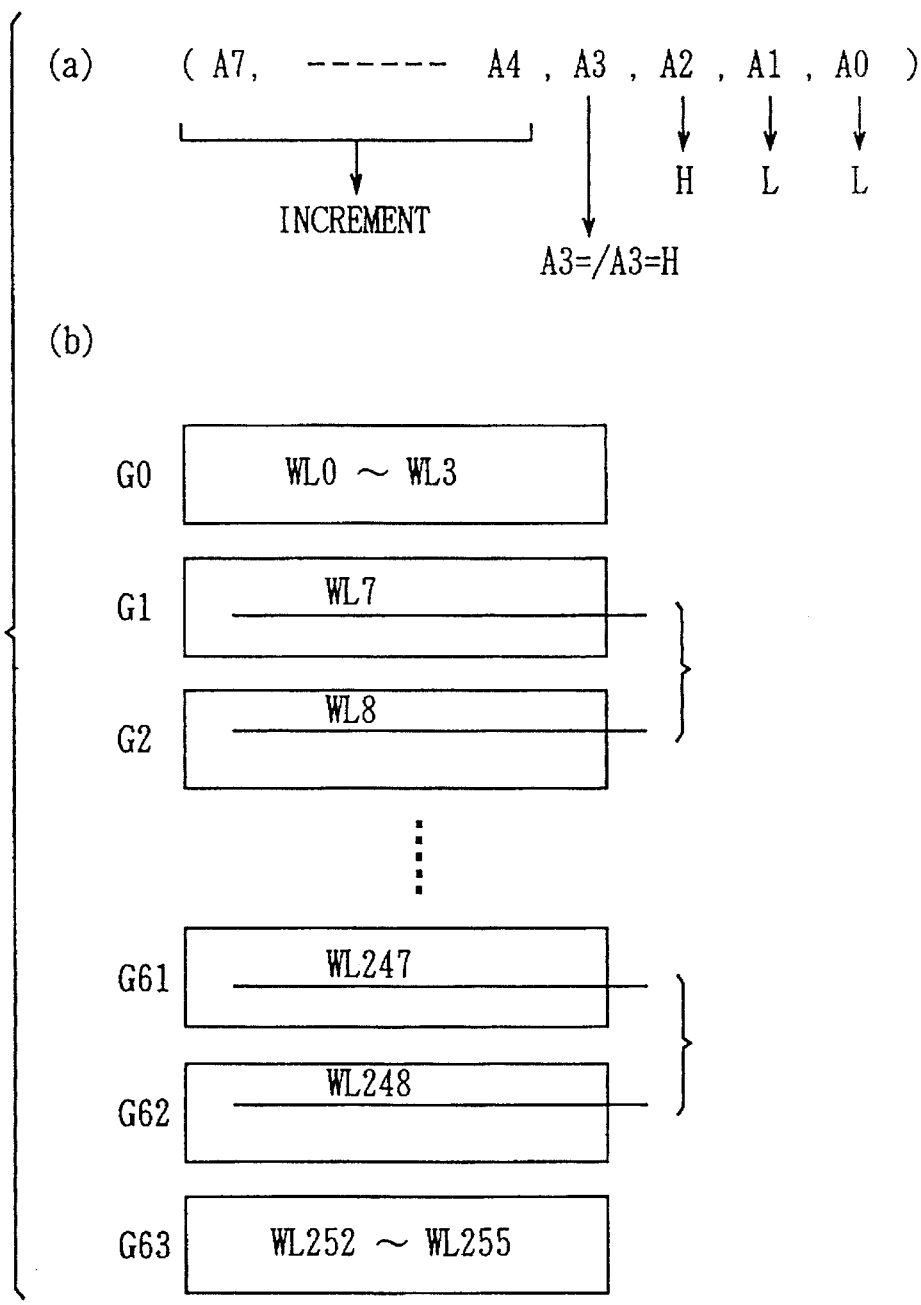
Figure 12:
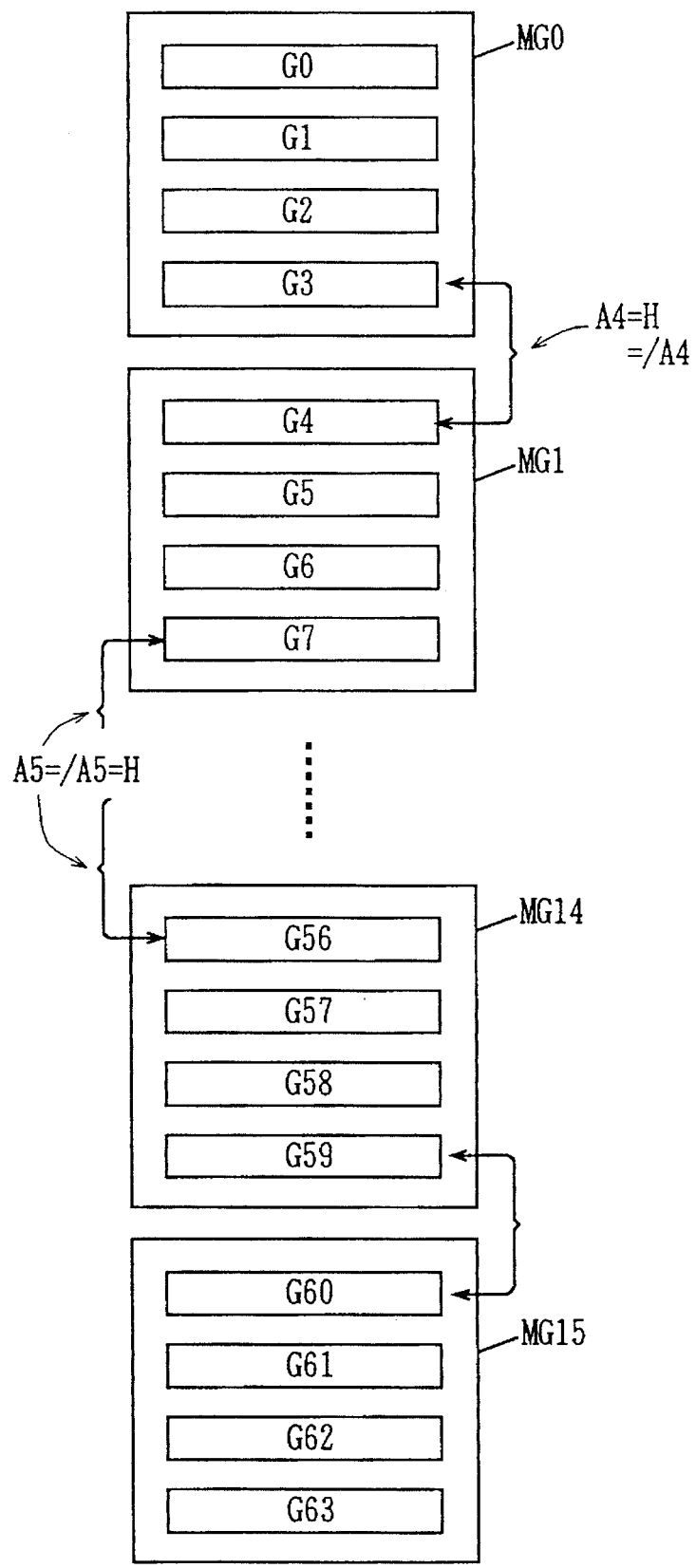
Figure 13:
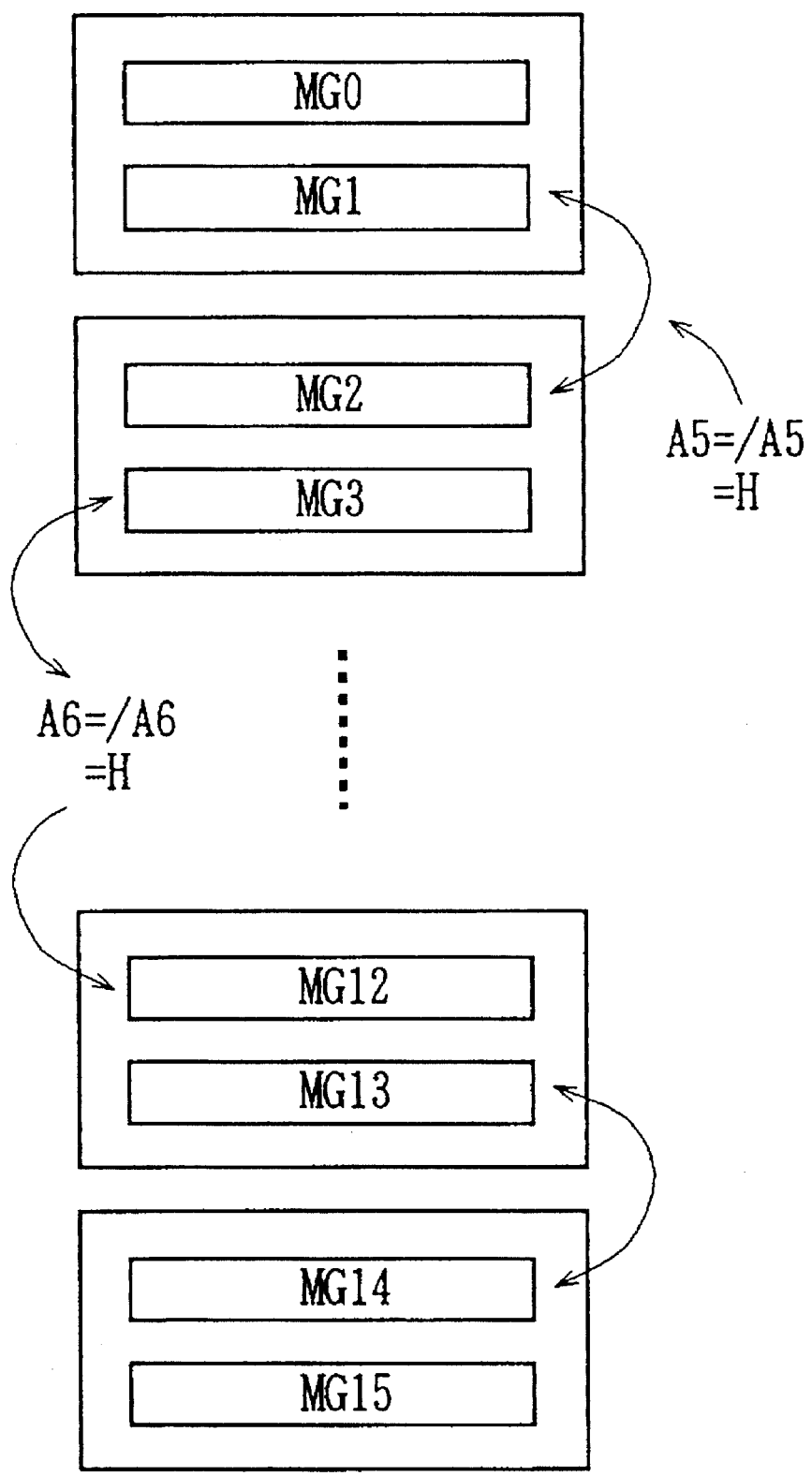
Figure 14:
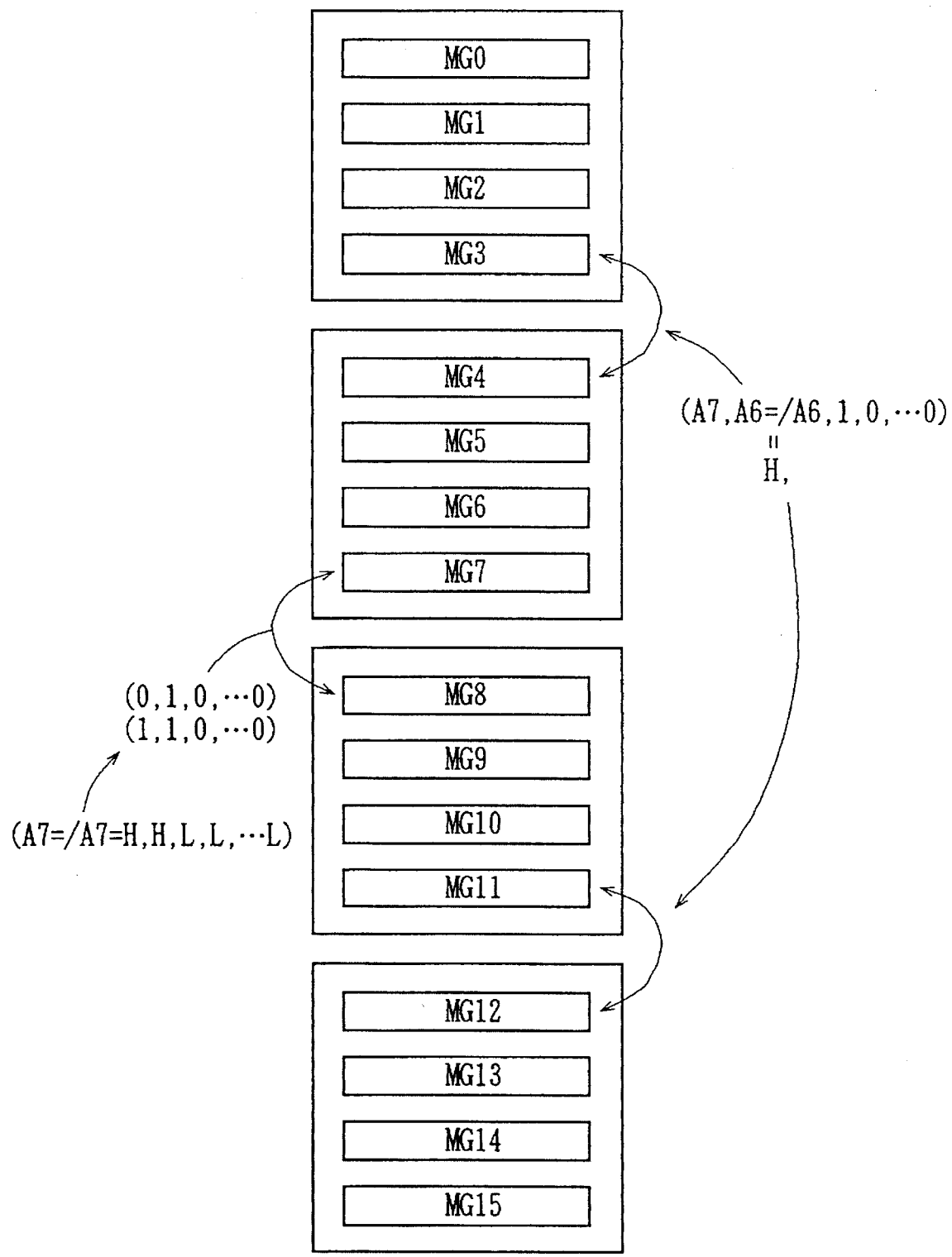

At the completion of this operation, sets of groups such as word line group G1 and word line group G2 (NAND gates NA12 and NA13) are not yet set to the selected state. In order to realize this selected state, address bits A1 and A0 are both fixed at "L" as shown in FIG. 11(a), and address bit A2 is fixed to "H". As for address bit A3, address bits A3 and /A3 are both set to "H". Consequently, output signal line ALPH10 of predecoder 201-1 is set to the selected state, and output signal lines ALPH21 and ALPH22 of predecoder 201-2 are set to the selected state. Therefore, set of word lines such as word lines WL7 and WL8 are simultaneously set successively as shown in FIG. 11(b), and programming before erasure takes place. Thereafter, this operation is repeated. An operation in which address bits are set such that address bit Aj=/Aj="H", A(j-1)="H", /A(j-1)="L", A(j-2) to A0="L" and /A(j-2) to/A0="H" while remaining upper address bits are incremented successively is repeated until the address bit Aj reaches the most significant address bit. By this operation, the group of word lines can be further enlarged and neighboring word lines belonging to neighboring word line groups are selected simultaneously, as shown in FIGS. 12 to 14. Now, in FIG. 12, for a large word line group MG including four word line groups, an adjacent large word line group is selected, and in the selected large word line groups, neighboring word lines belonging to neighboring word line groups G are successively set to the selected state. In FIG. 13, an operation is carried out for simultaneously selecting two word lines adjacent between neighboring large word line groups, in neighboring groups each including two large word line groups.

In FIG. 14, word line groups are selected group by group each group including four large word line groups MG, two word lines are simultaneously selected in the selected word line groups and programming before erasure is carried out.

By carrying out the series of operations shown in FIGS. 8 to 14, all neighboring word lines can be simultaneously selected two by two.

When the series of programming before erasure operation is completed (this completion can be detected by detecting the control signal /HFIX being set to "L" for the most significant address bit A7), memory cells are all programmed before erasure. When programming before erasure is completed, collective erasing operation is carried out in the same manner as in the prior art.

A structure for generating the addresses will be described in the following. Generation of control signals /LFIX, /HFIX and /BOH can be carried out under control of a program, by programming a prescribed sequence in a controller included in control circuit 130 shown in FIG. 1. However, this structure can also be implemented by a hardware and using pulse signals CLK repeatedly.

Figure 15:
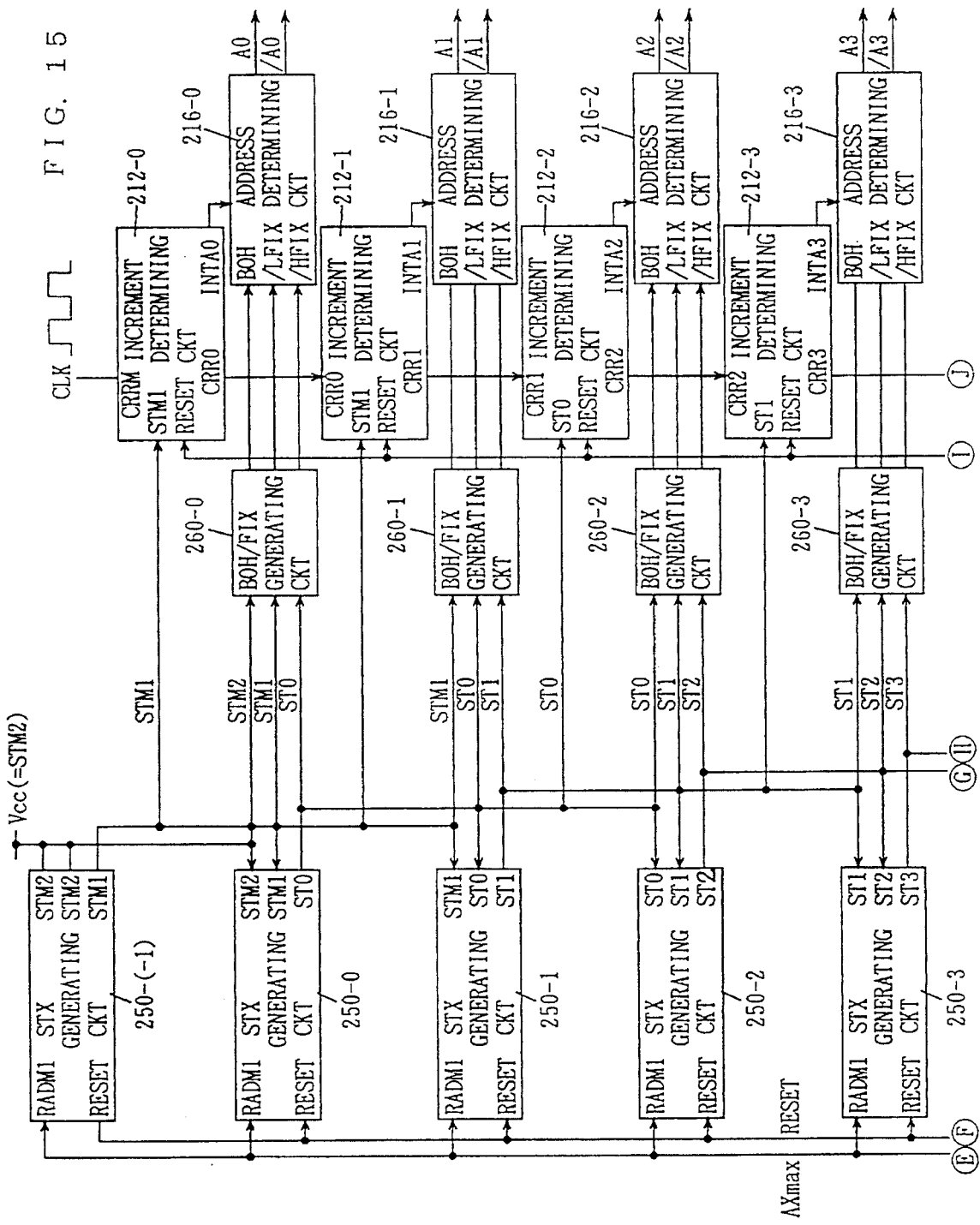
FIG. 15 is a block diagram showing a specific structure of the row address buffer having address converting function shown in FIG. 1.
Figure 16:
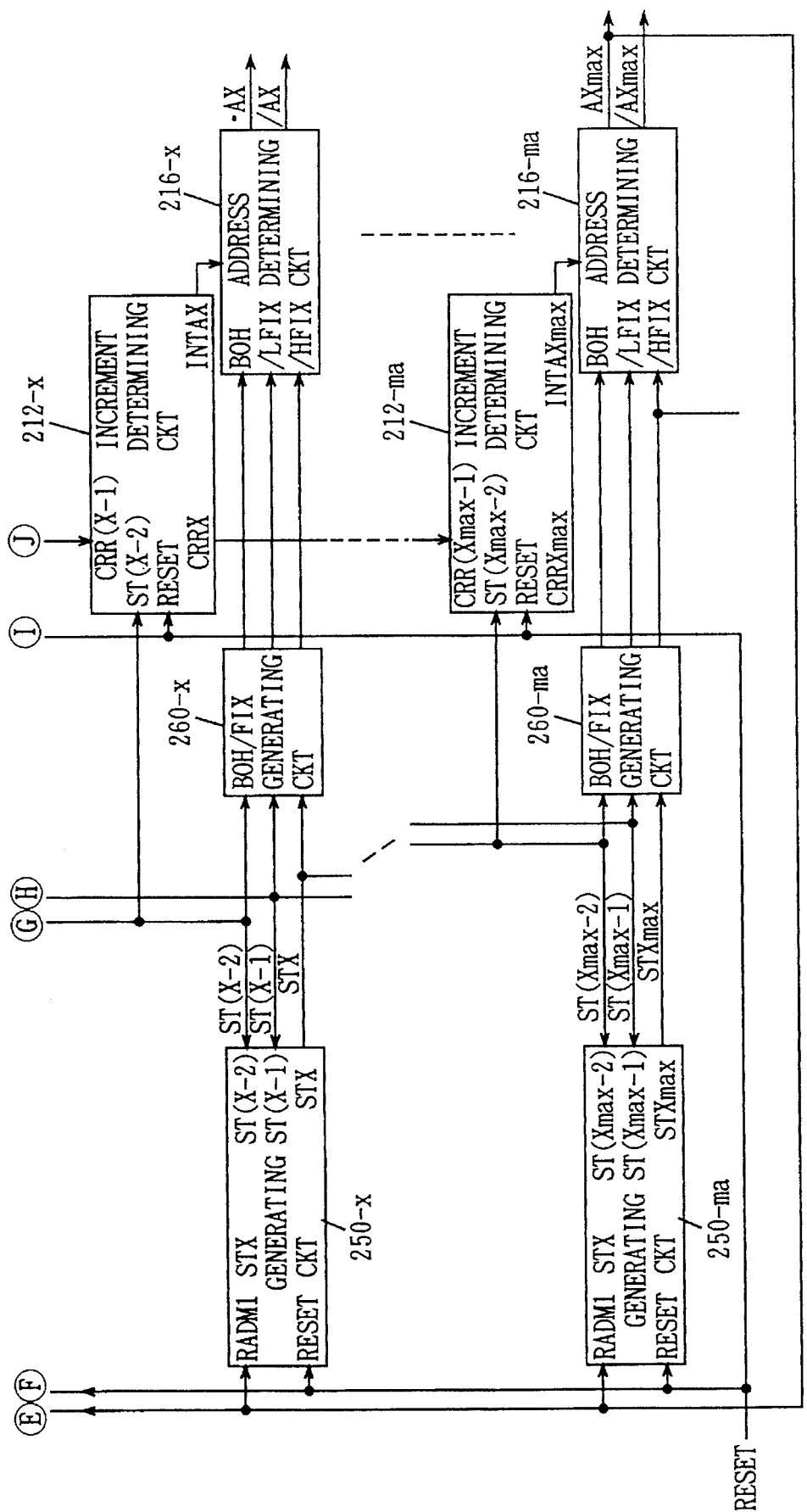
FIG. 16 is a block diagram showing a structure of the row address buffer having address converting function shown in FIG. 1.

FIGS. 15 and 16 show specific structures of the address control circuit and the address generating circuit shown in FIG. 6. Referring to FIGS. 15 and 16, address determining circuit 216 shown in FIG. 6 includes address determining circuits 216-0 to 216-ma provided for address bits A0 to AXmax, respectively. When the address used includes 8 bits and there are 256 word lines. Each of the address determining circuits 216-0 to 216-ma has the same structure, which is identical with the address determining circuit 216a shown in FIG. 7.

Address generating circuit 212 includes increment determining circuits 212-0 to 212-ma for generating internal addresses INDA0 to INDAXmax in accordance with a control signal ST and a clock signal CRR. Increment determining circuit 212-0 to 212-ma each generate an internal address INTA in response to a clock signal in accordance with a control signal ST, and transmit the input clock CRR to the increment determining circuit of an upper bit in accordance with the control signal ST.

Address control circuit 210 includes STX generating circuits 250-(-1) to 250-ma for generating a basic control signal ST which serves as a timing signal for determining execution/non-execution of address incrementation in increment determining circuits 212-0 to 212-ma and also serves to generate control signals /BOH, /LFIX and /HFIX; and BOH/FIX generating circuits 260-0 to 260-ma for generating control signals /BOH, /HFIX and /LFIX in response to the control signal ST from the STX generating circuit. STX generating circuit 250-i receives control signals ST(i-2) and ST(i-1) and generates a control signal STi. BOH/FIX generating circuit 260-i receives control signals STi, ST(i-1) and ST(i-2) and generates control signals /BOH, /LFIX and /HFIX. The STX generating circuit 250-(-1) of the first stage receives at its both inputs signals at the level of the supply potential Vcc and generates a control signal STM1. The STX generating circuit 250-0 of the second stage receives at its first input a signal at the level of the supply voltage Vcc, receives at its second input the control signal STM1 generated from STX generating circuit 250-(-1), and generates a control signal ST0.

STX generating circuits 250-(-1) to 250-ma each receive at its reset input RESET a reset signal RESET and at its clock input RADM1 the most significant address bit AXmax. STX generating circuits 250-(-1) to 250-ma generate, a control signal for forcedly setting the address and for determining incrementation in the next cycle after all the word lines are selected once.

Increment determining circuits 212-0 to 212-ma determine whether the internal address is to be incremented or maintained in accordance with a control signal from the STX generating circuit provided at the 1 bit lower side, and generates an internal address INTAX in accordance with the result of determination. Specific structures of these circuits will be described.

Figure 17:
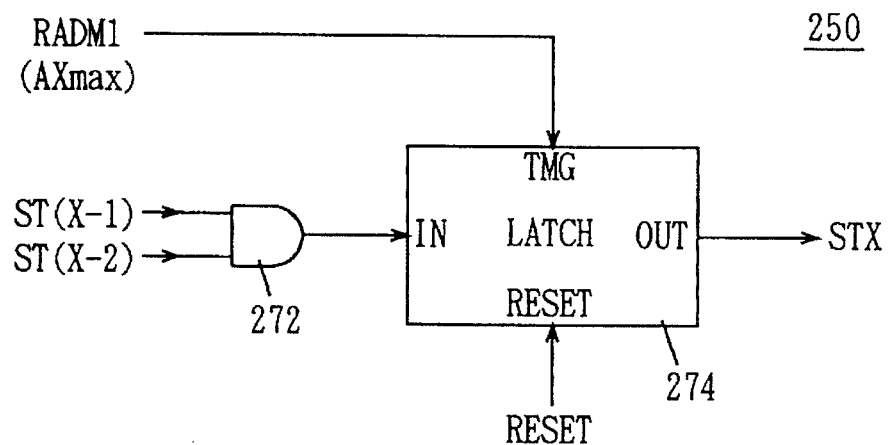
FIG. 17 shows a structure of a STX generating circuit shown in FIGS. 15 and 16.

FIG. 17 shows a structure of the STX generating circuit. In FIG. 17, STX generating circuit 250 includes an AND gate 272 receiving control signals ST(X-1) and ST(X-2) from the STX generating circuit provided on the upstream side (on the side of the lower bit), and a latch circuit 274 receiving the most significant address bit AXmax through input RADM1, latching the output from AND gate 272 in response to the signal RADM1 for generating the control signal STX. Latch circuit 274 latches a signal applied to an input IN in response to the rise of a signal applied to an input TMG, and in response to the fall of the signal applied to input TMG, outputs the signal which has been latched through an output OUT.

Figure 18:
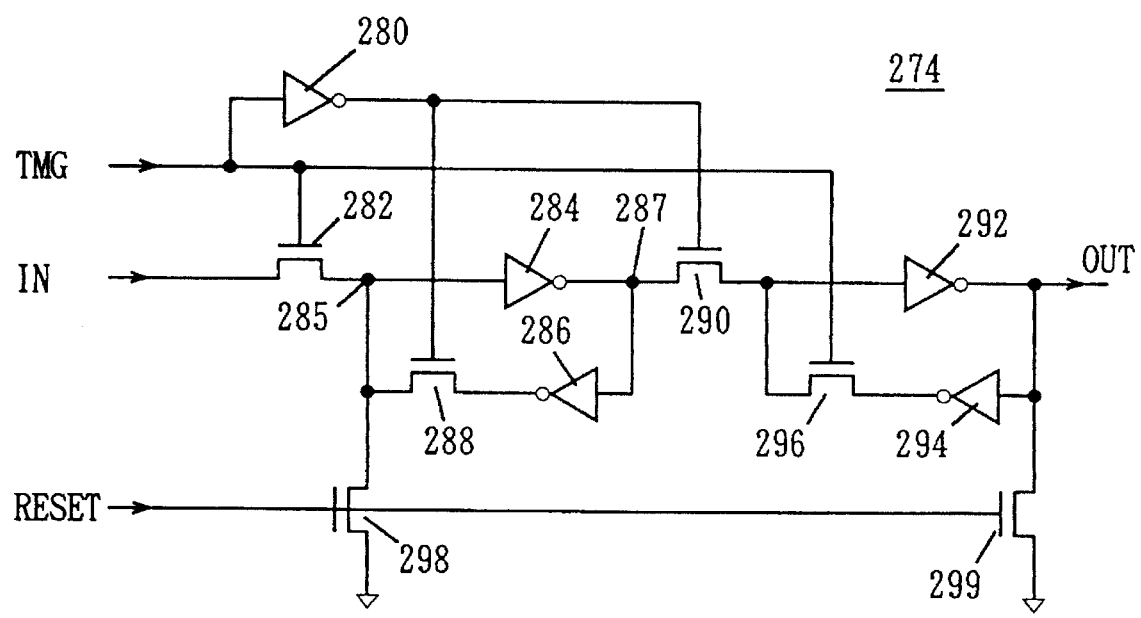
FIG. 18 shows a specific structure of a latch circuit shown in FIG. 17.

FIG. 18 shows a specific structure of the latch circuit shown in FIG. 17. Referring to FIG. 18, latch circuit 274 includes an inverter circuit 280 for inverting a signal applied to a timing signal input node TMG, a transfer gate 282 which is rendered conductive in response to a signal applied to input node TMG for passing a signal applied to input IN, an inverter circuit 284 for inverting a signal applied from transfer gate 282, an inverter circuit 286 for inverting an output from inverter circuit 284, and a transfer gate 288 which is rendered conductive in response to an output from inverter circuit 280 for transmitting the output from inverter circuit 286 to an internal node 285. When transfer gate 288 is rendered conductive, inverter circuits 284 and 286 constitute a latch circuit.

Latch circuit 274 further includes a transfer gate 290 which is rendered conductive in response to an output from inverter circuit 280, an inverter circuit 292 which inverts a signal applied through transfer gate 290 and transmits the inverted signal to output node OUT, an inverter circuit 294 for inverting an output from inverter circuit 292, and a transfer gate 296 which is rendered conductive in response to a signal applied to input node TMG for transmitting an output from inverter circuit 294 to an input portion of inverter circuit 292. When transfer gate 296 is rendered conductive, inverter circuits 292 and 294 constitute a latch circuit, also.

Latch circuit 274 further includes gate transistors 298 and 299 which are rendered conductive in response to a signal RESET applied to reset input RESET for resetting internal node 285 and output node OUT to the ground potential level.

Figure 19:
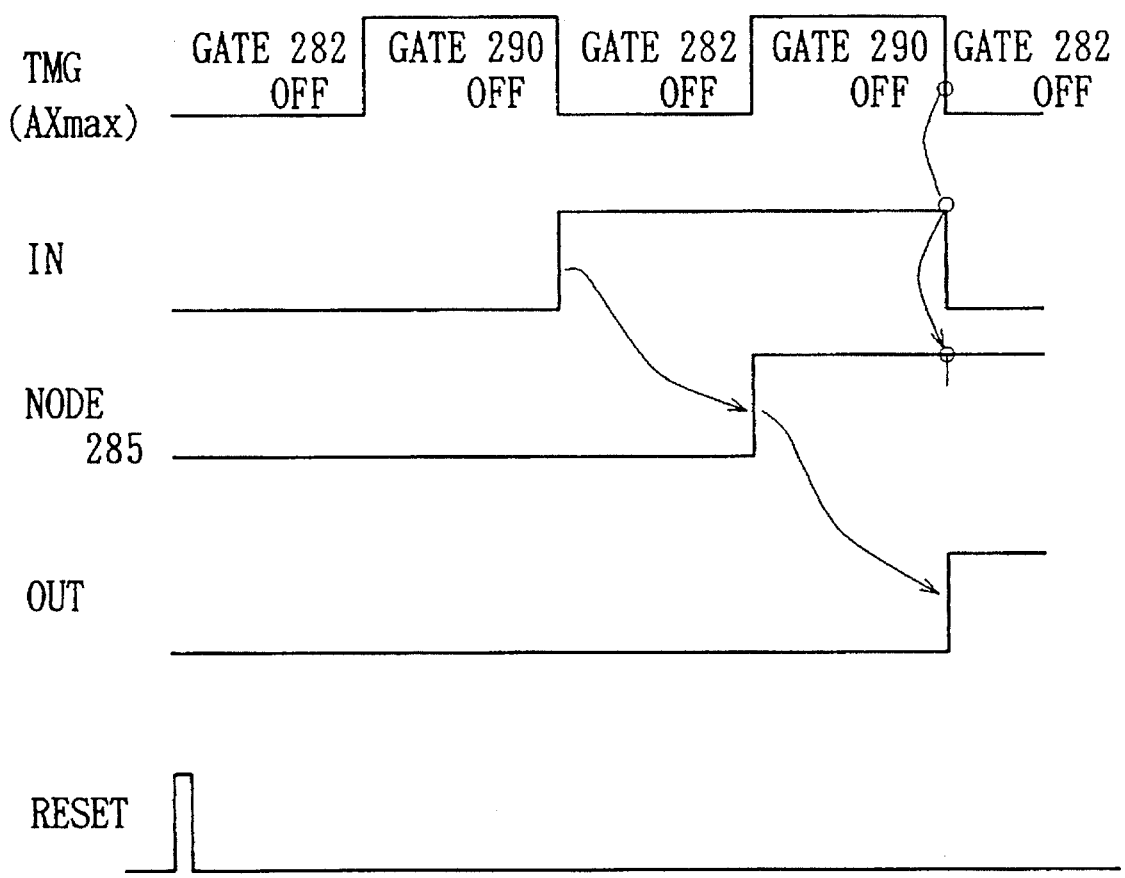
FIG. 19 is a diagram of signal waveforms showing the operation of the latch circuit shown in FIG. 18.

Transfer gates 282, 288, 290 and 296 as well as the gate transistors 298 and 299 are rendered conductive when a signal at "H" is applied at their gates. The operation of the latch circuit shown in FIG. 18 will be described with reference to FIG. 19, which is a diagram of signal waveforms.

In the initial state, reset signal RESET is generated, gate transistors 298 and 299 are rendered conductive, and internal node 285 and output node OUT are both initially set to "L". When the signal applied to input node TMG is at "L", gates 282 and 296 are rendered non-conductive, while gates 288 and 290 are rendered conductive. At this state, inverter circuit 284 and 286 constitute a latch circuit, and the latched signal is provided through gate 290 and inverter circuit 292.

When the signal applied to input node TMG rises to "H", gates 282 and 296 are rendered conductive, while gates 288 and 290 are rendered non-conductive. Thus the signal applied to input node IN is transmitted to internal node 287. At this state, node 290 is non-conductive, inverter circuits 292 and 294 constitute a latch circuit, and the signal which has been applied to output node OUT while the signal applied to input node TMG is at "L" is continuously output.

Assume that the signal applied to input IN rises to "H". In this case, the signal which has been applied to input node TMG is at "L", so that the potential of internal node 285 does not change. When the signal applied to input node TMG rises to "H", gate 282 is rendered conductive, and the signal applied to input node IN is latched in internal node 287. At this time, gate 290 is off, and the signal potential at its output node OUT is not changed. Then, when the signal applied to input node TMG falls to "L", gate 290 is rendered conductive, and signal which has been held at internal node 287 is output to output node OUT.

The signal applied to input node TMG is the most significant address bit AXmax. Therefore, one cycle of the signal applied to input node TMG corresponds to a word line selection execution cycle which is necessary with one word line address fixed. When one word line selecting cycle is completed, the control signal STX is generated, so as to set corresponding address bits AX and /AX to desired state.

Figure 20:
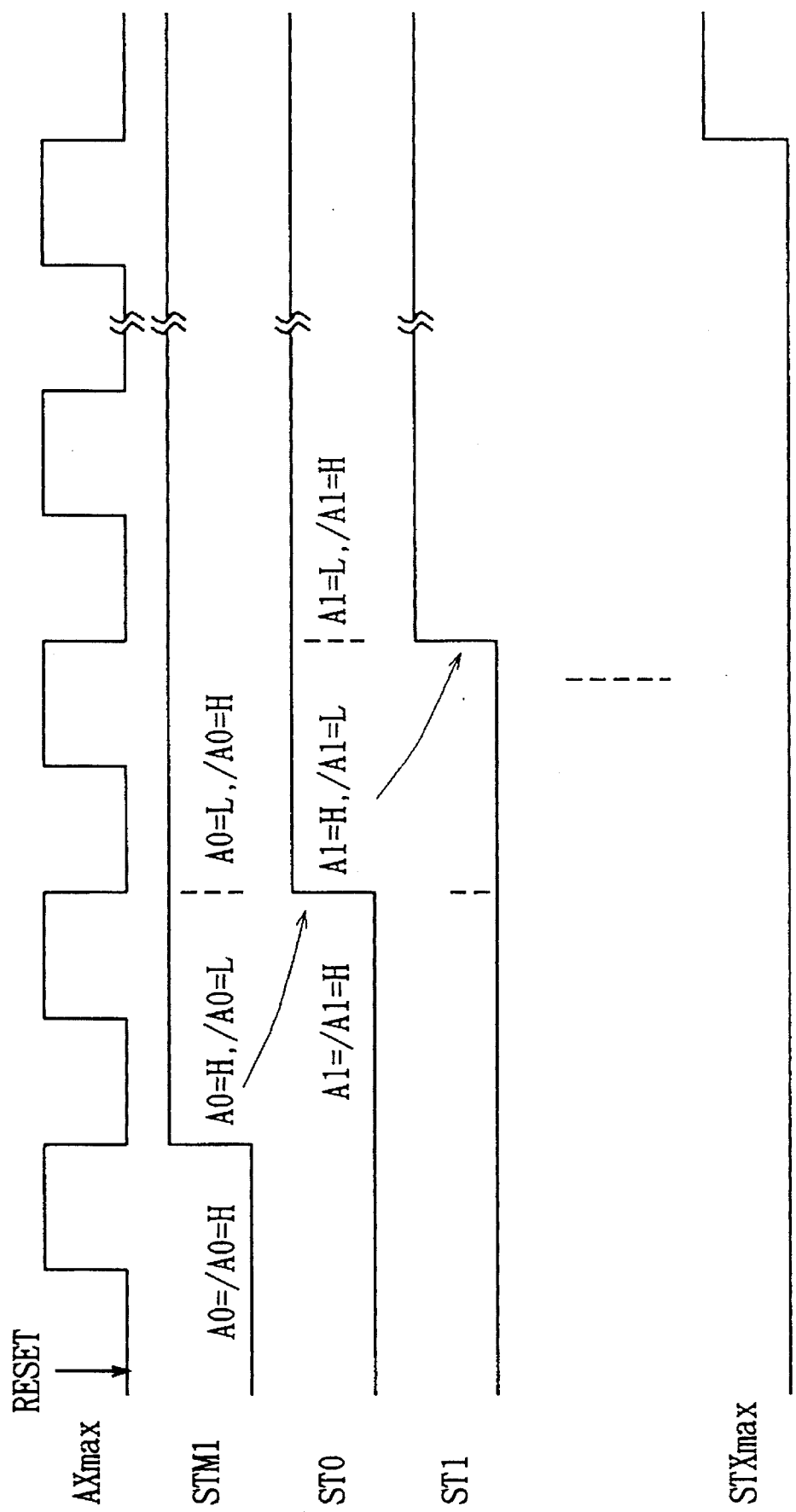
FIG. 20 is a diagram of signal waveforms showing a sequence of control signal generation of the STX generating circuit shown in FIGS. 15 and 16.

FIG. 20 shows a sequence of generation of control signals STM1 to STXmax generated by STX generating circuits 250-(-1) to 250-ma. Referring to FIG. 20, in the first cycle, all control signals STM1 to STXmax are at the state of "L". Since the signal STM2 is always at "H", the signal STM1 rises to "H" in the next cycle. This state is maintained until completion of the programming before erasure. Thereafter, by every one cycle of the most significant address bit AXmax, control signals ST0, ST1, . . . are raised successively to "H". Consequently, control signals for setting the corresponding address bit to the incrementable state, "H" and "L" fixed state and invalidated state (that is, AX=/AX= "H") are generated.

Figure 21:
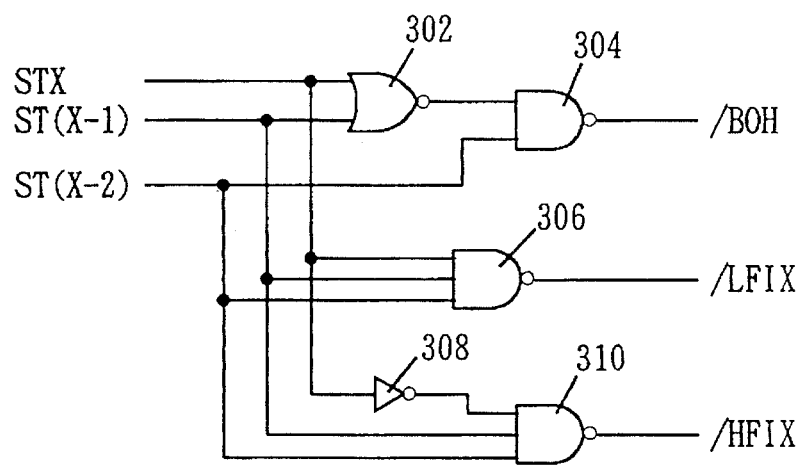
FIG. 21 shows a structure of a BOH/FIX generating circuit shown in FIGS. 15 and 16 as well as the relation of input/output signals thereof.

FIG. 21 shows a specific structure of the BOH/FIX generating circuit and the logics of its inputs and outputs. FIG. 21 shows a structure of the BOH/HIX generating circuit which corresponds to an address bit AX.

Referring to FIG. 21(A), a BOH/HIX generating circuit 260 includes an NOR gate 302 receiving control signals STX and ST(X-1), a 2-input NAND gate 304 receiving an output from NOR gate 302 and control signal ST(X-2), a 3-input NAND gate 306 receiving control signals STX, ST(X-1) and ST(X-2), an inverter circuit 308 inverting control signal STX, and a 3-input NAND gate 310 receiving an output from inverter circuit 308 and control signals ST(X-1) and ST(X-2).

Control signal /BOH is generated from NAND gate 304. Control signal /LFIX is generated from NAND gate 306. Control signal /HFIX is generated from NAND gate 310.

When control signal /BOH attains to "L", address bits AX and /AX are both set to "H". When control signal /LFIX attains to "L", the corresponding address bit AX is fixed to "L" (and the complementary bit /BX is set to "H"). When control signal /HFIX attains to "L", the corresponding address bit AX is fixed to "H" (the complementary bit /AX is fixed to "L").

FIG. 21(B) shows, in a table, logics of inputs and outputs of the BOH/FIX generating circuit shown in FIG. 21(A). When control signals STX, ST(X-1) and ST(X-2) are all at "L", control signals /BOH, /LFIX and /HFIX will be all "H". In this state, the address determining circuit shown in FIG. 7 passes the applied address, as does a common buffer.

When control signal ST(X-2) is at "H" and control signals STX and ST(X-1) are at "L", only the control signal /BOH attains to "L". At this state, corresponding address bits AX and /AX are both fixed to "H".

When control signal STX is at "L" and control signals ST(X-1) and ST(X-2) are both at "H", control signal /HFIX attains to "L". At this state, address bit AX is fixed to "H" and address bit /AX is fixed to "L".

If control signals STX, ST(X-1) and ST(X-2) are all at "H", control signal /LFIX attains to "L". At this state, address bit AX is fixed to "L" and the complementary address bit /AX is fixed to "H".

Control signals ST(X-2), ST(X-1) and STX successively rise to "H" respectively at every 1 cycle of the most significant address bit AXmax, as can be seen from FIG. 20. Therefore, the corresponding address bit is set to the incrementable state (in which the same address as the applied address passes, as in the normal buffer), both selected state (AX=/AX="H"), X fixed state (address bit AX="H"), and L fixed state (address bit AX="L"), successively.

FIG. 22(A) shows a specific structure of the increment determining circuit. Referring to FIG. 22(A), increment determining circuit 212 includes an inverter circuits 320 inverting control signal ST(X-2), a 2-input NAND gate 322 receiving an output from inverter circuit 320 and an internal address bit INTAX, an NAND gate 324 receiving control signal ST(X-2) and CRR(X-1), and a 2-input NAND gate 326 receiving output from NAND gates 322 and 324. A signal CRRX which is transmitted to a clock input of the increment determining circuit provided on the upper bit side is generated from NAND gate 326.

Increment determining circuit 212 further includes an inverter circuit 330 inverting internal address INTAX and a latch circuit 328 which latches and outputs the output from inverter circuit 330 in response to the signal CRR(X-1). The operation will be described with reference to the diagram of signal waveforms of FIG. 22(B).

When the signal ST(X-2) is at "L", the output of NAND gate 324 is fixed at "H", and NAND gates 322 and 326 operate as an inverter circuit. Therefore, at this state, the internal address INTAX is transmitted as the clock signal CRRX to the increment determining circuit on the upper bit side. Latch circuit 328 has the same structure as that shown in FIG. 18, and it divides by two the signal CRR(X-1) for output. Namely, the signal obtained by diving the signal CRR(X-1) by two is applied as the internal address INTAX. The signal CRR(X-1) is the output from the increment determining circuit on 1 bit lower side. When the signal ST(X-2) is at "L", control signals ST(X-1) and STX are both at "L" (see FIG. 21(B)). In this state, internal addresses INTAX and INTA(X-1) are incremented. Therefore, the internal address bit INTAX changes in a period twice that of the address bit INTA(X-1) which is lower by 1 bit. This operation is repeated in the increment determining circuit provided for the address bits of the upper bits, and thus internal address is successively incremented.

When the signal ST(X-2) attains to "H", the output of NAND gate 322 is fixed at "H". In this state, the control signal CRRX comes to be equal to the control signal CRR(X-1).

The state in which control signal ST(X-2) attains to "H" corresponds to the state in which the address AX applied to the predecoder is at the both selected state (AX=/AX="H"), or the H fixed state (AX="H", /AX="L") or the L fixed state (Ax="0", /AX="H"). The internal address is not incremented in this state. What is necessary is to successively increment bits higher than the internal address bit AX. The control signal CRR(X-1) lower by 1 bit changes in accordance with the control signal CRR(X-2) which is lower by further 1 bit. This is the same for the control signal CRR0 of the least significant bit. Accordingly, the control signal CRRX changes in accordance with the clock signal CLK which is supplied to the increment determining circuit 212-0 which is provided for the internal address of the least significant bit. By virtue of this structure, even if the number of bits the states of which are fixed is changed, the internal address can be incremented with the constant time interval, and therefore necessary word lines can be set to the selected state with the constant time interval.

Completion of the programming before erasure can be detected by detecting the change of the control signal /HFIX corresponding to the most significant address bit AXmax to "L".

Figure 23:
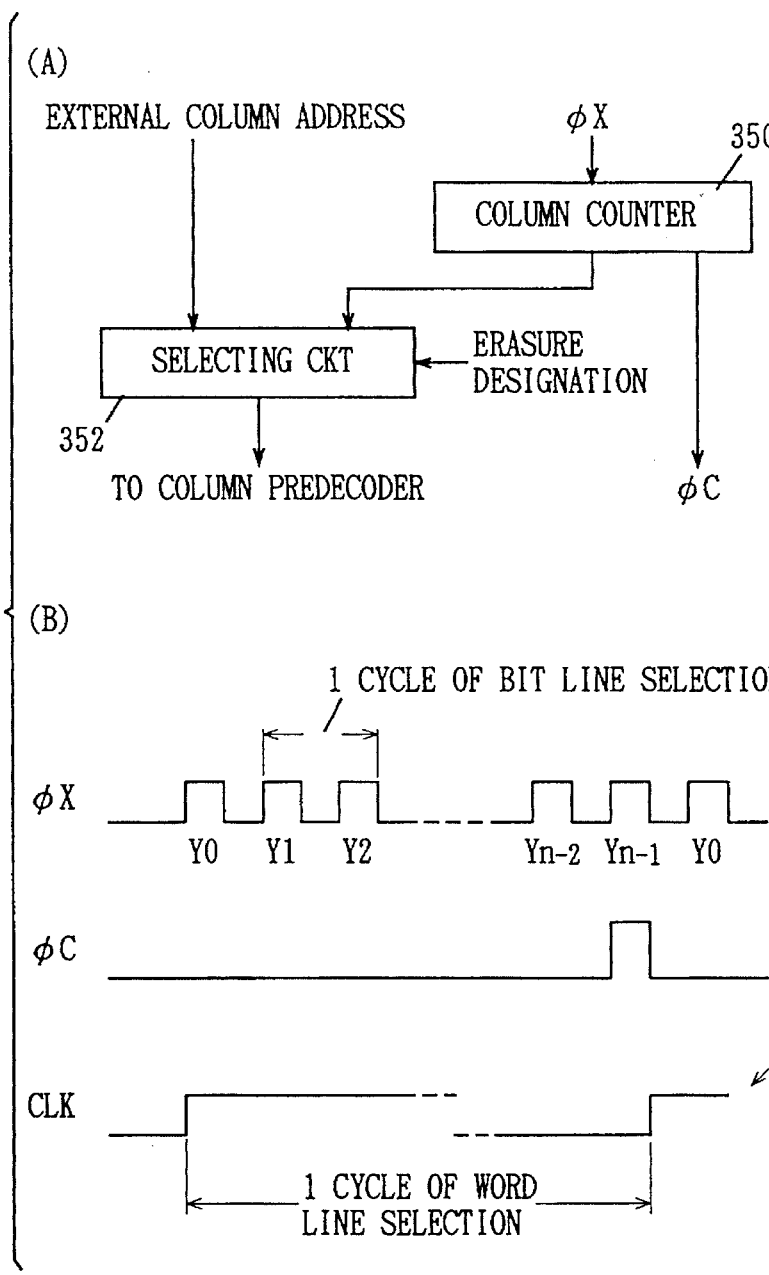
FIG. 23 shows bit line selecting signal generating system and relation between bit line selecting operation and word line selecting operation in accordance with one embodiment of the present invention.

FIG. 23(A) shows a structure for generating a column address for successively selecting bit lines in the programming before erasure. Referring to FIG. 23(A), a column counter 350 counts the clock signals φX generated at the time of programming before erasure, and generates the counted value as a column address. A selecting circuit 352 selects an output from column counter 350 at the time of the programming before erasure in response to an erasure instruction, and transmits the selected output to a column predecoder. Selecting circuit 352 selects an externally applied column address and transmits the same to the column predecoder at the time of reading and at the time of writing information after erasure. Column counter 350 has its count value reset to the initial value in response to a count up signal φC.

One cycle of the clock signal CLK for selecting the word line described above corresponds to one cycle of the word line simultaneous selecting operation. In one cycle of the clock signal CLK, bit lines are selected successively, and the programming before erasure is effected on the selected memory cells. The clock signal φX is generated from control circuit 130 shown in FIG. 1. In this example, the clock signal CLK for selecting the word line is obtained by frequency division of the clock signal φX for selecting the bit line. More specifically, referring to FIG. 23(B), if the structure is adapted such that n column selecting signal lines are set to the selected state successively, the clock signal CLK for selecting the word line in the programming before erasure can be generated by dividing by n the frequency of the clock signal φX for selecting the bit line.

When an erasure verifying operation is to be carried out, control signals /BOH, /LFIX and /HFIX are all set to the "H" state. This can be realized by generating and applying reset signal RESET to STX generating circuit 250 and BOH/FIX generating circuit 260 so as to stop generation of the clock signal CLK.

In the erasure verifying operation, a structure may be used in which a row counter similar to the column counter 350 provided internally is utilized and the outputs of the row counter are selectively output to the input portion of the address determining circuit. A structure in which row and column addresses are externally applied successively in the erasure verifying operation may be utilized.

It is not necessary to represent external addresses in gray codes even when the addresses for the word lines are represented in gray codes. The reason for this is that even when an external address in binary notation as in the prior art is applied to the predecoder, the corresponding word line is selected as automatic address conversion is internally executed. For example, at the time of erasure verifying operation, all word lines are successively selected, and at the time of write verifying operation, an external address is latched and the latched address is applied to the predecoder.

Alternatively, the output signal lines ALPHi2 and ALPHi3 of the predecoder may be switched only at the time of programming before erasure and signal lines of the same structure as in the prior art may be used in the normal writing and reading of information. This structure can be readily implemented by providing a switch circuit which switches signal lines ALPHi2 and ALPHi3 in response to the programming before erasure designation at the output signal line portion of the predecoder.

Figure 24:
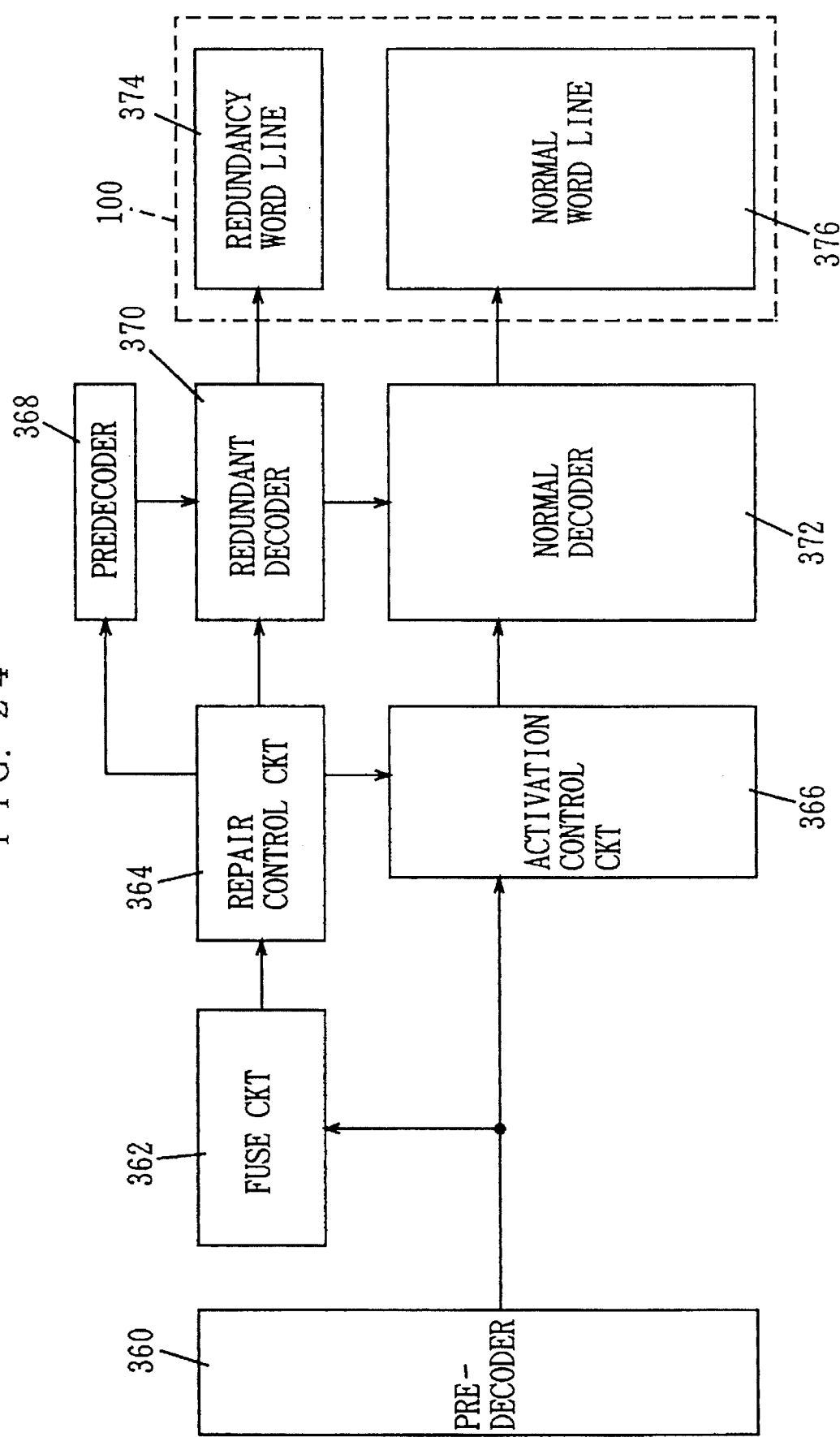
FIG. 24 shows a structure for selecting a spare word line and a normal word line in the first embodiment of the present invention.

FIG. 24 shows a structure of a main portion of the nonvolatile semiconductor memory device in accordance with the first embodiment of the present invention. A structure for successively selecting a spare word line and a normal word line in the programming before erasure will be described with reference to FIG. 24.

A predecoder 360 has the same structure as the predecoder shown in FIGS. 3, 4 and 5, and it selects a set of four word lines.

Memory array 100 shown in FIG. 1 includes a normal word line region 376 and a redundancy word line region 374. Redundancy word line region 374 and normal word line region 376 includes a spare column region 106. When there is a defective word line in normal word line region 376, a spare (redundant) word line in redundancy word line region 374 substitutes for the defective word line.

Fuse circuit 362 stores the address of the defective word line in normal word line region 376 and when the decode signal applied from predecoder 360 designates the defective word line, generates a signal for selecting the corresponding spare word line.

Repair control circuit 360 transmits the spare word line selecting signal of fuse circuit 362 in normal information writing and reading operations, and when the spare word line is selected (when the defective word line is designated), inactivates activation control circuit 366. When a disabling signal is applied from repair control circuit 364, activation control circuit 366 disables the output of predecoder 360 so as to inhibit decoding operation of normal decoder 372.

Further, in programming before erasure, repair control circuit 364 controls activation control circuit 366 such that normal decoder 372 is rendered operative even if a defective word line is designated, and when a spare word line in redundancy word line region 374 is simultaneously selected in programming before erasure, it generates necessary selecting signals.

Predecoder 368 is shown as shared by spare word lines and normal word lines. Predecoder 368 may be provided separately for normal word line region 376 and redundancy word line region 374, respectively. Predecoder 368 designates one word line out of a set of four word lines designated by predecoder 360.

Redundant decoder 370 selects a spare word line in redundancy word line region 374. Normal decoder 372 selects a corresponding word line in normal word line region 376 in accordance with outputs from predecoders 360 and 368. Though the high voltage switch circuit is not shown here, a high voltage switch circuit is provided as word line driving means, at the output portions of redundant decoder 370 and normal decoder 372. The operation will be briefly described.

The operations in normal writing and reading (writing and reading of information in accordance with an external address) will be described. When there is a defective word line in normal word line region 376, the address of the defective word line is programmed in fuse circuit 362.

Predecoders 360 and 368 decode the applied address, and provide signals indicative of the result of decoding. When a normal word line is designated, the output from fuse circuit 362 is inactive, and repair control circuit 364 activates activation control circuit 366. Consequently, the result of decoding from predecoder 360 is transmitted to normal decoder 372. Normal decoder 372 decodes the decode signal from activation control circuit 366 and the decode signal from predecoder 368, and selects a corresponding word line in normal word line region 376. Thereafter, a bit line is selected by the column decoder and the Y gate (see FIG. 1), and data is written to or read from a memory cell arranged corresponding to the crossing of the selected bit line and the selected word line.

When the defective word line is addressed, fuse circuit 362 generates a signal designating a set of corresponding word lines in the redundancy word line region 374. In response to the spare word line selecting signal from fuse circuit 362, repair control circuit 364 inactivates the activation control circuit 366. Consequently, signals from predecoder 360 are all transmitted in the non-selected state to the normal decoder 372, and word line is not selected in normal word line region 376. Redundant decoder 370 decodes the word line set designating signal from repair control circuit 364 and the word line designating signal from predecoder 368, and selects a corresponding spare word line in redundancy word line region 374. Selection of the bit line and writing and reading of data are carried out in the similar manner as in the normal word line region 376.

The operation when the programming before erasure is effected will be described. In this case, the programming before erasure designation is applied at first to repair control circuit 364, operation of redundant decoder 370 is inhibited, and normal decoder 372 is rendered operative. Thus, in accordance with the above described structure, in the normal word line region 376, adjacent word lines are selected, and programming of the selected word lines is carried out. Once programming before erasure in normal word line region 376 is completed, repair control circuit 364 controls activation control circuit 366 in accordance with the designation of completion, and renders the normal decoder 372 inoperative. Repair control circuit 364 includes the above mentioned address generation and determining circuit for programming before erasure, and successively generates signals for simultaneously selecting adjacent spare word lines in programming before erasure. By redundant decoder 370 and predecoder 368, simultaneous selection of adjacent word lines in redundancy word line region 374 is carried out, and programming before erasure is executed on the selected word lines.

More specifically, in normal word line region 376 and redundancy word line region 374, sets of adjacent word lines are selected successively, and programming before erasure is carried out. Specific structures and operation of various circuits will be described.

Figure 25:
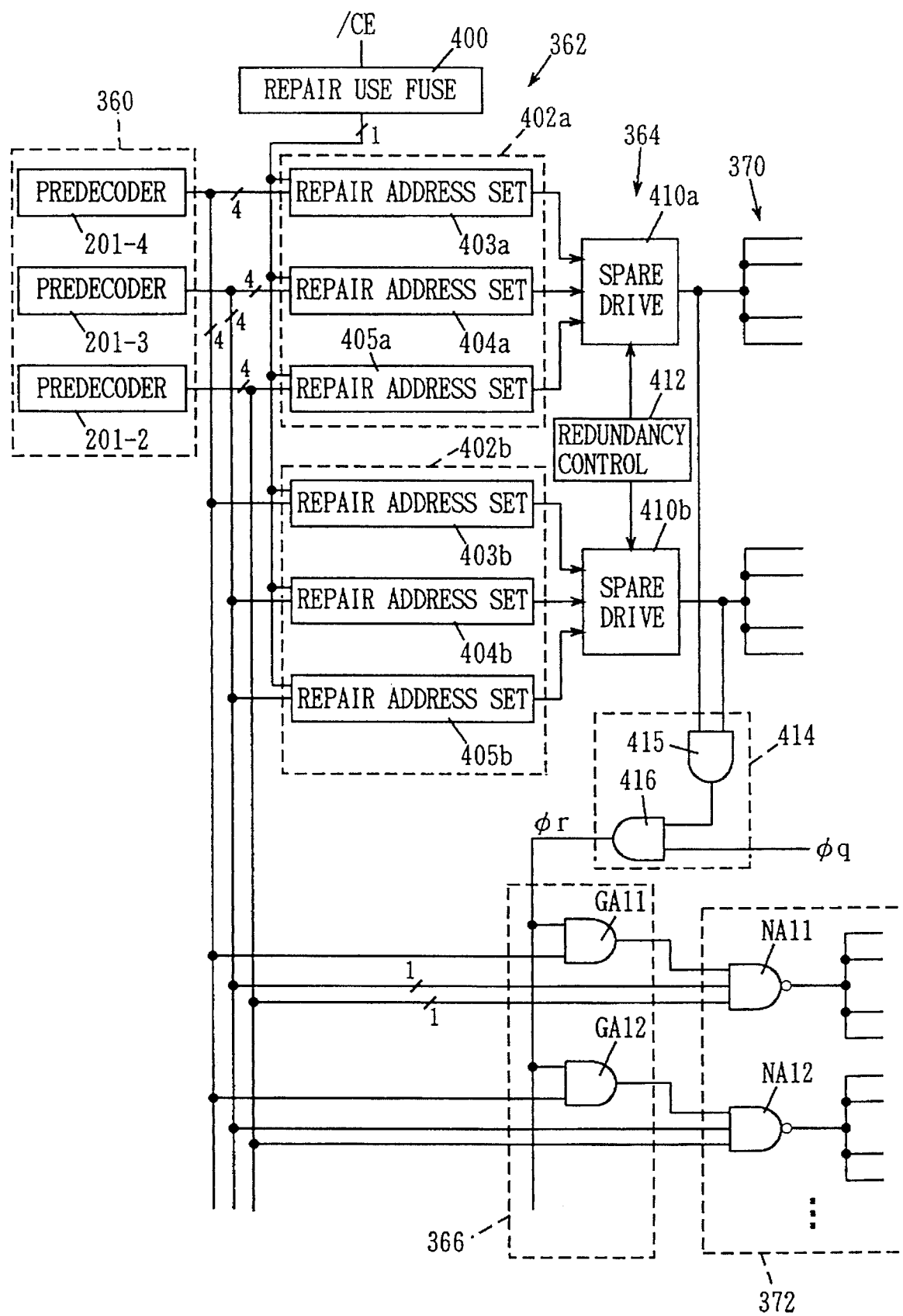
FIG. 25 shows structures of a predecoder, a fuse circuit, a repair control circuit and an activation control circuit shown in FIG. 24.

FIG. 25 shows structures of the fuse circuit, activation control circuit and the repair control circuit shown in FIG. 24. In FIG. 25, a predecoder receiving the least significant 2 bits A0 and A1 of an address for selecting one word line out of four word lines is not shown. A predecoder, a spare row decoder and a normal row decoder having similar structures as those of FIG. 5 are provided.

Referring to FIG. 25, predecoder 360 includes predecoders 201-2, 201-3 and 201-4 which have the same structure as those shown in FIGS. 3 and 4. In FIG. 25, four output signal lines ALPHi0–ALPHi3 of each of the predecoders 201-2 to 201-4 are shown as a 4 bit bus.

Fuse circuits 362 includes a repair use fuse circuit 400 for generating a signal indicating whether or not the spare word line is used, that is, the defective word line is replaced, and repair address program circuits 402-a and 402-b for storing the address of the defective word line to be replaced. When there is a defective word line, the word line group (four word lines sharing the NAND gate at the row decoder input portion) including the defective word line are replaced by the spare word lines. FIG. 25 shows an example in which two word line groups are repaired.

Repair address program circuits 402a and 402b have the identical structure and include repair address setting circuits 403a to 405a and 403b to 405b provided for predecoders 201-2 to 201-4, respectively. Repair address program circuits 402a and 402b generate a signal indicating the selected state, when an address program in repair address setting circuits 403a to 405a and 403b to 405b is designated, respectively.

Repair control circuit 304 includes a redundant control circuit 412 for generating necessary control signals and addresses in programming before erasure, spare driving circuits 410a and 410b for driving corresponding word line groups in accordance with the outputs from repair address program circuits 402a and 402b, and a control signal generating circuit 414 responsive to output signal potentials from spare driving circuits 410a and 410b for inhibiting decoding operation of normal decoder 372.

Control signal generating circuit 414 includes an AND gate 415 receiving signals from spare driving circuits 410a and 410b and an AND gate 416 receiving a redundancy programming before erasure designating signal φq as well as an output from AND gate 415. When a spare word line is selected, output of spare driving circuit 410a or 410b attains to "L". In that case, the output signal φr of control signal generating circuit 414 attains to "L". When programming before erasure is to be effected on the spare word line, the signal φq attains to "L". The signal φq is normally at "H". In the programming before erasure, redundant control circuit 412 inactivates spare driving circuits 410a and 410b, and generates a spare word line selecting signal for programming before erasure.

Activation control circuit 366 includes 2-input AND gates GA11, GA12, . . . provided corresponding to NAND gates NA11, NA12, . . . provided at the input portion of the row decoder. The signal φr from control signal generating circuit 414 is applied to one input of respective ones of AND gates GA11, GA12, . . . . The output from predecoder 201-4 which is to be transmitted to corresponding NAND gates NA11, NA12, . . . is transmitted to the other input of respective ones of AND gates GA11, GA12, . . .

When the control signal φr attains to "L", activation control circuit 366 fixes the output from AND gates NA11, NA12, . . . to "H". This state corresponds to the state in which the spare word line is selected. When a normal word line is selected, the signal φr attains to "H", the output of the corresponding NAND gate NA in accordance with the output of predecoder 360 falls to "L", and the output of the non-selected NAND gate NA attains to "H".

When programming before erasure is to be effected on the normal word line, signal φq is set to "H", and outputs from spare driving circuits 410a and 410b are set to "H" under the control of redundant control circuit 412. Consequently, AND gates GA11 and GA12 in activation control circuit 366 function as buffers, and word line selecting operation is carried out in accordance with the signal provided from predecoder 360.

When a spare word line is to be selected, the signal φq is set to "L". A signal for selecting adjacent two word lines is generated in programming before erasure operation under the control of redundant control circuit 412, and one of the sets of word lines corresponding to spare driving circuits 410a and 410b is set to the selected state. In the selected set of spare word lines, word line selection is carried out by a predecoder, not shown, and programming before erasure is carried out.

In programming before erasure, the address programmed in repair address program circuits 402a and 402b is not used. The address of the defective word line stored in repair address program circuits 402a and 402b is used only in the normal operation.

Figure 26:
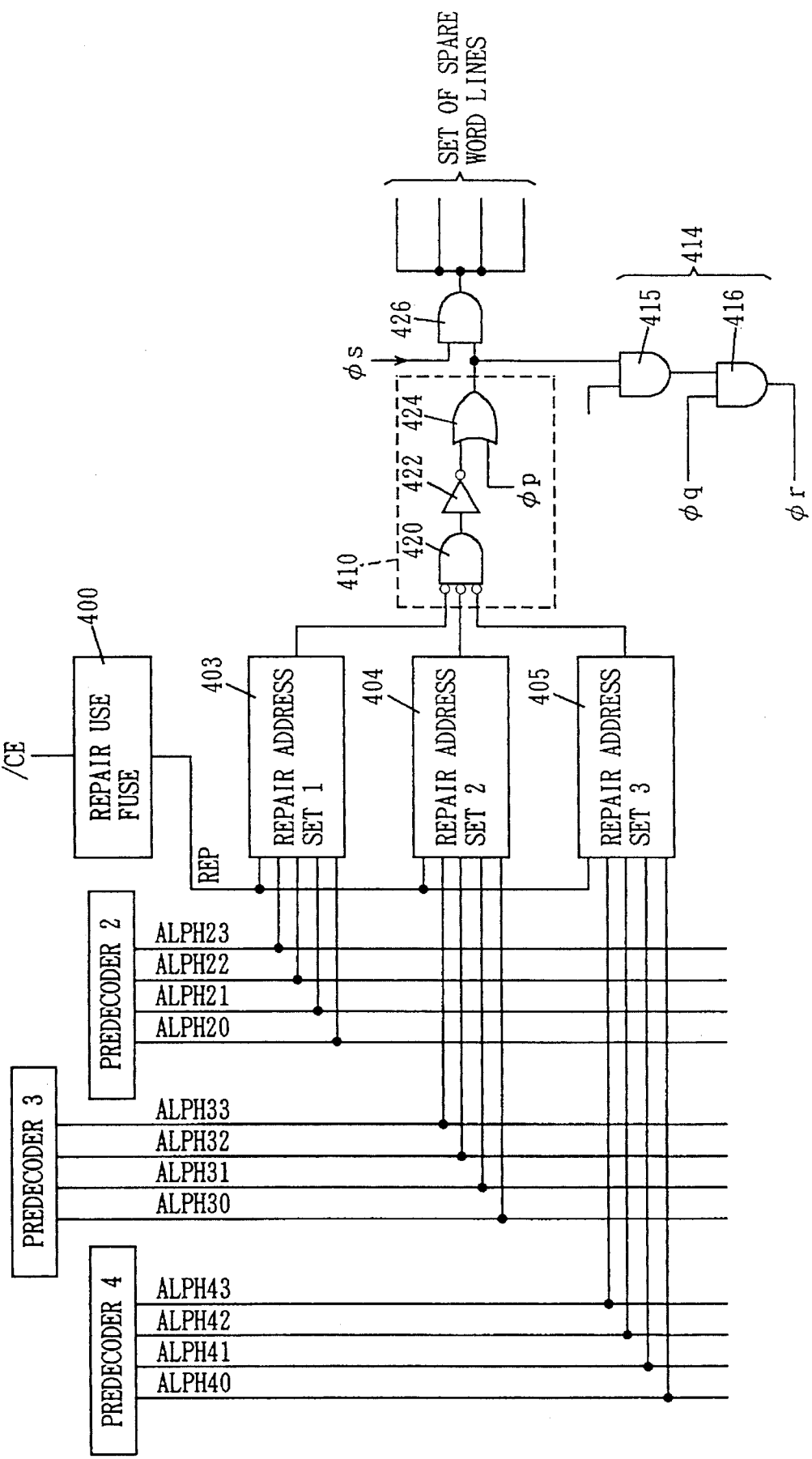
FIG. 26 shows a structure of portions of a repair address circuit portion, a spare driving circuit and a redundant control circuit shown in FIG. 25.

FIG. 26 shows a specific structure of the spare driving circuit. FIG. 26 shows only one spare driving circuit 410 together with a related repair address setting circuit.

Referring to FIG. 26, spare driving circuit 410 includes a 3-input NOR gate 420 receiving outputs from corresponding repair address setting circuits 403, 404 and 405, an inverter circuit 422 for inverting an output from NOR gate 420, and an OR gate 424 receiving an output from inverter circuit 422 and a redundancy inactivating signal φp. Redundancy inactivating signal φp is set to "H" when the programming before erasure is to be carried out on a normal word line. The signal φq is set to "L" only when the programming before erasure is to be effected on a spare word line. Therefore, programming before erasure can be carried out affecting neither the spare word line nor the normal word line. At the output of spare driving circuit 410, a 2-input NAND gate 426 is provided, which receives a selection spare programming before erasure signal φa and an output from spare driving circuit 410. The selection spare programming before erasure signal φs serves as the outputs from repair address setting circuits 403 to 405 in programming before erasure. The selection spare programming before erasure signal φs attains to "L" only for the selected set of spare word lines (only in programming before erasure). Otherwise, the selection spare programming before erasure signal φs is kept at "H".

Figure 27:
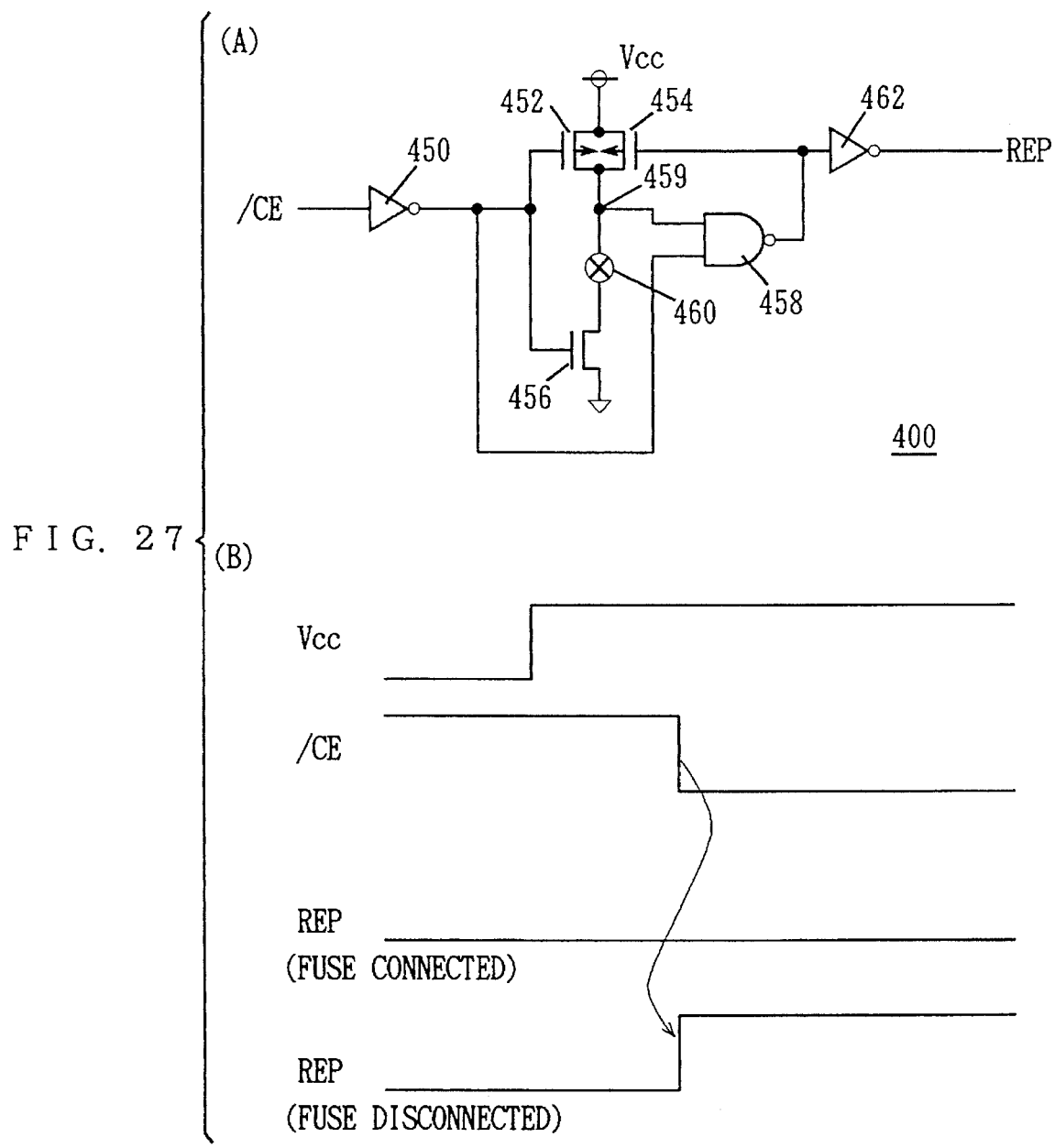
FIG. 27 shows a structure and operational waveforms of repair use fuse circuit shown in FIG. 26.

FIG. 27 shows the structure of the repair use fuse circuit and operation waveforms thereof. Referring to FIG. 27(A), the repair use fuse circuit 400 includes an inverter circuit 450 for inverting a chip enable signal /CE, a p channel MOS transistor 452 receiving at its gate an output from inverter circuit 450, a p channel MOS transistor 454 provided parallel to p channel MOS transistor 452, an n channel MOS transistor 546 receiving at its gate an output from inverter circuit 450, a fuse element 460 provided between the drain of MOS transistor 456 and an internal node 459, a 2-input NAND gate 458 receiving a potential at node 459 and an output from inverter circuit 450, and an inverter circuit 462 inverting an output from NAND gate 458.

The output from NAND gate 458 is applied to the gate of p channel MOS transistor 454. A repair use designation signal REP is generated from inverter circuit 452. When rendered conductive, p channel MOS transistors 452 and 454 transmit the supply potential Vcc to internal node 459. The operation will be described with reference to the waveforms of FIG. 27(B).

First, power is turned on. When chip enable signal /CE is at "H", p channel MOS transistor 452 is rendered conductive, while n channel MOS transistor 456 is rendered non-conductive, in accordance with the output from inverter circuit 450. At this state, the output from NAND gate 458 is at "H" regardless of disconnection/connection of fuse element 460, and repair use designating signal REP is at "L".

When the nonvolatile semiconductor memory device is to be set to the operative state, chip enable signal /CE attains to "L". At this state, the output from inverter circuit 450 rises to "H", transistor 456 is rendered conductive, and transistor 452 is rendered non-conductive. When fuse element 460 is connected, internal node 459 is discharged to the ground potential level through transistor 456, one input of NAND gate 458 attains to "L", and the output thereof attains to "H". Consequently, the signal REP from inverter circuit 462 will be "L".

When fuse element 460 is disconnected, internal node 459 holds the potential which has been charged by transistor 452 by that time, and in response to the fall of the signal /CE, the output from NAND gate 458 falls to "L". In response, the output signal REP from inverter circuit 452 attains to "H". Transistor 454 is rendered conductive and maintains the potential at internal node 459 at "H", which corresponds to the level of the supply potential Vcc.

Figure 28:
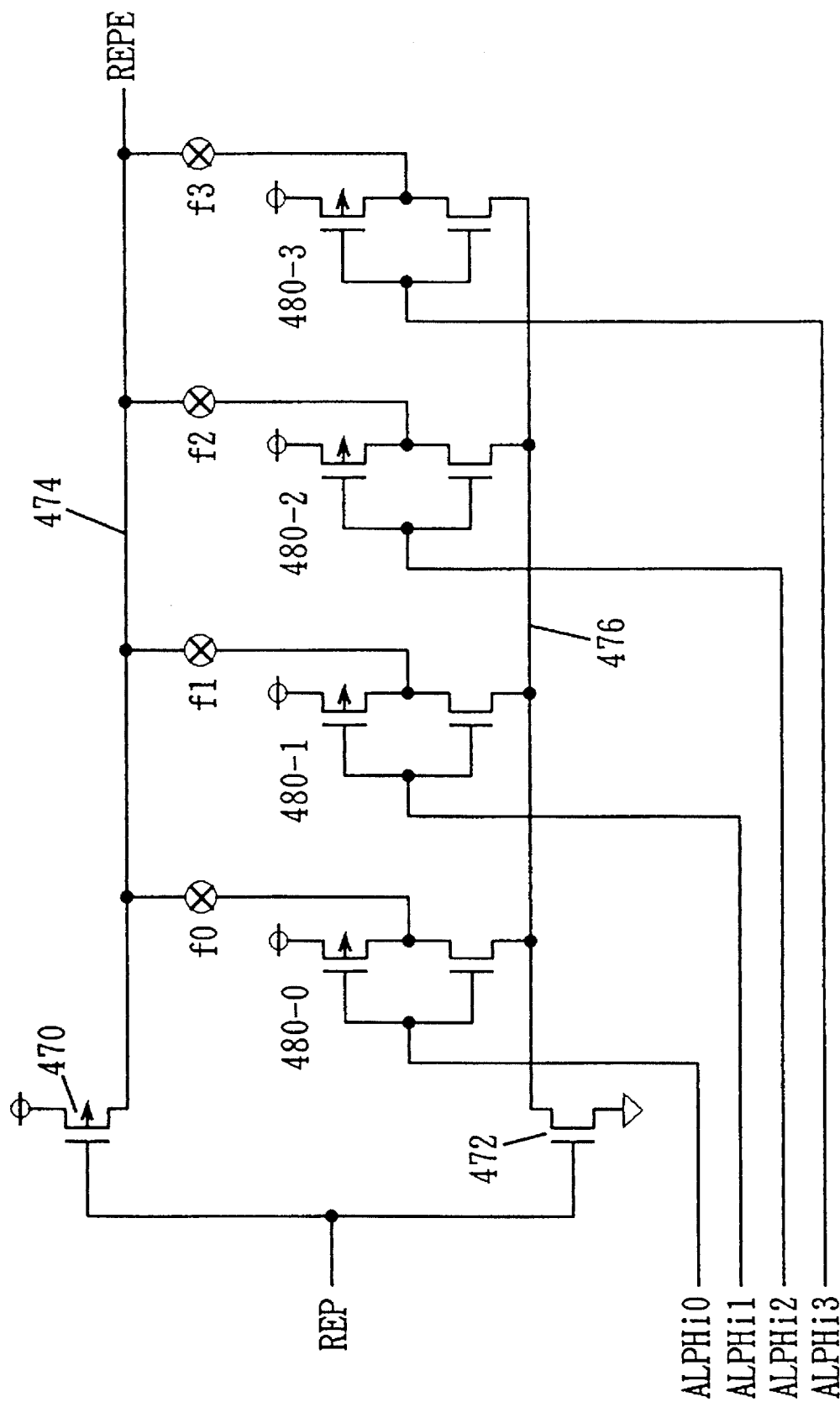
FIG. 28 shows a specific structure of a repair address setting circuit shown in FIG. 26.

FIG. 28 shows a specific example of the repair address setting circuit. Referring to FIG. 28, the repair address setting circuit (403, 404, 405) includes a p channel MOS transistor 470 responsive to the signal REP for charging output signal line 474 to the level of the supply potential Vcc, an n channel MOS transistor 472 responsive to the signal REP for discharging the signal line 476 to the level of the ground potential, CMOS inverter circuits 480-0 to 480-3 provided in parallel with each other, and fuse elements f0 to f3 provided between respective outputs of CMOS inverter circuits 480-0 to 480-3 and the signal line 474. CMOS inverter circuits 480-0 to 480-3 are provided in parallel to each other between the signal line 486 and a node supplying the supply potential Vcc. Predecoder output signal lines ALPHi0 to ALPHi3 are respectively connected to the gates of CMOS inverter circuits 480-0 to 480-3. Predecoder output signal lines are set to "H" when they are selected. The operation will be described.

When the signal REP is at "L", it means that the defective word line is not replaced. In that case, the output signal line 474 is charged to the level of the supply potential Vcc through transistor 470. At this state, transistor 472 is non-conductive, and output nodes of CMOS inverter circuits 480-0 to 480-3 are charged to the "H" level in response to power on. This is because the signal lines ALPHi0 to ALPHi3 are all at the "L" state which corresponds to the non-selected state at the time of initialization. Therefore, in this state, even when any of the signal lines ALPHi0 to ALPHi3 is selected, what is done is merely conduction of a corresponding n channel MOS transistor and charging of the signal line 476 which has been at the floating state, and the output signal REP is maintained at "H".

When an address of a defective word line is set, fuse elements other than the fuse element which corresponds to the predecoder output signal line corresponding to the defective word line are disconnected. Assume that fuse elements f1 to f3 are disconnected, while fuse element f0 is kept connected. The signal REP rises to "H" in response to the fall of the chip enable signal /CE. Transistor 470 is rendered non-conductive, and the signal line 474 is set to the floating state at "H". Meanwhile, the signal line 476 is discharged to the ground potential level by means of transistor 472.

When the signal line ALPHi0 is set to the selected state and its potential rises to "H", the n channel MOS transistor in CMOS inverter circuit 480-0 is rendered conductive, the signal line 474 is discharged to the ground potential level, and the signal REP attains to "L". Therefore, when three repair address setting circuits 403, 404 and 405 have their outputs all attain to "L" in the structure shown in FIG. 26, a signal of "L" for setting a set of word lines to the selected state is provided from the spare driving circuit.

When an address of a defective word line is to be programmed, in the first embodiment of the present invention, a gray code is allotted to the word line address. In this case, when the external address is applied as a normal address (in binary notation), the word line address in gray code can be easily handled by assuming that the fuse elements f2 and f3 are replaced by each other, so that in programming the address of the defective word line, programming of an erroneous address can be prevented.

Figure 29:
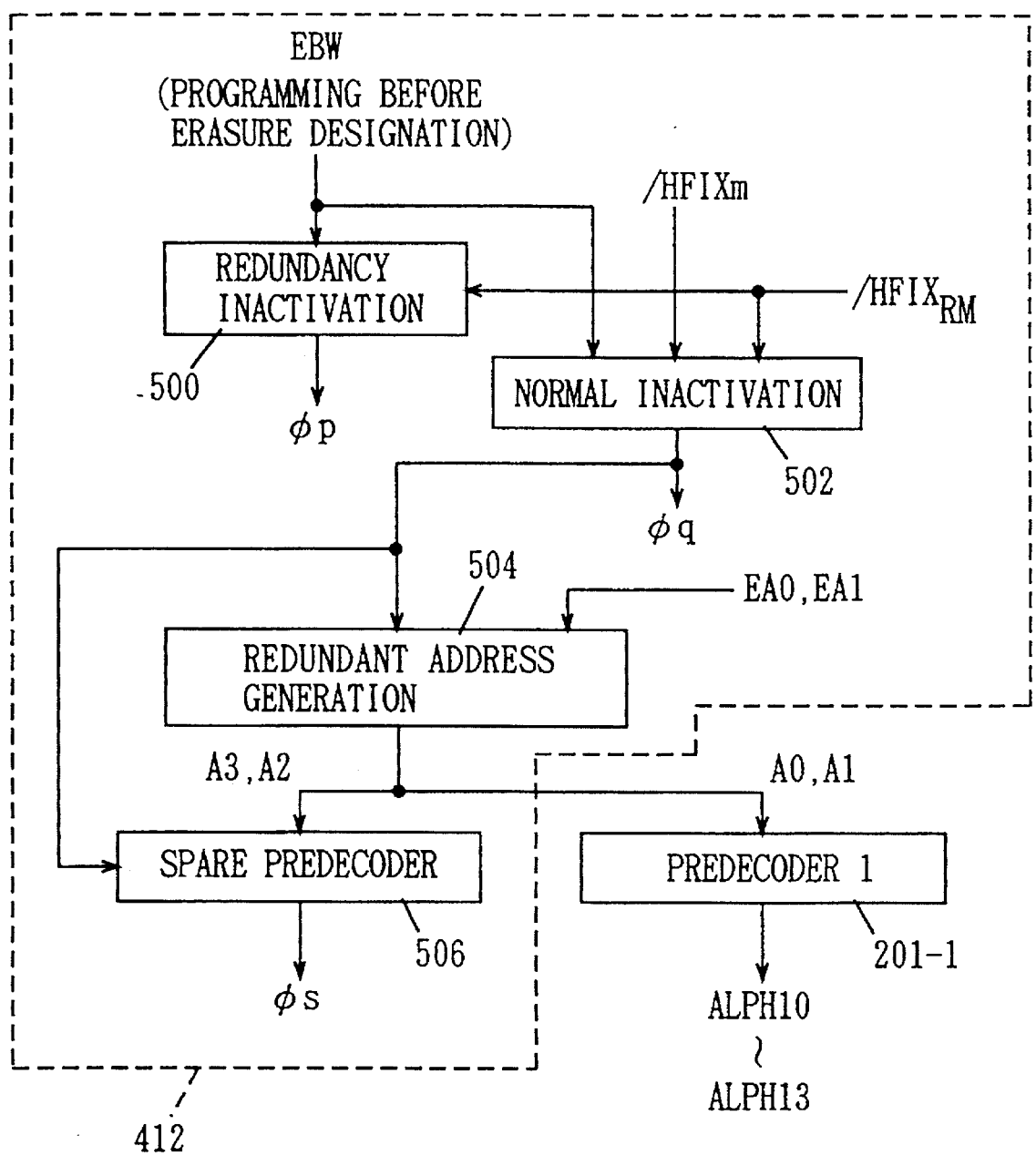
FIG. 29 is a block diagram showing a structure of a redundancy control circuit shown in FIG. 25.

FIG. 29 is a block diagram showing the structure of the redundant control circuit shown in FIG. 25. Referring to FIG. 29, redundant control circuit 412 includes a redundant inactivating circuit 500 responsive to programming before erasure designating signal EBW for setting a redundancy inactivating signal $\phi p$ to "H" during programming before erasure, and a normal inactivating circuit 502 responsive to the programming before erasure designation EBW and to control signals /HFIXm and /HFIX$_{RM}$ for generating a signal $\phi q$ for inhibiting normal word line selecting operation.

The signal /HFIXm is a control signal for fixing the most significant address bit INTAXmax to "H", which is generated in selecting a normal word line in programming before erasure. The signal /HFIX$_{RM}$ is a signal for fixing to "H" generated for the most significant bit of the address generated when a spare word line is selected in programming before erasure. When spare word lines are to be successively selected in programming before erasure operation, the signal $\phi q$ attains to "L" rendering the signal $\phi r$ to "L" for that period, and thus inhibiting the normal word line selecting operation.

Redundant control circuit 412 further includes a redundant address generating circuit 504 for generating a signal allowing simultaneous selection of a plurality of spare word lines in programming before erasure, and a spare predecoder 506 predecoding an address from redundant address generating circuit 504 for generating a selection spare programming before erasure signal $\phi s$. When there are two sets of (eight) spare word lines, a total of 4 (A0 to A3) address bits are necessary. The redundant address generating circuit has a similar structure as those shown in FIGS. 7, 15 and 16, except for the number of address bits generated therefrom. When the predecoder 201-1 is adapted to be shared by normal word lines and spare word lines, redundant address generating circuit 504 selectively passes an external address EXTAX and an internal address INTAX for selecting spare word lines.

Figure 30:
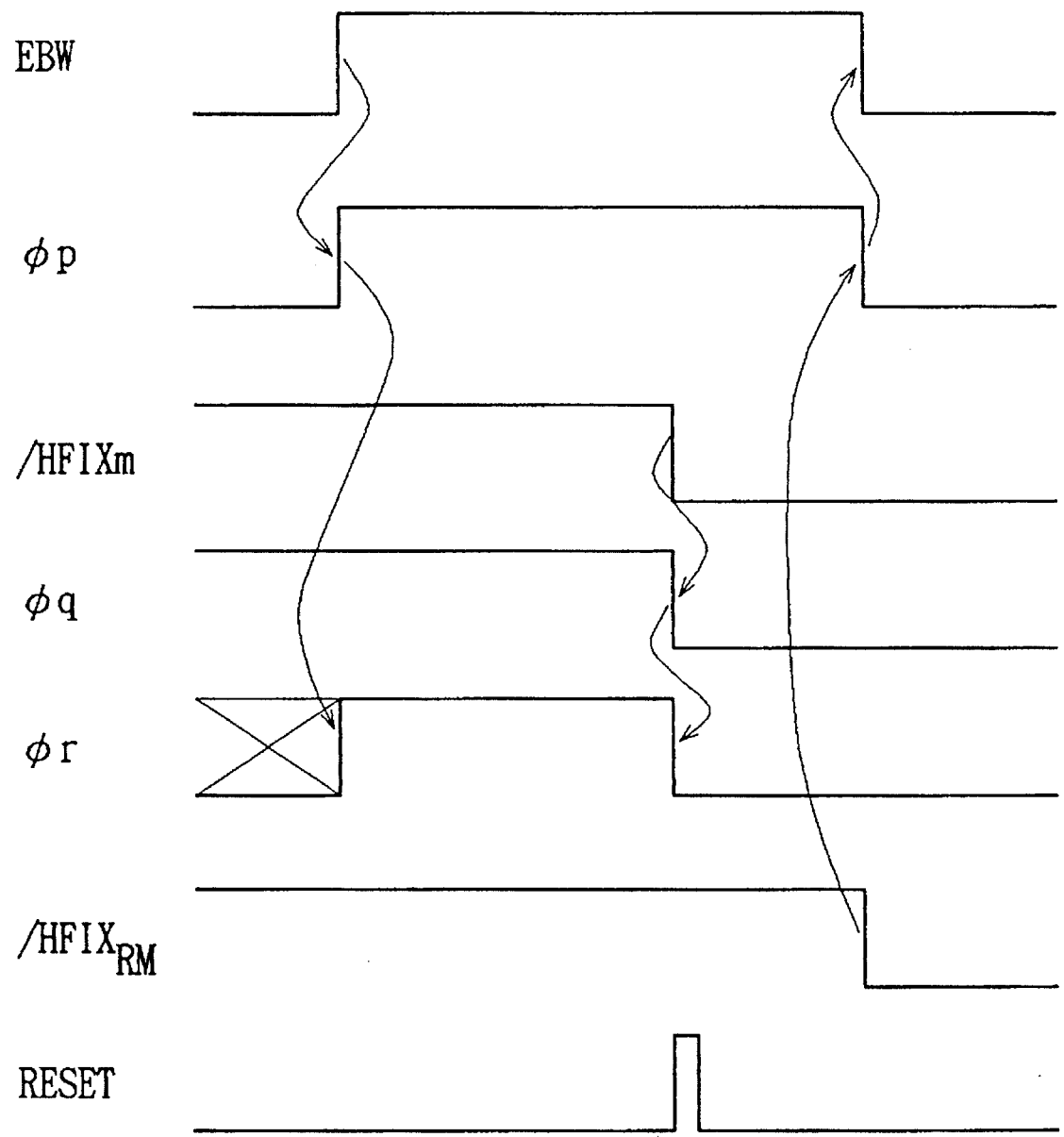
FIG. 30 is a diagram of signal waveforms showing an operation of the redundancy control circuit shown in FIG. 29.

Redundant address generating circuit 504 is activated when the control signal $\phi q$ is at "L" and generates 4 bits of addresses A0 to A3 so as to simultaneously select adjacent two spare word lines. Spare predecoder 506 is activated in response to the control signal $\phi q$, decodes address bits A2 and A3 and generates a signal $\phi s$ for selecting a set of spare word lines. Operations of redundant address generating circuit 504, spare predecoder 506 and predecoder 201-1 are the same as those described above. In this case, a structure in which redundant address generating circuit 504 is also used as a circuit for generating an address for simultaneously selecting normal word lines in the programming before erasure may be employed. The operation will be described with reference to FIG. 30, which is a diagram of operation waveforms.

When programming before erasure designation EBW rises to "H", programming before erasure is designated. In response, the redundancy inactivating signal φp rises to "H", and outputs from spare driving circuit 410 are all fixed at "H". At this time, the redundancy programming before erasure signal φq is still at "H", while the signal φr rises to "H". Thus, programming before erasure is effected on normal word lines. When programming before erasure of normal word lines is completed, the control signal /HFIXm falls to "L". In response, the redundancy programming before erasure signal φq falls to "L", thereby inhibiting normal word line selecting operation.

Thereafter, redundant address generating circuit 504 is driven and it generates addresses for simultaneously selecting a plurality of spare word lines. Spare predecoder 506 predecodes 2 bits of addresses A2 and A3 from the redundant address generating circuit 504 and generates a signal φs for setting the corresponding set of spare word lines to the selected state. When the programming before erasure of the spare word lines is completed, the control signal /HFIX$_{RM}$ generated in this programming before erasure falls to "L". Consequently, the signal φp falls to "L" and, in addition, the programming before erasure designation EBW falls to "L". Thus programming before erasure of the spare word lines and normal lines is completed.

Here, the reset signal RESET is generated at the time of programming before erasure of the spare word lines, in order to initialize the output of redundant address generating circuit 504.

Though the structure of the row decoder for the spare word lines is not shown, it has the same structure as shown in FIG. 15.

In the structure shown in FIG. 29, redundant inactivating circuit 500 and normal inactivating circuit 502 are shown included in redundant control circuit 412. However, this may be included in control circuit 130 shown in FIG. 1.

Though two neighboring word lines are selected simultaneously in the above described embodiment, the same effect can be obtained in a structure in which four, eight or any plurality of word lines are simultaneously selected. Such structure can be readily implemented by setting 2 bits of adjacent address bits are set to both selected state.

By the above described structure, spare word lines and normal word lines both can be surely programmed before erasure. Since a plurality of adjacent word lines are programmed before erasure simultaneously, it becomes possible to surely carry out programming before erasure even if there are short-circuited word lines, so that over erasure can be prevented at the time of erasure, defective word lines can be repaired by using redundant word line structure, and therefore production yield of the nonvolatile semiconductor memory device can be improved.

In this structure of embodiment 1, the area of row decoder is not increased at all, and the structure of the predecoder is the same as that of the prior art. Therefore, programming before erasure can be surely carried out easily on both the redundant (spare) word lines and the normal word lines, without changing the conventional device structure.

[Embodiment 2]

As for the addresses allotted to respective word lines, adjacent addresses have the Hamming distance of 1, as shown in FIG. 5, and the word line address can be regarded as "gray code" address. In the following description, the "gray code" address is referred to as "logical address", and the numerals allotted to respective word lines will be referred to as "physical addresses". For example, logical address (0011) is equivalent to a physical address (0010), both of which designate word line WL2 (see FIG. 5).

FIG. 31 shows, in a table, correspondence between gray codes and binary codes. As can be seen from FIG. 31, 0 and 1 in decimal notation can be represented by 1 bit by either binary code or gray code. Decimal numbers 0 to 3 can be represented by 2 bits. Decimal numbers 0 to 7 can be represented by 3 bits, and decimal numbers in the range from 0 to 15 can be represented by using 4 bits.

Physically adjacent two word lines mean word lines of which physical addresses are next to each other, that is, word lines to which adjacent numbers in decimal notation are allotted as addresses. Both binary code and gray code can represent a binary number by using the same number of bits. Therefore, as disclosed in pages 8 and 9 of *DIGITAL KAIRO NO KISO*, Saito et al., TOKAI DAIGAKU SHUPPAN KAI, the binary code and the gray code, that is, the physical address and the logical address, can be mutually converted. The method of conversion will be described.

Conversion from the binary code to the gray code, that is, from the physical address to the logical address is represented by the following equation (1)

$$g_i=b_i(+)b_{i+1} \quad (1)$$

$g_i$: ith bit of gray code $b_i$: ith bit of binary code (+) represents ring sum, and therefore it holds 0 (+) 0 =1 (+) 1=0, 0 (+) 1=1 (+) 0=1

0 (+) P=P, P (+) P=0

Conversion from the gray code to the binary code, that is, from the logical address to the physical address can be represented by the following equations (2) and (3).

$$b_i=g_{n-1}(+)g_{n-2}(+)g_{n-3}(+)\ldots(+)g_{i+1} \quad (2)$$

$$b_{n-1}=g_{n-i}$$

From equation (2), $$b_{i+1}=g_{n-1}(+)g_{n-2}(+)g_{n-2}(+)g_{n-3}(+)\ldots(+)g_{i+1} \quad (2')$$

From equations (2) and (2'), $$b_i=b_{i+1}(+)g_i \quad (3)$$

A method of simultaneously selecting adjacent two words lines when a logical address is applied will be described. Now, assume that the logical address applied is $$G=(G_9G_8\ldots G_0).$$

This logical address G is converted to a physical address A, where physical address A is $$A=(A_9A_8\ldots A_0).$$

By applying the equation (3) above, the following equation (4) can be obtained.

$$A_i = A_{i+1} (+) G_i; i = 0 \ldots 9$$
$$A_{10} = 0 \qquad (4)$$

An address obtained by adding 1 to the physical address A represents the address of a physically adjacent word line. The address of the physically adjacent word line is represented as $$a = (a_9 a_8 \ldots a_0)$$

The address a of the adjacent word line can be represented by the following equations (5) and (6).

$$a_i = A_i (+) C_{i-1}; i = 0 \ldots 9 \qquad (5)$$

$$C_i = A_i \cdot C_{i-1}; i = 0 \ldots 9 \qquad (6)$$

$$C_{-1} = 1$$

Where $C_i$ represents a carry of ith bit. The address a of the adjacent word line is represented by binary code. The address a of the adjacent word line is converted to a gray code address g by using the above equation (1), where $$g = (g_9 g_8 \ldots g_0).$$

$$g_i = a_i (+) a_{i+1}; i = 0 \ldots 9$$
$$a_{10} = 0 \qquad (7)$$

The logical address G and the logical address g select physically adjacent word lines. Since logical addresses G and g are represented in the gray code, these values differ from each other by only 1 bit. By setting address bits having different values to both selected state, it is possible to select simultaneously a word line corresponding to the logical address G and a word line adjacent thereto. The address bit Bi which should be set to the both selected state is given by the following equation (8).

$$B_i = g_i (+) G_i = 1 \qquad (8)$$

Figure 32:
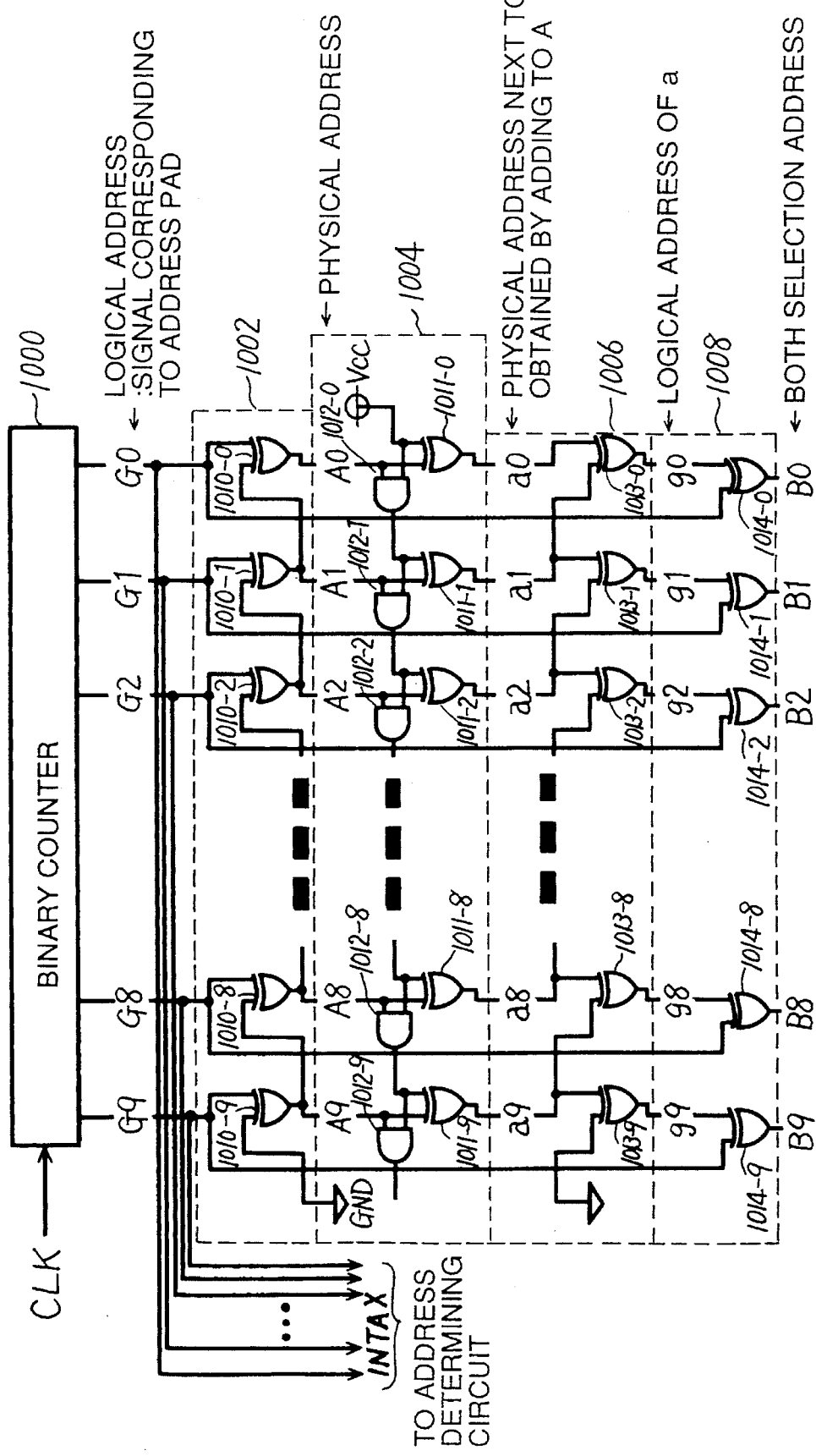
FIG. 32 shows a structure of an address generating circuit in accordance with a second embodiment of the present invention.

FIG. 32 shows a structure of the address control circuit in the second embodiment. Referring to FIG. 32, the address control circuit includes a binary counter 1000 for successively incrementing the count value in response to a binary clock signal CLK, a first address code converting circuit 1002 for converting a counted value from binary counter 1000 to a physical address by regarding the count value as logical address G0 to G9, an adder circuit 1004 for adding 1 to the physical address A0 to A9 generated from the first address code converting circuit, a second address code converting circuit 1006 for converting adjacent physical address a0 to a9 generated by adder circuit 1004 to gray code address, that is, logical address, and a both selection bit determining circuit 1008 for determining address bits which are to be set to the both selecting state, from the logical address g0 to g9 generated from the second address code converting circuit 1006 and the logical address G0 to g9 from the binary counter 1000.

First address code converting circuit 1002 includes 2-input ExOR circuits 1010-0 to 1010-9 provided for output bits G0 to G9 of binary counter 1000, respectively. ExOR circuits 1010-0 to 1010-8 each receive at one input the corresponding address bits G0 to G8, and at the other input, an output from the 1 bit upper ExOR circuits. The ExOR circuit 1010-9 of the most significant bit receives the address bit G9 from the binary counter 1000, and at the other input, the ground potential GND. The ground potential GND corresponds to the logic "0". The first address converting circuit 1002 realizes the above equation (4). Ring sum operation (+) is implemented by the ExOR circuits.

Adder circuit 1004 includes ExOR circuits 1011-0 to 1011-9 and AND circuits 1012-0 to 1012-9 provided for the address bits A0 to A9 from the first address code converting circuit 1002, respectively. Adder circuit 1004 realizes an operation of adding 1 to the address A0 to A9 output from the first address code converting circuit 1002. ExOR circuits 1011-1 to 1011-9 each receive at its one input corresponding address bits A0 to A9, respectively, and at the other input, an output from 1 bit lower AND circuit.

ExOR circuit 1011-0 receives at its input an address bit A0 from the first address code converting circuit, and at the other input, a signal at the level of the supply potential Vcc. The signal at the level of the supply potential Vcc corresponds to logic "1".

AND circuits 1012-1 to 1012-9 each receive at one input corresponding address bits A1 to A9, respectively, and at the other input, an output from the 1 bit lower AND circuit. AND circuit 1012-0 receives at its one input the address bit A0, and at the other input, a signal at the level of the supply potential Vcc. Adder circuit 1004 realizes operations of the equations (5) and (6). ExOR circuits 1011-0 to 1011-9 realize the above equation (5), while AND circuit 1012-0 to 1012-9 realizes the above equation (6).

Second address code converting circuit 1006 includes 2-input ExOPR circuits 1013-0 to 1013-9 provided for address bits a0 to a9 output from adder circuit 1004, respectively. ExOR circuits 1013-0 to 1013-9 each receive at its one input the corresponding address bits a0 to a9, respectively, and at the other input, the output address bit of 1 bit upper output of the upper circuit 1004. The most significant ExOR circuit 1003-9 receives at its one input a signal at the level of the ground potential GND. The second address code converting circuit 1006 realizes the above equation (7).

Both selection address bit determining circuit 1008 includes 2-input ExOR circuits 1014-0 to 1014-9 provided for output bits g0 to g9 from the second address code converting circuit 1006 and for bits G0 to G9 output from binary counter 1000, respectively. ExOR circuits 1014-0 to 1014-9 receive corresponding address bits g0 to g9 and G0 to G9. The both selection address bit determining circuit 1008 realizes the above equation (8). Logic addresses of adjacent word lines have values different from each other only by 1 bit. Therefore, a signal Bj (j=any of 0 to 9) which corresponds to the address bit having different value attains to "H", and other signals all attain to "L". Outputs B0 to B9 from both selection address bit determining circuits 1008 are used as both selected state determining signals. Address bits G0 to G9 from binary counter 1000 are applied to the address determining circuit, and a specific bit is set to the both selected state by both selection addresses B0 to B9, and is applied to the predecoder. The operation will be described.

Binary counter 1000 successively increments the count value thereof in accordance with the clock signal CLK. The clock signal CLK determines one cycle of word line selection as shown in FIG. 23(B). In one cycle period of the clock signal CLK, bit lines are set to the selected state successively or simultaneously. The count value generated from binary counter 1000 is regarded as gray codes G0 to G9 for matching with an externally applied address signal. In the structure shown in FIG. 32, the address bits of the word line includes 10 bits. In this example, 1024 word lines are provided. For simplicity of description, let us consider 4 bits of address signals, as shown in FIG. 31.

When the output value from binary counter 1000 is (0000), it is converted to a binary code (0000) by the first address code converting circuit 1002. Thereafter, a binary code (0001) is generated by adder circuit 1004. Thereafter, by the second address code converting circuit 1006, the binary code (0001) is converted to a gray code (0001). In this case, only the least significant bit of B0 attains to the high level as the both selection address signal.

If the output from binary counter 1000 assumes (0001) in the next clock cycle, a gray code address (0010) is generated from the second address code converting circuit 1006 in the similar manner, and the both selection address bit B1 attains to the high level.

In the next clock cycle, the output from binary counter 1000 is incremented by one to (0010). The gray code (0010) thereof corresponds to decimal number of 3. In this state, a bit (0011) is generated by the first address code converting circuit 1002, and (0100) is output from adder circuit 1004. The gray code address (0110) is generated. Bit B2 attains to the high level by both selection address bit determining circuit 1008, so that word lines WL3 and WL4 are simultaneously selected.

Thereafter, when the output of binary counter 1000 is incremented by one, the count value attains (0011). This corresponds to a decimal number of 2. By the similar procedure, gray code addresses (0011) and (0010), that is, word lines WL2 and WL3 are set to the selected state simultaneously.

The above described series of operations are repeated until the count value of binary counter 1000 reaches the maximum value. The order of word line selected is not always the ascending order of the physical address thereof. For example, when the count value of binary counter 1000 is (1011) designating the word line WL2, the count value of the binary counter 1000 will be (0100) the next time, and therefore the word line WL7 is selected. After the selection of word line WL7, word line WL6 is selected. Though the order of selection of the word line is not constant, by the time the count value of the binary counter 1000 reaches the maximum value, all the addresses represented by the gray code have been already designated. Therefore, in the count cycle up to the maximum value of the binary counter 1000, all sets of adjacent two word lines can be set to the simultaneously selected state.

Figure 33:
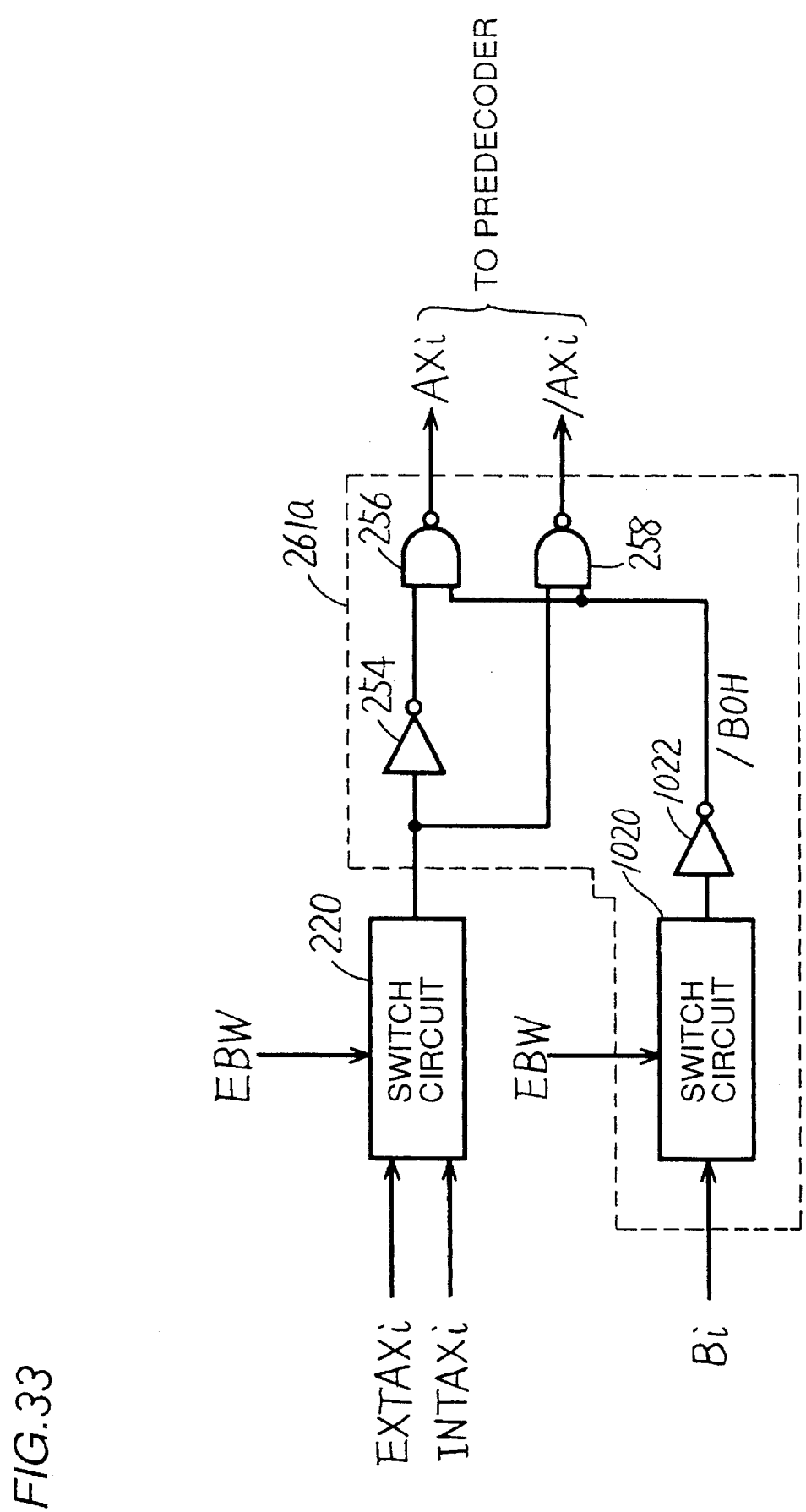
FIG. 33 shows a structure of an address determining circuit used together with the address generating circuit shown in FIG. 32.

FIG. 33 shows the structure of the address determining circuit. The address determining circuit 261*a* shown in FIG. 33 corresponds to the address determining circuit 261*a* shown in FIG. 7. Referring to FIG. 33, address determining circuit 261*a* includes a switching circuit 1020 responsive to the programming before erasure designating signal EBW for passing the both selected address bit Bi, an inverter circuit 1002 for inverting an output from switching circuit 1020, an inverter circuit 254 for inverting an address signal bit applied from a switching circuit 220, a 2-input NAND circuit 256 receiving an output from inverter circuit 254 and an output (/BOH) of inverter circuit 1022, and a 2-input NAND circuit 258 receiving an output from switching circuit 220 and an output (/BOH) of inverter circuit 1022. An internal address signal bit AXi is generated from NAND circuit 256, and a complementary internal address signal bit /AXi is generated from NAND circuit 258. Both selection designating signal /BOH is generated from inverter circuit 1022.

Switching circuit 1020 is constituted, for example, by using an AND circuit, when the programming before erasure designating signal EBW is set to the high level for designating programming before erasure. In the programming before erasure operation, switching circuit 1020 passes the both selection address bit Bi. If the programming before erasure designating signal EBW does not designate programming before erasure and at the low level, switching circuit 1020 provides a signal at "L".

Switching circuit 2220 has the same structure and function as the switching circuit 220 shown in FIG. 7. When the programming before erasure designating signal EBW is at the active state designating programming before erasure, switching circuit 220 selects address signal bits G0 to G9 from binary counter 1000 shown in FIG. 32 and applies these bits to address determining circuit 261*a*. If programming before erasure designating signal EBW is inactive, not designating programming before erasure, an address signal bit (a signal applied to an address pad) EXTAXi is selected and applied to address determining circuit 261*a*. The output of address determining circuit 261*a* is applied to the predecoder for selecting the word line, which has been described above. The operation will be described briefly.

When the programming before erasure designating signal EBW is inactive, switching circuit 220 selects the external address signal bit EXTAXi and applies the same to address determining circuit 261*a*. When the programming before erasure designating signal EBW is inactive, switching circuit 1020 outputs a signal of "L". Therefore, the both selection signal /BOH output from inverter circuit 1022 is at "H", and therefore NAND circuits 256 and 258 operate as an inverter. At this state, one of the internal address signals AXi and /AXi is "H", and the other is "L", in accordance with the address signal bit applied from switching circuit 220.

When the programming before erasure designating signal EBW is activated, switching circuit 220 selects an internal address signal bit INTAXi and applies the same to address determining circuit 261*a*. Switching circuit 1020 selects the both selection address signal bit Bi and applies this bit to inverter circuit 1022. When both selection address signal bit Bi is at "L", both selection signal /BOH output from inverter circuit 1022 is at "H", and only one of address signal bits AXi and /AXi attains to "H".

When both selection address signal bit Bi is at "H", both selection signal /BOH attains to "L", and internal address signal bits AXi and /AXi generated from NAND circuits 256 and 258 both attain to "H". Therefore, the internal address signal bit INTAXi is set to the both selected state. Thus the state shown in FIG. 2 is realized, and two adjacent word lines are simultaneously set to the selected state. Assume that an address (A3A2A1A0)=(0010) is generated as an internal address INTAX in the structure shown in FIGS. 4 and 5. In that case, address bit A2 is set to the both selected state, and an address (0110) is also set to the selected state. Therefore, in the structure shown in FIG. 4, output signals lines ALPH20 and ALPH21 are simultaneously set to the selected state by means of predecoder 201-2. Since remaining upper 4 bits (A7A6A5A4) are (0000), NAND gates NA11 and NA12 are selected in the structure shown in FIG. 4.

Meanwhile, in predecoder 201-1 shown in FIG. 5, (A1A0)=(10) is selected, so that the output signal line ALPH13 is set to the selected state. Consequently, word lines WL3 and WL4 are simultaneously set to the selected state. Consequently, even those word lines which are connected to different NAND circuits can be set to the selected state simultaneously, provided that these word lines are adjacent to each other.

Figure 34:
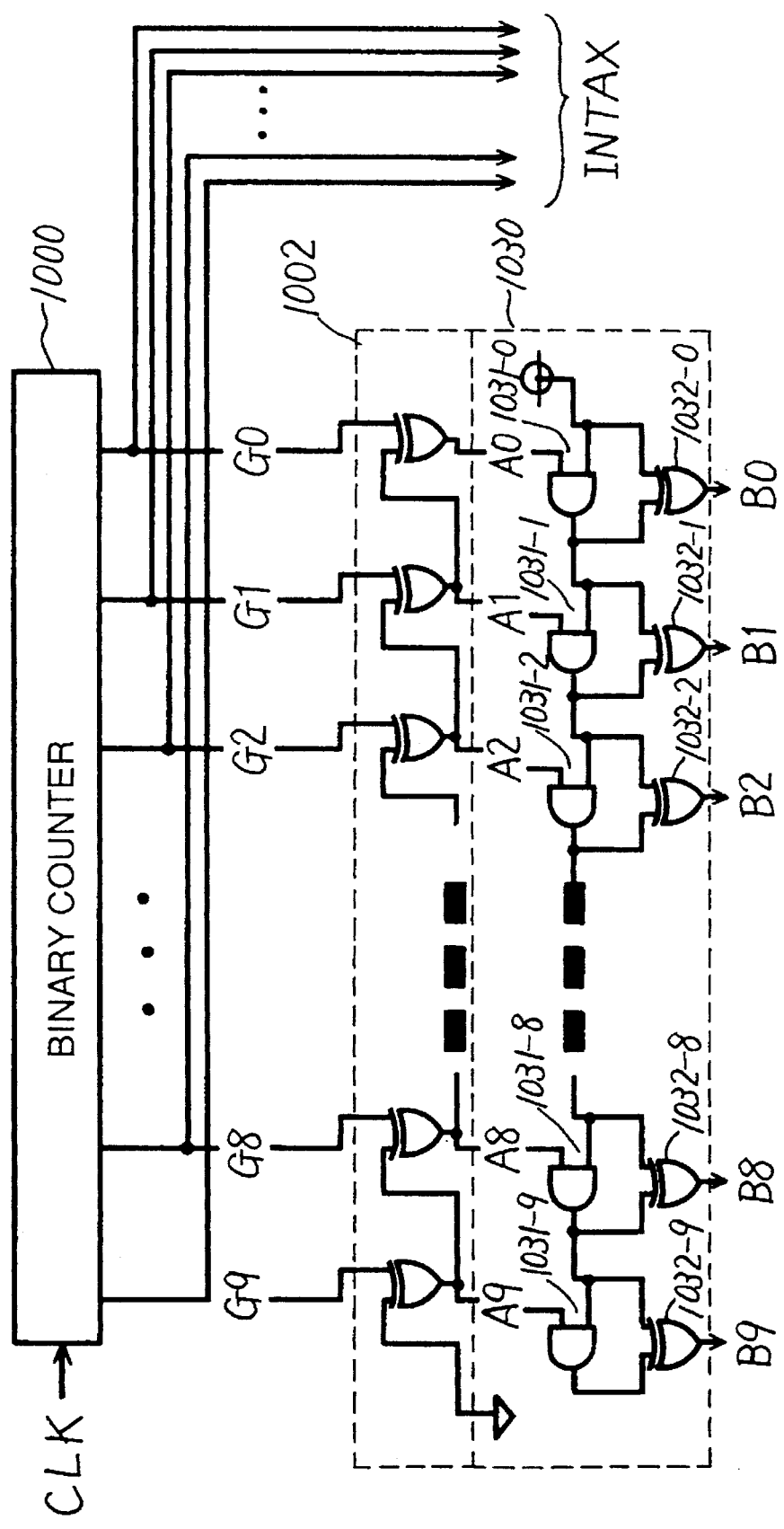
FIG. 34 shows a modification of the address generating circuit shown in FIG. 32.

FIG. 34 shows another structure of the address generating circuit. Referring to FIG. 34, address generating circuit includes a binary counter 1000, a first address code converting circuit 1002 for converting count values G0 to G9 of the binary counter to a binary code by regarding these values as gray codes, and a both selection signal generating circuit 1030 for generating both selection address signals B0 to B9 from address signals A0 to A9 output from the first address code converting circuit 1002. Both selection address signal generating circuit 1030 includes 2-input AND circuits 1031-0 to 1031-9 provided for output bits A0 to A9 of the first address code converting circuit 1002, respectively, and 2-input ExOR circuits 1032-0 to 1032-9 provided for AND circuits 1031-0 to 1031-9, respectively. AND circuits 1031-0 to 1031-9 receive at one inputs the corresponding output bits A0 to A9 of the first address code converting circuit 1002, and receive outputs from respective 1 bit lower NAND circuits at the other inputs. AND circuit 10031-0 receives an output bit A0 at its one input, and receives a signal at the level of the supply potential Vcc at its the other input. The signal at the level of the supply potential Vcc level corresponds to logic "1".

ExOR circuits 1032-1 to 1032-9 receive at one inputs, outputs from AND circuits 1031-1 to 1031-9, respectively, and receive at the other inputs the outputs from 1 bit lower AND circuits 1031-0 to 1031-8, respectively. ExOR circuit 1032-0 receives an output from AND circuit 1031-0 at one input, and receives a signal at the level of the supply potential, which corresponds to the logic "1", at the other input. The principal of operation of the circuit shown in FIG. 34 will be described.

Gi is added to both sides of the above described equation (4) (ring sum operation) and this provides the following equation (9).

$$A_i (+) G_i = A_{i+1} (+) G_i (+) G_i = A_{i+1} (+) 0 \quad (9)$$
$$= A_{i+1}; i = 0 \ldots 9$$

In equation (5), by substituting a suffix i+1 for the suffix i, the following equation (10) can be obtained.

$$a_{i+1} = A_{+1}(+)G_i(+)i=0 \ldots 9 \quad (10)$$

By substituting the equation (9) for the equation (10), the following equation (11) can be obtained.

$$a_{i+1} = A_i(+)G_i(+)C_i \quad (11)$$

By substituting equations (5) and (10) for the first and second terms on the right side of equation (7), the following equation (12) can be obtained.

$$g_i = A_i (+) C_{i-1} (+) A_i (+) G_i (+) C_i \quad (12)$$
$$= C_{i-1} (+) G_i (+) C_i$$
$$\therefore g_i (+) G_i = C_{i-1} (+) C_i$$

The equation (12) is derived by utilizing the relation that X (+) Y=Y (+) X and X (+) X=0.

Accordingly, from equations (8) and (12), the following equation (13) can be obtained.

$$B_i = C_{i-1}(+)C_i \quad (13)$$

More specifically, both selection address signal bit Bi can be obtained by a ring sum of the corresponding carry and one bit lower carry. The carry Ci is obtained from a logical product of the corresponding address bits and 1 bit lower carry, in accordance with the equation (6).

In other words, in both selection address signal generating circuit 1030 shown in FIG. 34, AND circuits 1031-0 to 1031-9 generate carries as does the AND circuit in adder circuit 1004 shown in FIG. 32. ExOR circuits 1032-0 to 1032-9 realize the operation of the above equation (13).

When the address signal generating circuit shown in FIG. 34 is used, the circuit configuration can be significantly simplified, and an address signal generating circuit can be implemented with small area of occupation. Address signal bits G0 to G9 generated from binary counter 1000 are applied as internal address signals INTAX to the address determining circuit. This is the same as the structure described with reference to FIGS. 32 and 33.

By using the address signal generating circuit such as described above, it becomes possible to set a plurality of physically adjacent word lines (two word lines) to the selected state in programming before erasure, by a simple circuit structure using a normal binary counter. If the count value of the binary counter 100 is counted up for 1 cycle starting from the minimum counted value to the maximum counted value, it means that all the sets of physically adjacent plurality of word lines have been selected, which enables programming before erasure at high speed.

[Embodiment 3]

Figure 35:
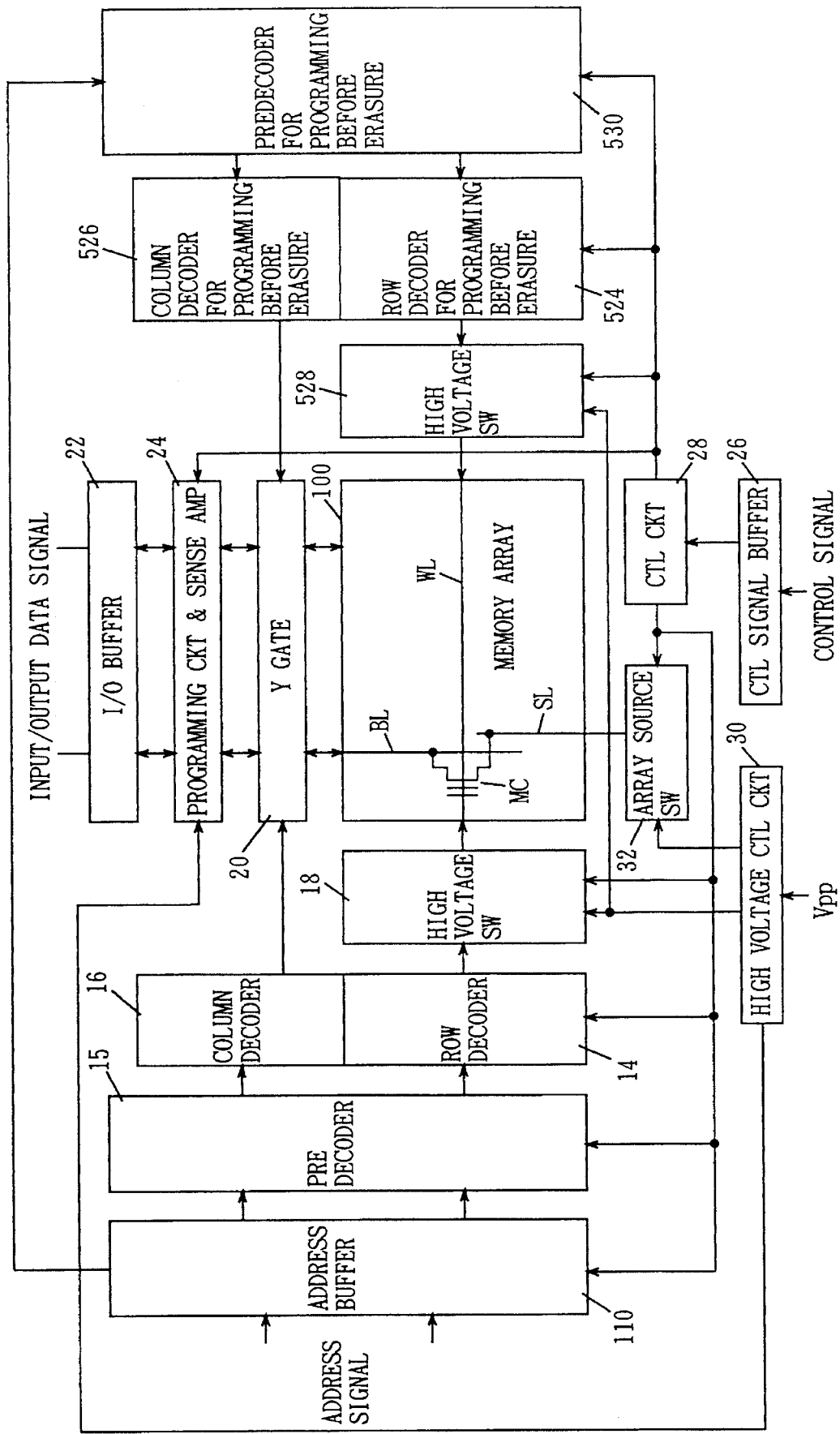
FIG. 35 shows a whole structure of the nonvolatile semiconductor memory device in accordance with the third embodiment of the present invention.

FIG. 35 shows the whole structure of a nonvolatile semiconductor memory device in accordance with the third embodiment of the present invention. Referring to FIG. 35, in addition to the conventional structure, the nonvolatile semiconductor memory device in accordance with the third embodiment of the present invention includes a row decoder 524 for programming before erasure which operates only in the programming before erasure, a column decoder 526 for programming before erasure, a high voltage switch 528 and a predecoder 530 for programming before erasure. Different from the conventional nonvolatile semiconductor memory device shown in FIG. 49, a predecoder 15 is shown in addition to row decoder 14 and column decoder 16, at the decoder portion.

Row decoder 524 for programming before erasure does not include a spare row decoder but has a similar structure shown in Embodiment 1 above (for selecting all word lines including spare word lines), and predecoder 530 for programming before erasure has the same structure as that shown in Embodiment 1 above. In FIG. 35, the internal address from address buffer 12 is shown to be applied to predecoder 530 for programming before erasure. This is to provide correspondence with the address buffer 110 having such a structure as shown in FIG. 1. A structure may be used in which a portion having address converting function is included in control circuit 28 and addresses for selecting a word line and the bit line may be generated from control circuit 28 only in programming before erasure.

In the structures of Embodiments 1 and 2, the Hamming distance between addresses of adjacent word lines is set to 1. In the third embodiment shown in FIG. 35, two separate decoder portions are provided for programming before erasure and for normal writing and reading, respectively. Therefore, at the time of external access, word line selection can be carried out regardless of the Hamming distance. In the structure shown in FIG. 35, in the row decoder for programming before erasure, a structure for inhibiting normal word line selecting operation at the time of selecting spare word line is not necessary. Therefore, an address for selecting a word line can be generated without this redundant control circuit in programming before erasure.

The predecode signal applied to column decoder 526 for programming before erasure is applied from predecoder 530 for programming before erasure. At this time, the column address for selecting a bit line in programming before erasure may be generated using a counter circuit.

Figure 36:
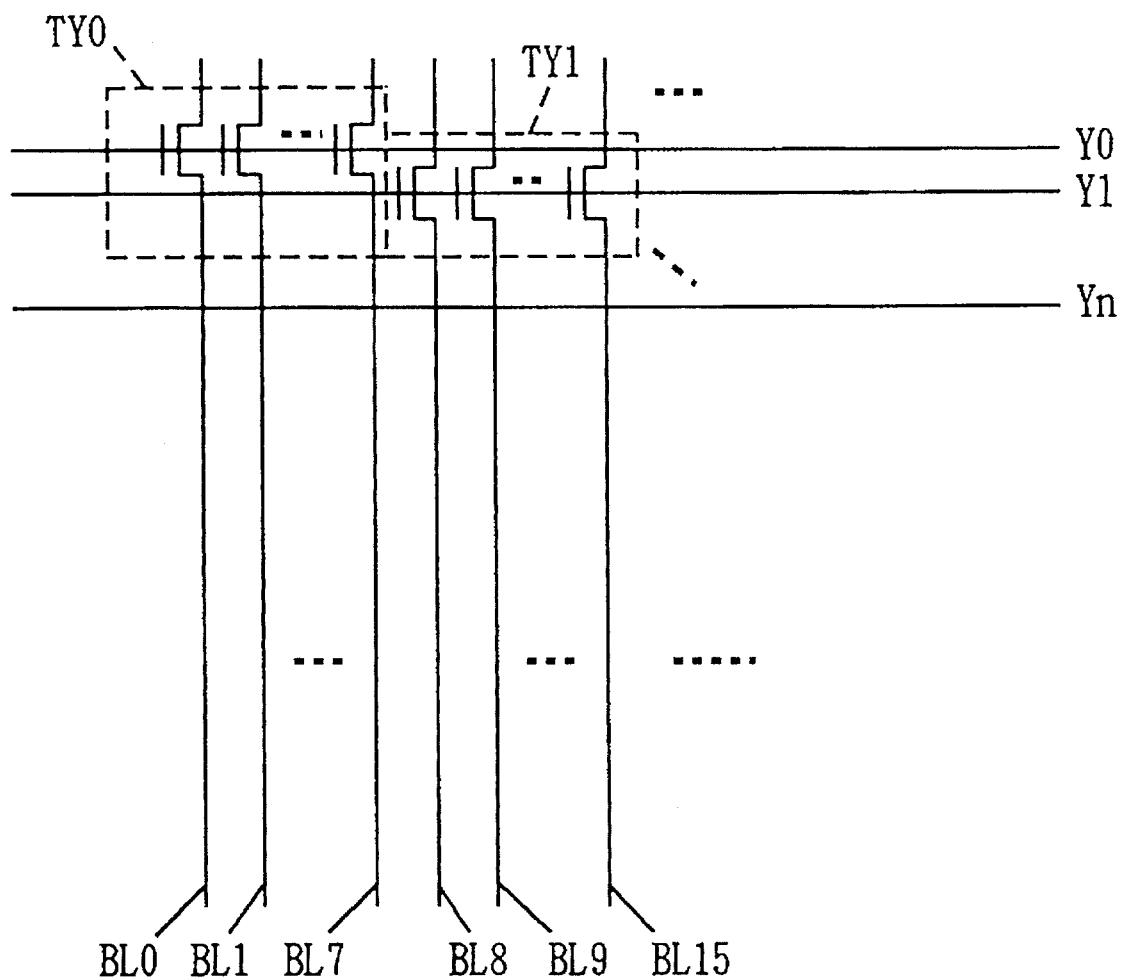
FIG. 36 shows a method of selecting a bit line in accordance with a third embodiment of the present invention.

For Y gate 20, a structure in which 1 byte of memory cells are selected simultaneously is used. This is because in a nonvolatile semiconductor memory device, data are input/ output byte by byte. In this case, normally, one column selecting signal line Yj is set to the selected state and a gate TYj for 1 byte is rendered conductive. In programming before erasure, it is not necessary to set only one column selecting signal line. A plurality of column selecting lines may be set to the selected state simultaneously. Therefore, a structure in which a plurality of column selecting signal lines Y are set to the selected state such as shown in FIG. 36 may be used for the column decoder 526 for programming before erasure shown in FIG. 35. This structure can be readily implemented by setting least significant column address bits CA0 and /CA0 both to selected state "H" (when two column selecting lines are to be simultaneously selected). More specifically, when a column selecting signal for programming before erasure is to be generated by a counter circuit, a structure in which the least significant bit of the output from the counter circuit is set to the invalidated state or both selected state (in which true and complementary bits are both at "H") should be used. A structure in which larger number of column selecting signal lines are set to the selected state may be employed.

In the nonvolatile semiconductor memory device in accordance with Embodiment 3, defective word lines can be programmed before erasure, and in addition, a plurality of column selecting signal lines can be set to the selected state simultaneously, whereby time necessary for programming before erasure can be significantly reduced. In programming before erasure, it is not necessary to take into account the structure for setting normal word line to non-selected state where a spare word line is to be selected, and therefore arbitrary word lines adjacent to each other can be simultaneously set to the selected state easily by a simple structure.

[Embodiment 4]

Figure 37:
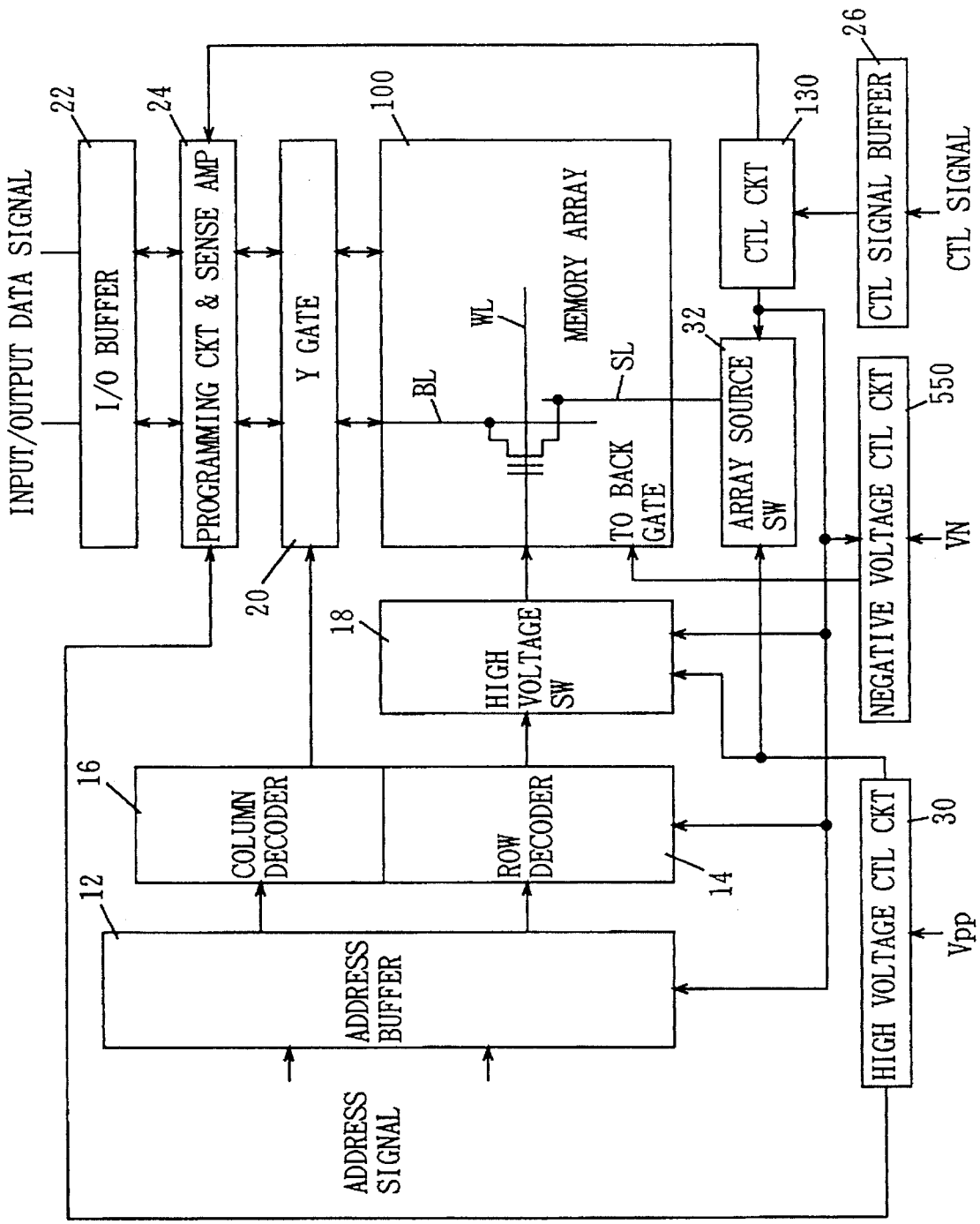
FIG. 37 shows a whole structure of a nonvolatile semiconductor memory device in accordance with a fourth embodiment of the present invention.

FIG. 37 shows a whole structure of a nonvolatile semiconductor memory device in accordance with a fourth embodiment of the present invention. The nonvolatile semiconductor memory device shown in FIG. 37 includes a negative voltage control circuit 550 which is activated under control of control circuit 130 for applying a negative voltage to a backgate of memory array 100 in accordance with a negative voltage VN at the time of programming before erasure. The structure for applying the negative voltage to the backgate of memory array 100 will be described with reference to FIG. 38.

Figure 38:
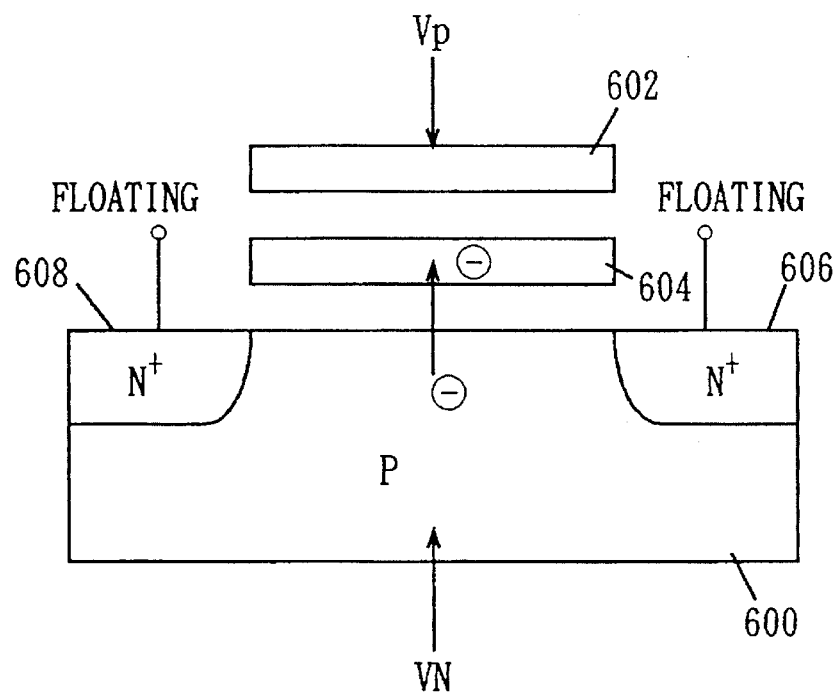
FIG. 38 is an illustration of programming before erasure in accordance with the fourth embodiment of the present invention.

Referring to FIG. 38, first, source region 606 and drain region 608 are both set to the floating state. Thereafter, a negative voltage VN is applied to a semiconductor substrate region (or a well region) 600, and a necessary voltage VT is applied to control gate 602. At this time, electrons are injected from substrate 600 to floating gate 604 by Fouhler-Nordheim tunneling current. By applying voltage VT to the control gate of every memory cell, all memory cells of memory array 100 can be programmed before erasure simultaneously. A method of flash programming is disclosed by Miyawaki et al., in IEEE, *Journal of Solid-State Circuits* Vol. 27, No. 4, April, 1992, pp. 583–587, for example. However, programming before collective erasure for spare word lines in order to repair defective rows are not taken into consideration at all in this article. A method of realizing such structure will be described in the following.

When erasure is designated, control circuit 130 sets all outputs from the row decoder to the selected state. High voltage switch 18 generates a voltage VP necessary for programming before erasure from a high voltage Vpp applied from high voltage control circuit 30. Negative voltage control circuit 550 applies an externally applied negative voltage VN to the substrate, in response to the programming before erasure designation from control circuit 130. Array source switch 32 sets all source lines SL to the floating state under control of control circuit 130. Column decoder 16 is not carrying out decoding operation, and Y gates 20 are all at the non-selected state. The voltage VP is applied to the control gates of all memory cells including spare memory cells in memory array 100, and the negative voltage VN is applied to the substrate. In every memory cell, electrons are injected from the substrate to the floating gate, and at the same time, programming before erasure is carried out. Thus programming before erasure is surely effected on memory cells which are connected to the defective word lines. A structure for setting all outputs from the row decoder to the selected state is shown in FIG. 39.

Figure 39:
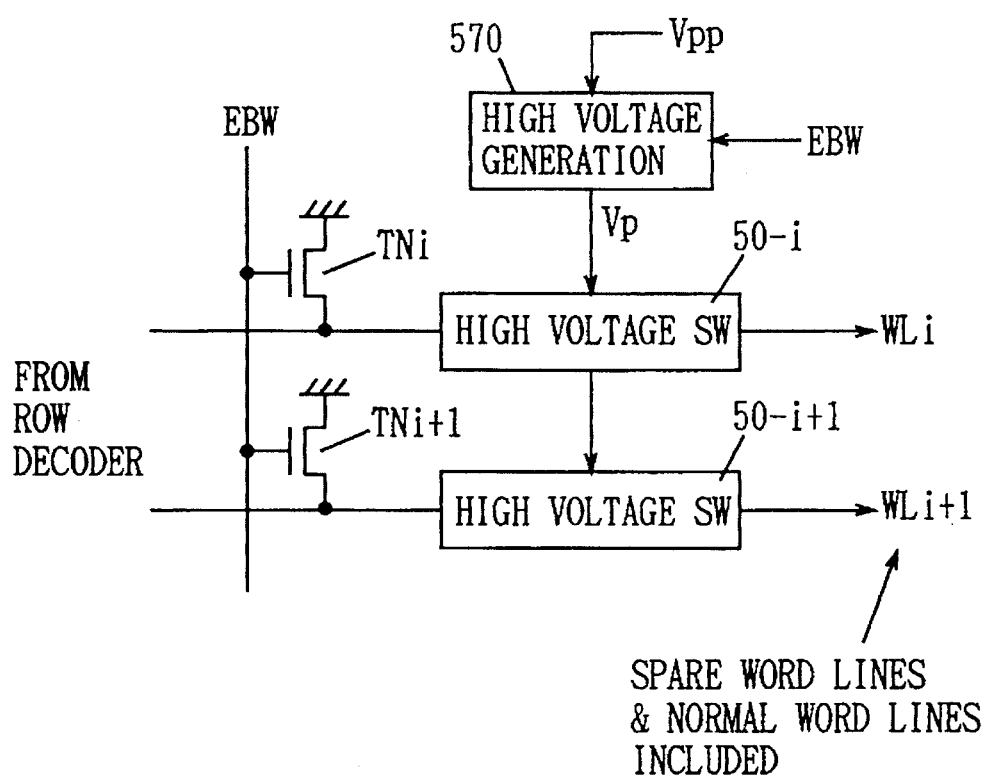
FIG. 39 shows a structure of a row decoder output portion in accordance with the fourth embodiment of the present invention.

In FIG. 39, only circuitry related to two word lines WLi and WLi+1 is shown. At input portions of high voltage switch circuits 50-i and 50-i+1, there are provided gate transistors TNi and TNi+1 which are rendered conductive in response to the programming before erasure designation signal EBW for transmitting the ground potential to the high voltage switch circuits 50-i and 50-i+1. High voltage generating circuit 570 generates the necessary voltage VP from the programming high voltage Vpp applied from high voltage control circuit 30 in response to the programming before erasure designation signal EBW, and transmits this voltage to high voltage switch circuits 50-i, . . . Any structure which can lower the programming high voltage Vpp may be used as the high voltage generating circuit 570, and it can be readily implemented by using a voltage dividing circuit. High voltage switch circuit 50-i has the same structure as in the prior art. This configuration enables simultaneous programming before erasure of spare word lines and normal word lines, even if the device has redundancy structure. It is not necessary to take into account the activation/inactivation of the spare decoder (for selecting spare word lines) and the normal row decoder (for selecting normal word lines), since what is necessary is simply to maintain both decoders at the inactive state. Consequently, all word lines including spare word lines and normal word lines can be simultaneously set to the selected state for effecting programming before erasure, so that the time necessary for programming before erasure can be significantly reduced, and the defective word lines can be repaired by utilizing the spare word lines.

As for the negative voltage VN, it is adapted to be externally applied to negative voltage control circuit 550. However, an on-chip negative voltage generating circuit may be used in the chip and the negative voltage internally generated may be applied to the backgate.

Alternatively, a structure may be used in which the ground potential (0 V) is applied to the backgate and in programming before erasure, a high voltage so high as to cause movement of electrons between the substrate and the floating gate may be generated and applied to the control gate (602: see FIG. 38). Alternatively, the potentials of all word lines may be set to 0 V and a sufficiently large negative voltage may be applied to the backgate. Since programming before erasure is carried out not by avalanche injection but by utilizing Fouhler-Nordheim tunneling current, current consumption is not so increased.

[Embodiment 5]

Figure 40:
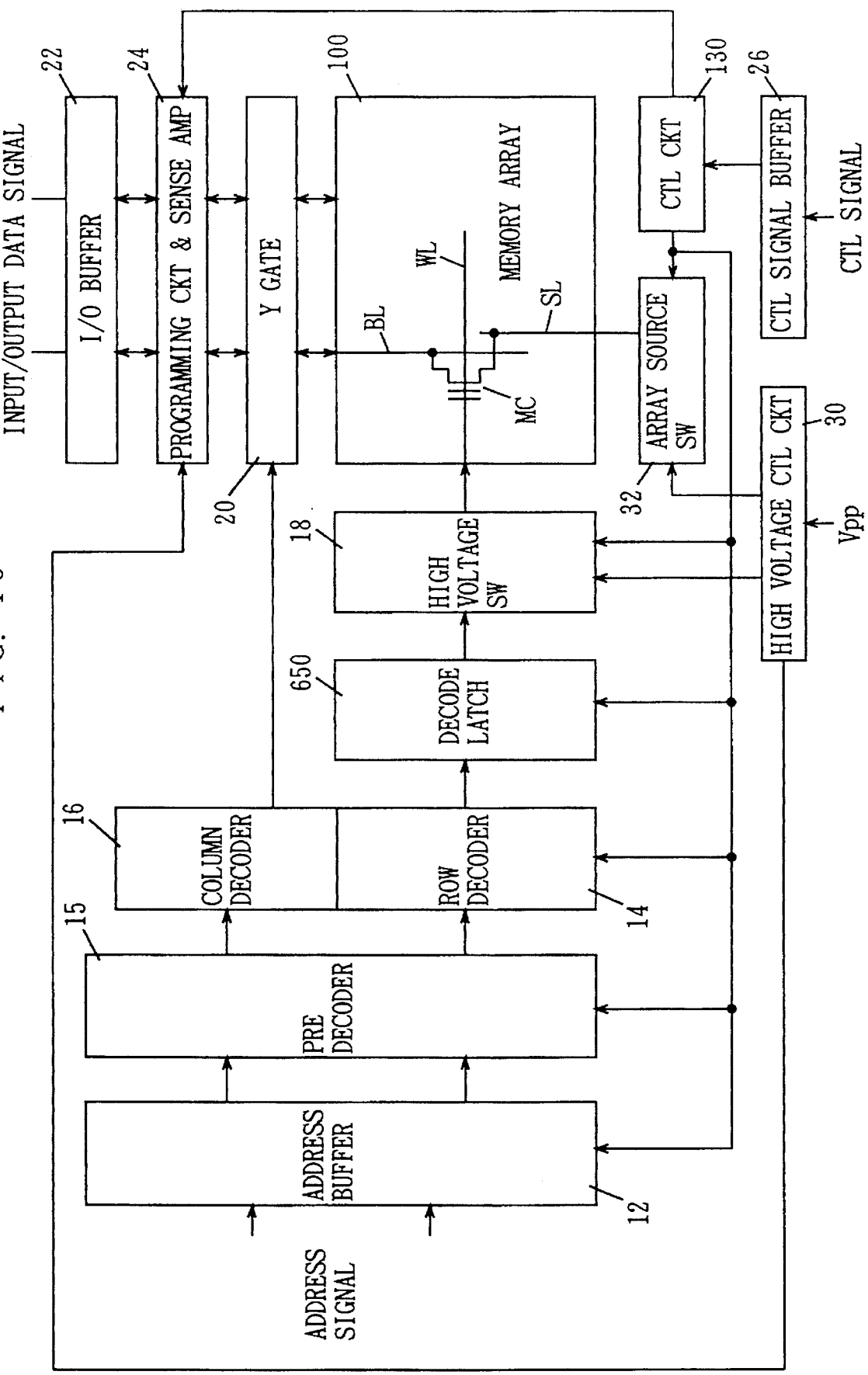
FIG. 40 shows a whole structure of a nonvolatile semiconductor memory device in accordance with the fifth embodiment of the present invention.

FIG. 40 shows a whole structure of a nonvolatile semiconductor memory device in accordance with a fifth embodiment of the present invention. Referring to FIG. 40, the nonvolatile semiconductor memory device includes a decode latch 650 provided between an output of row decoder 14 and a high voltage switch 18. Decode latch 650 is activated in response to the programming before erasure instruction from control circuit 130 and sets a plurality of adjacent word lines to the selected state simultaneously. Decode latch 650 is inactivated at the normal writing and reading (accesses in accordance with external addresses) and at verifying operation, and it passes the output from row decoder 14 to high voltage switch 18. In verifying operation, addresses for selecting a word line and a bit line are generated using an address counter. A clock signal for controlling the operation of the counter is applied to decode latch 650 at the time of programming before erasure. Decode latch 650 carries out shifting operation in response to the clock signal for defining the timing of counting operation, and simultaneously selects a set of a plurality of adjacent word lines successively. In a structure in which addresses are generated by using an address counter in the verifying operation, it is possible to simultaneously set a plurality of physically adjacent word lines to the selected state easily by using the clocks for the address counter. The clock signals may be generated from control circuit 130.

Figure 41:
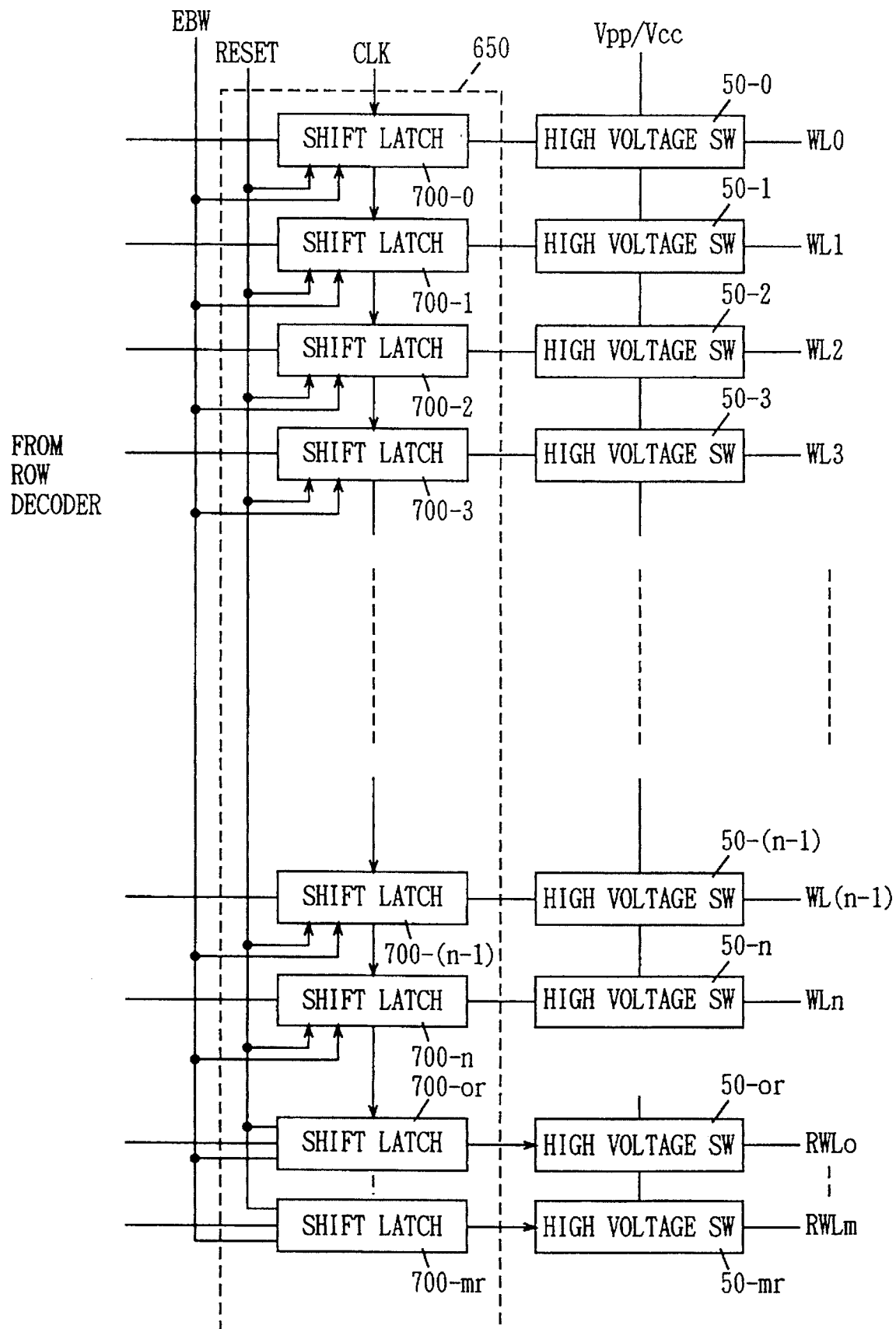
FIG. 41 is a block diagram showing a structure of a decode latch shown in FIG. 40.

FIG. 41 is a block diagram showing a structure of the decode latch. Referring to FIG. 41, high voltage switch circuits 50-0 to 50-n and 50-0r to 50-mr are provided for normal word lines WL0 to WLn and spare word lines RWL0 to RWLm, respectively.

Decode latch 650 includes shift latches 700-0 to 700-n and 700-0r to 700-mr, provided for the outputs of row decoders, respectively. Row decoders include both the normal and the spare (redundant) decoders. Shift latch 700-i has its initial value set by reset signal RESET, separates a row decoder output from high voltage switch circuit 50-i in response to a programming before erasure designation signal, and provides the initialized signal to the corresponding high voltage switch circuit 50-i in accordance with the clock signal CLK. Shift latch 700-i transmits the data latched therein to the shift latch 700-(i+1) of the next stage in response to the clock signal CLK. A plurality of (k) adjacent shift latches are initialized to be set to the selected state, in response to the reset signal RESET. Shift latch 700 (generally refers to the shift latches included in decode latch 650) provides the data latched therein to the adjacent shift latch in response to the clock signal CKL. If k adjacent word lines are to be selected simultaneously, clock signals CLK are generated continuously for (k−1) times. Since only (k−1) word lines in a set of adjacent word lines selected simultaneously are selected twice (in overlapped manner), all the sets of adjacent word lines can be set to the selected state simultaneously.

In the structure shown in FIG. 41, programming before erasure can be effected on the normal word lines and the spare word lines. When a normal word line and a spare word line are adjacent to each other, these neighboring spare word line and normal word line can be selected simultaneously. Therefore, programming before erasure can be surely effected on all the memory cells.

The clock signal CLK is generated for a prescribed number of times when selection of bit lines is completed at the time of programming before erasure. If an address counter is used for selecting bit lines, the clock signal CLK may be generated utilizing a count up signal of the counter.

Figure 42:
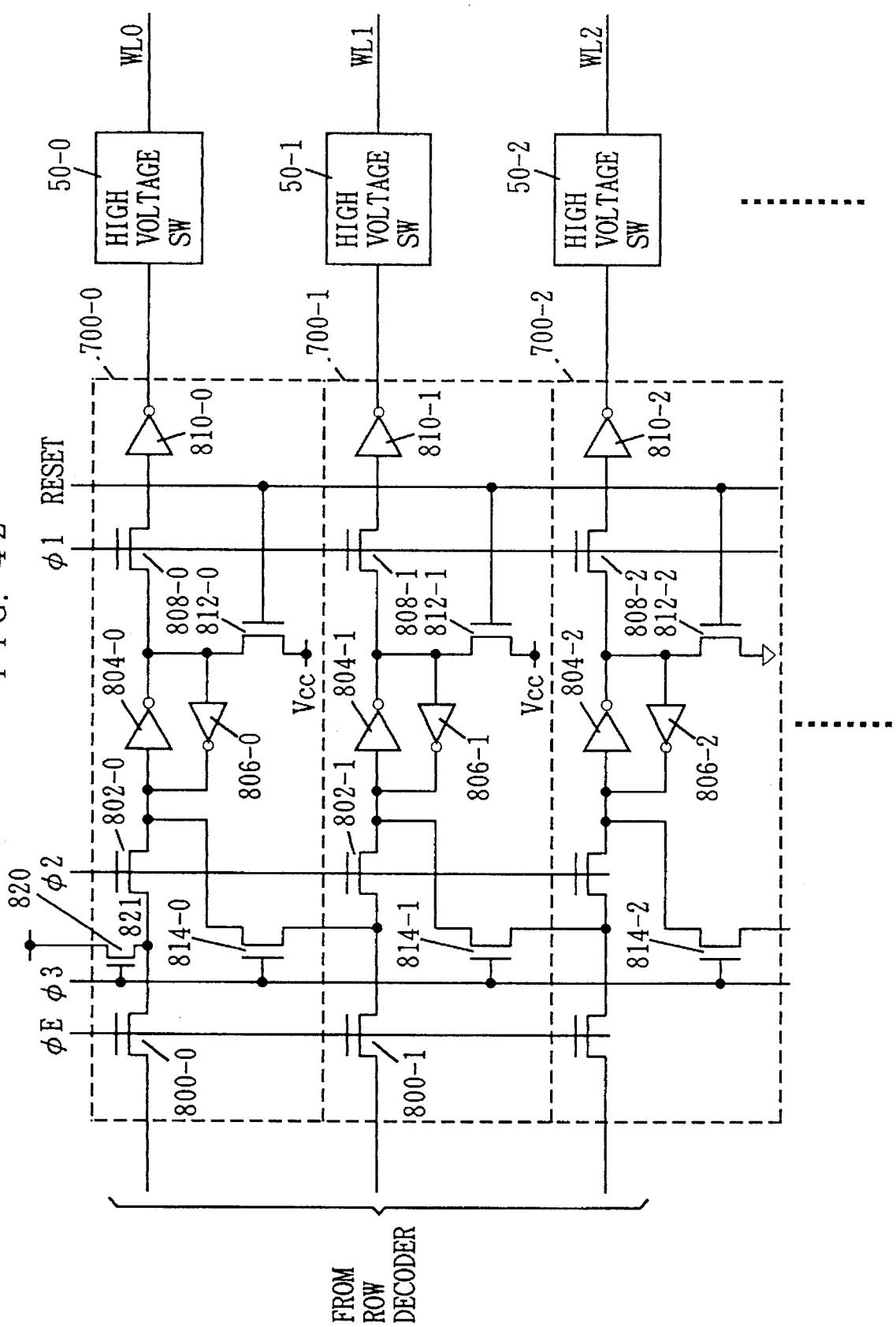
FIG. 42 shows a specific example of a shift latch shown in FIG. 41.

FIG. 42 shows a specific structure of the shift latch shown in FIG. 41. FIG. 42 shows a structures of shift latches for three word lines WL0 to WL2, and shift latches 700-0 to 700-2 have identical structures. Corresponding components are denoted by the same reference numerals and for distinguishing the shift latches from each other, a suffix is provided. In the following description, the suffix is omitted unless it is necessary.

Referring to FIG. 42, shift latch 700 includes a transfer gate 800 which is rendered non-conductive in response to the programming before erasure designating signal $\phi E$, a transfer gate 802 which is rendered conductive in response to a clock signal $\phi 2$, an inverter circuit 804 for inverting an output of transfer gate 802, and an inverter circuit 806 for inverting the output from inverter 804 and for providing the inverted output to the input of inverter circuit 804. The driving power of inverter circuit 806 is set relatively small. Therefore, the latching ability of the latch circuit constituted by inverter circuits 804 and 806 is made relatively small. This is in order to surely transmit the row decoder output when the row decoder operates. The shift latch 700-0 of the initial stage includes a transistor 820 which is rendered conductive in response to a clock signal $\phi 3$ for charging a node 821 to the level of the supply voltage Vcc.

Shift latch 700 further includes a transfer gate 808 passing an output from inverter circuit 804, an inverter circuit 810 for inverting and transmitting to high voltage switch circuit 50 the output from transfer gate 808, and a switch transistor 812 for initializing the output of shift latch 700 in response to the reset signal RESET.

Figure 43:
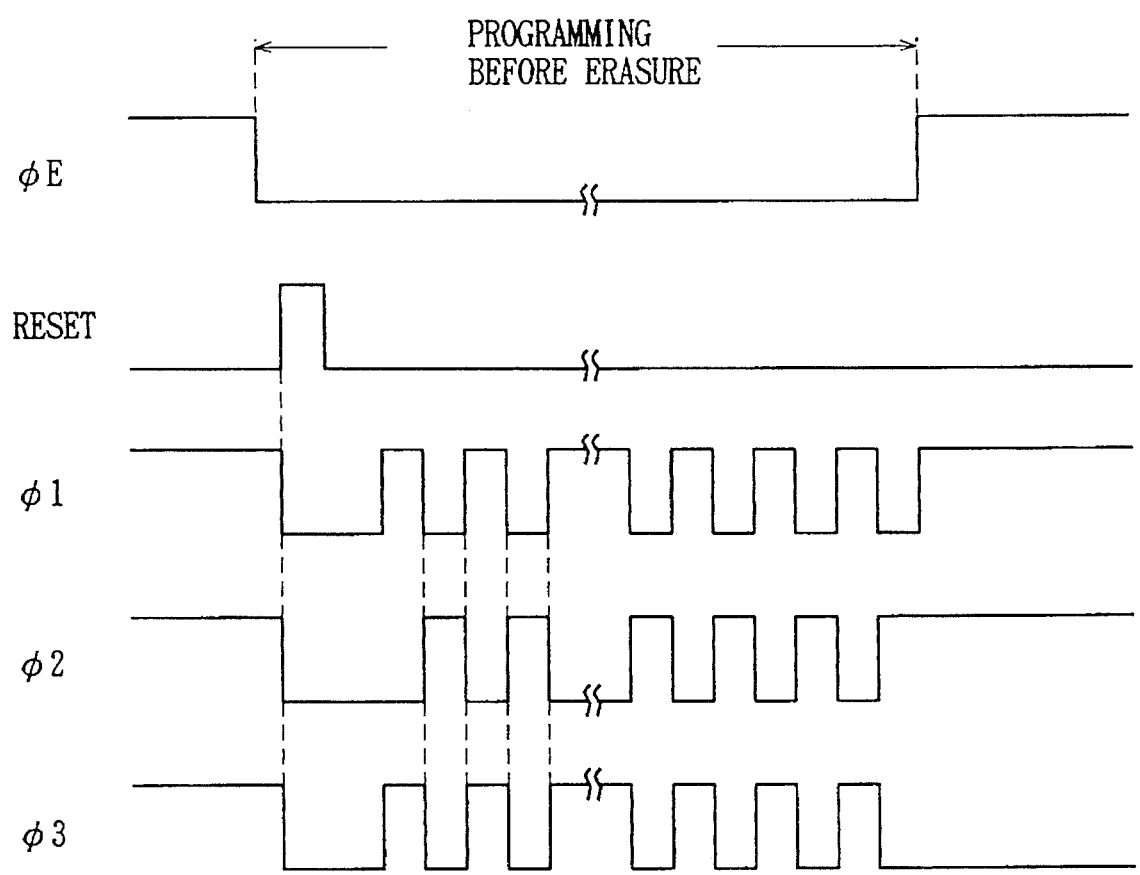
FIG. 43 is a diagram of signal waveforms showing the operation of the shift latch shown in FIG. 42.

FIG. 42 shows a structure in which two physically adjacent word lines are selected simultaneously. Therefore, switch transistors 812-0 and 812-1 set output from inverter circuits 804-0 and 804-1 to "H" which corresponds to the level of the supply voltage Vcc, in response to reset signal RESET. Switch transistor 812-2 for resetting sets the output from inverter circuit 804-2 to "L" which corresponds to the level of the ground potential, in response to the reset signal RESET. Shift latches 700-3, . . . on the downstream side have the same structure as shift latch 700-2, and the output of the corresponding inverter circuit 804 is initialized to "L" or the ground potential level, in response to the reset signal RESET. Clock signals $\phi 1$ and $\phi 3$ have the same phase at the time of programming before erasure. Clock signal $\phi 2$ has an inverted phase with respect to clock signals $\phi 1$ and $\phi 3$ at the time of programming before erasure. The operation will be described with reference to FIG. 43, which is a diagram of signal waveforms.

In programming before erasure operation, the programming before erasure designating signal $\phi E$ is set to "L", and the transfer gate 800 is rendered non-conductive. Thus the output from row decoder (14) is separated from high voltage switch circuit 50.

Then, reset signal RESET is generated, switch transistor 812 is rendered conductive, and shift latch 700 is initialized. In the structure shown in FIG. 42, outputs of inverter circuit 804-0 and 804-1 are initially set to "H" and output of inverter circuit 804-2 is initially set to "L".

Then, clock signals $\phi 1$, $\phi 2$ and $\phi 3$ are generated. When clock signal $\phi 1$ rises to "H", gate 808 is rendered conductive, and the signals which have been initialized are transmitted to corresponding high voltage switch circuits 50 through inverter circuit 810. In parallel to this operation, the initial value is transmitted through transfer gate 814 to the shift latch of the downstream side. At this time, node 821 is charged to "H" level. Clock signal $\phi 2$ is at "L", and the transfer signal is not taken in the shift latch 700. Word lines WL0 and WL1 are selected.

Thereafter, clock signal $\phi 1$ falls to "L". At this time, word lines may be being selected, since high voltage switch circuit 50 has a function of latching the input signal thereof (see FIG. 69). At this time, clock signal $\phi 2$ attains to "H" and takes the signal transmitted from the shift latch 700 of the upstream side therein. Here, transfer gate 808 is non-conductive, and therefore the output state of shift latch 700 is not changed. Shift latch 700-0 latches non-selected state information, while shift latches 700-1 and 700-2 latch the selected state information.

When clock signal φ1 attains to "H", transfer gates 808 and 814 are rendered conductive, word line selecting signal is transmitted to high voltage switch 50, and latched data is transmitted to the shift latch of the down stream side. Word line WL0 is set to the non-selected state, and word lines WL1 and WL2 are set to the selected state. By repeating this operation, sets of physically adjacent two word lines are selected simultaneously.

When programming before erasure is completed, the programming before erasure designating signal φE returns to "H", clock signals φ1 and φ2 are set to "H" and clock signal φ3 is set to "L". Consequently, transfer gates 800, 802 and 808 are rendered conductive, while transfer gate 814 and transistor 821 are rendered non-conductive.

In the normal writing and reading operations and in the verifying operation, word line selection is carried out in accordance with the output from the row decoder. Since the driving capability of inverter circuit 806 is set small, it does not affect the output from the row decoder. A structure may be used in which a gate transistor which is rendered conductive in response to the programming before erasure designating signal is provided between the output from inverter circuit 806 and the input of inverter circuit 804 so that the latch circuit is activated only at the time of programming before erasure.

Though two physically adjacent word lines are selected simultaneously in the above described embodiment, an arbitrary number of adjacent word lines, for example three or four word lines may be simultaneously selected. At the time of initialization, clock signals φ2 and φ3 are generated by a necessary number of times while keeping the transfer gate 802-0 at the non-conductive state. Thereafter, for one cycle of the clock signal φ1, the clock signals φ2 and φ3 may be generated in accordance with the number of word lines which are to be selected simultaneously.

In the fifth embodiment, a decode latch is provided between the output of the row decoder and the input of the high voltage switch. A structure in which the decode latch is provided at the other end of the word line, such as shown in FIG. 35, may be used. In that case, the high voltage switch is also provided at the other end of the word line.

[Embodiment 6]

Figure 44:
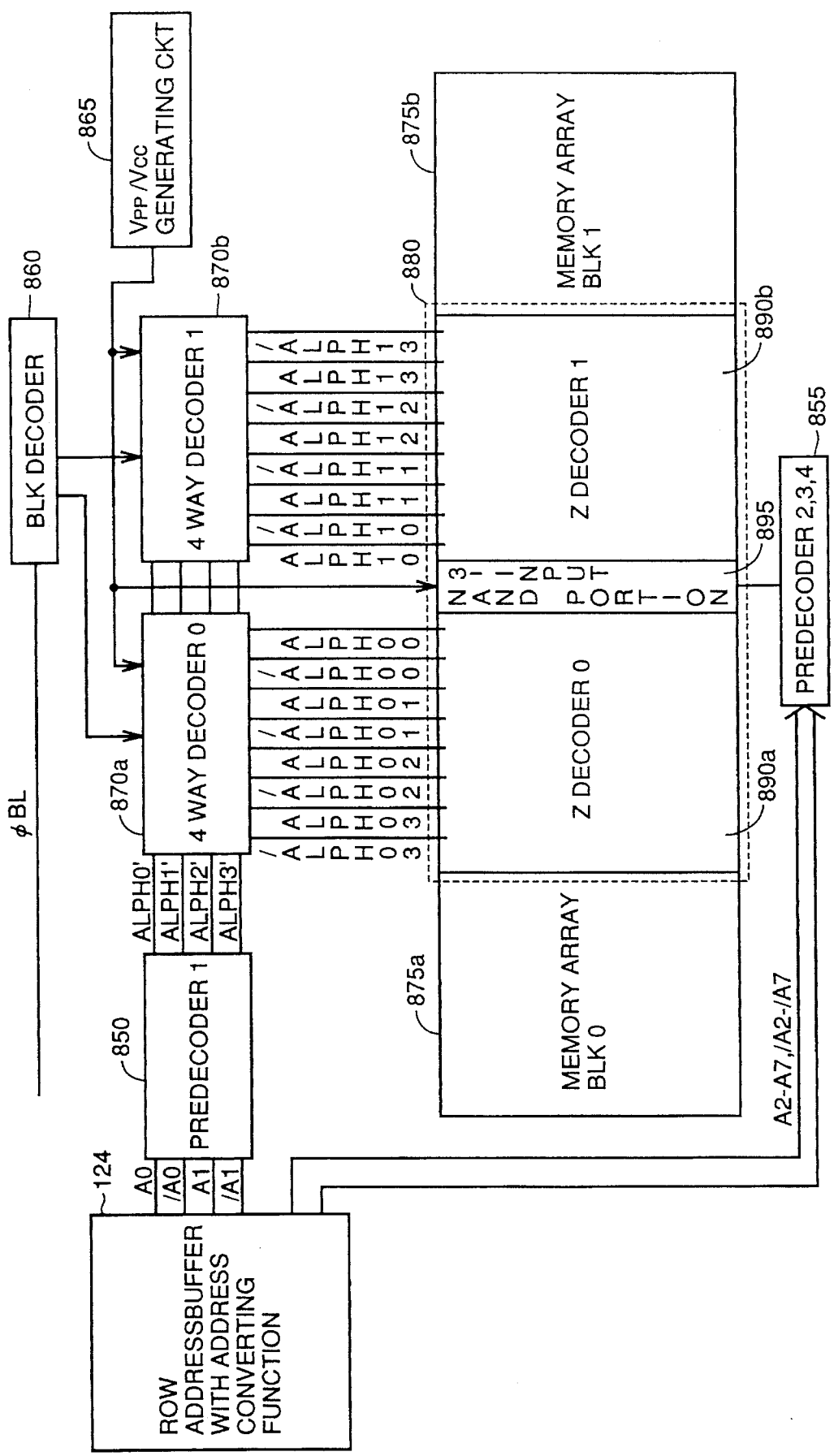
FIG. 44 shows a structure of a main portion of the nonvolatile semiconductor memory device in accordance with a sixth embodiment of the present invention.

FIG. 44 is a schematic block diagram showing structures of portions related to row selection in the nonvolatile semiconductor memory device in accordance with a sixth embodiment. Referring to FIG. 44, the nonvolatile semiconductor memory device includes two memory array blocks 875a and 875b. Each of the memory array blocks 875a and 875b (in FIG. 44, shown as memory array blocks 0 and 1) includes a plurality of nonvolatile memory cells arranged in a matrix, and a plurality of word lines to each of which one row of memory cells are connected. The plurality of word lines include normal word lines and spare word lines. In other words, memory array block 875a and 875b have the same structure as the memory array in the first to fifth embodiment.

The nonvolatile semiconductor memory device further includes a row address buffer 124 having address converting function for converting an applied address so as to enable simultaneous selection of a plurality of adjacent word lines at the time of programming before erasure, predecoders 850 and 855 for predecoding the address signal from row address buffer 124, 4 way decoders 870a and 870b converting voltage level of the predecode signal output from predecoder 850 and for generating a pair of complementary predecode signals, and a row decoder 880 for driving word lines to the selected state in one memory array block of memory arrays 875a and 875b, in accordance with the predecode signal provided from predecoder 855 and the signals output from 4 way decoders 870a and 870b.

Row address buffer 124 having row address converting function has the same structure as the row address buffer having address converting function shown in FIGS. 1 and 6. More specifically, row address buffer 124 having address converting function has a function of converting the applied address such that one word line is selected in the normal operation while a plurality of adjacent word lines are simultaneously selected at the programming before erasure. Row address buffer 124 having address converting function has a structure for successively setting adjacent word lines to the selected state in programming before erasure (as in the first and second embodiments).

Predecoder 850 predecodes address bits A0, /A0, A1 and /A1 from row address buffer 124 having address converting function, and generates signals ALPH0', ALPH1', ALPH2' and ALPH3'.

Predecoder 855 predecodes internal address bits A0 to A7 and /A0 to /A7 from row address buffer 124 having address converting function, and generates complementary signals.

Only one of 4 way decoders 870a and 870b is activated in accordance with a block designating signal from block decoder 860. Block decoder 860 generates a block designating signal designating one of the memory array blocks 875a and 875b, in accordance with a block select signal φBL. The block select signal φBL may be externally applied, or it may be generated in accordance with a specific bit of the address signal generated from the address buffer 124. The most significant row address bit A8 may be used. At this time, address generating circuit 212 (see FIG. 6) included in row address buffer 124 having address converting function generates 9 bits of an address, A0 to A8.

In a structure in which the block selecting signal φBL is externally applied, the block select signal φBL is generated under control of address control circuit 210 shown in FIG. 6. When programming before erasure is completed in one of the memory array blocks, programming before erasure is successively carried out in the other one of the memory array blocks. A structure may be used in which block select signal φBL designates both memory array blocks 875a and 875b in programming before erasure.

4 way decoders 870a and 870b include a circuit portion which operates using the voltage Vpp/Vcc generated from a Vpp/Vcc generating circuit 865 as the operational supply voltage. The 4 way decoders 870a and 870b have functions of converting the high level of the signals ALPH0' to ALPH3' provided from predecoder 850 to the level of the high voltage Vpp. Vpp/Vcc generating circuit 865 generates the programming high voltage Vpp in programming operation and programming before erasure operation, in which operations the programming high voltage Vpp is applied to the word lines. In other operation modes, it generates the operational supply voltage Vcc.

The output from predecoder 855 and the outputs from 4 way decoders 870a and 870b are applied to the row decoder 880.

Row decoder 880 includes a 3-input NAND portion 895 which operates using the voltage Vpp/Vcc generated from Vpp/Vcc generating circuit 865 as the operational supply voltage for decoding the output from predecoder 855, and Z decoders 890a and 890b provided corresponding to memory array blocks 875a and 875b, respectively, for decoding the output from 3-input NAND portion 895 as well as the output from the corresponding 4 way decoders 870a and 870b for selecting word lines in the corresponding memory array block.

When the voltage Vpp/Vcc generated from Vpp/Vcc generating circuit 865 is the programming high voltage Vpp, the high level of the signal provided from 3-input NAND portion 895 is at the level of the high voltage Vpp. At this time, the high level of the signal output from 4 way decoders 870a and 870b corresponds to the level of the programming high voltage Vpp. Z decoders 890a and 890b, the details of which will be described later, transmit the outputs from 4 way decoders 870a and 870b to corresponding word lines, in accordance with the output from 3-input NAND portion 895. Therefore, in the structure shown in FIG. 40, 4 way decoders 870a and 870b and 3-input NAND portion 895 serve as the high voltage switch (a switch for driving the selected word lines to the programming high voltage level) used in the first to fifth embodiments. Since the high voltage switch is not necessary, the circuit scale can be reduced. The operation will be briefly described.

In programming before erasure, Vpp/Vcc generating circuit 865 generates the programming high voltage Vpp. An address for simultaneously selecting two adjacent word lines is generated from row address buffer 124 having address converting function and applied to predecoders 850 and 855. 4 way decoders 870a and 870b are selectively activated in accordance with the block designating signal from block decoder 860 (both decoders may be activated simultaneously). The activated 4 way decoder 870 (870a or 870b) receives signals ALPH0' to ALPH3' at the level of the operational supply voltage applied from predecoder 850 and carries out conversion of the voltage level.

3-input NAND portion 895 includes a plurality of NAND circuits, each provided for four word lines in memory array blocks 875a and 875b. The NAND circuit operates using the programming high voltage Vpp as the operational supply voltage, and decodes the output from predecoder 855. Consequently, the voltage level of the high level signal provided from the NAND circuit provided for the selected set of word lines (four word lines) will be the level of the programming high voltage Vpp. Z decoders 890a and 890b transmit the output signals ALPH00 to ALPH03 and ALPH10 to ALPH13 from the 4 way decoders 870a and 870b from the set of selected word lines to the corresponding word lines, in accordance with the signals from 4 way decoders 870a and 870b as well as the output signal from the 3-input NAND portion 895. In memory array blocks 875a and 875b, a signal at the level of the programming high voltage Vpp is transmitted to the selected word lines.

In the erasing operation and in the normal data reading operation, Vpp/Vcc generating circuit 865 generates a voltage at the level of the operational supply voltage Vcc. At the time of erasure, a signal at the level of 0 V is transmitted to all word lines. In normal operation, a signal at the level of the operational supply voltage Vcc is transmitted to the selected word line. A structure in which Vpp/Vcc generating circuit 865 is inactivated in erasing operation for generating a voltage of 0 V may be used. Specific structures of various portions will be described.

Figure 45:
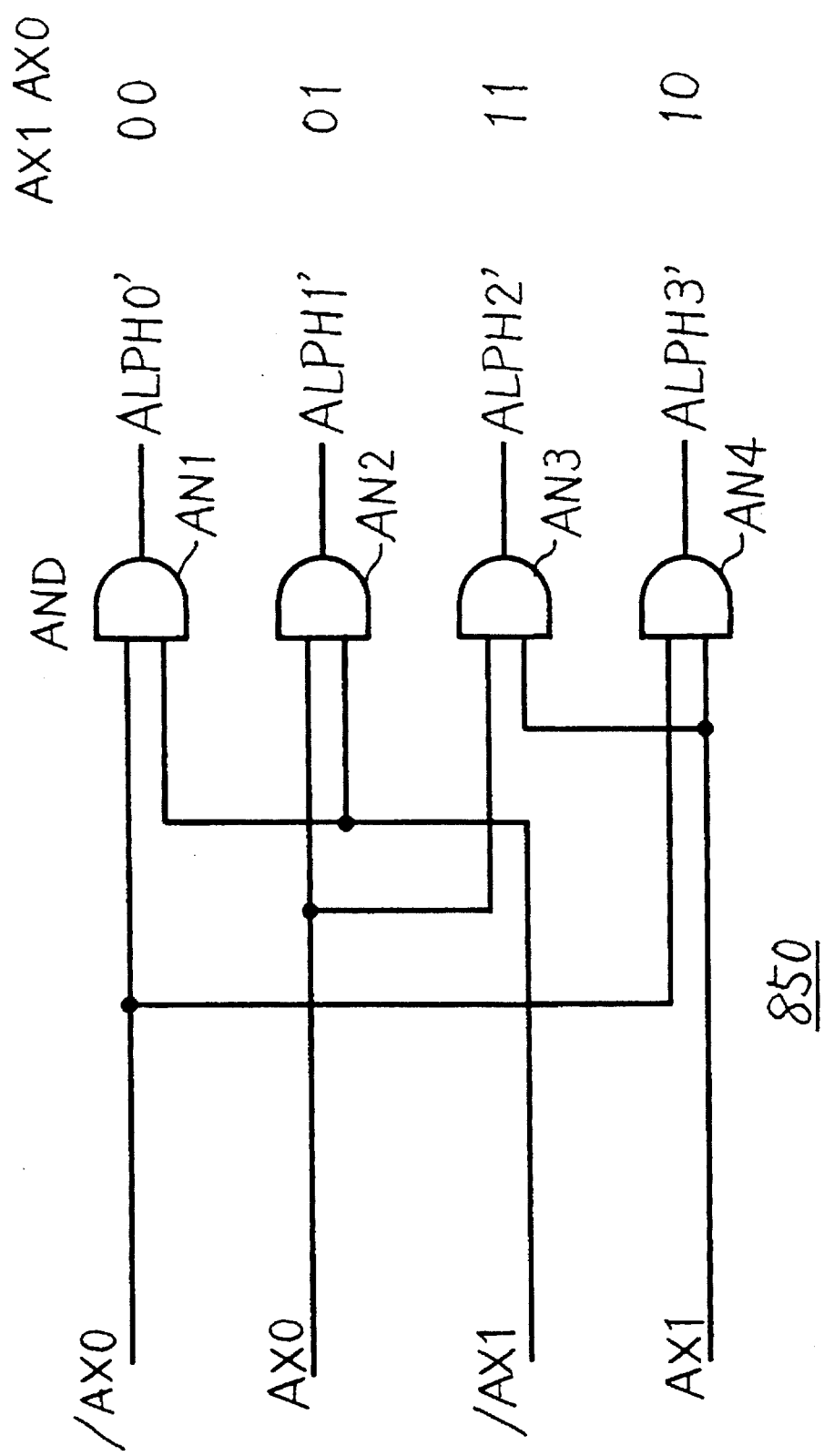
FIG. 45 shows a specific example of a predecoder 1 shown in FIG. 44.

FIG. 45 shows a schematic structure of predecoder 850 shown in FIG. 44. The structure of predecoder 850 shown in FIG. 45 is similar to that of the predecoder shown in FIG. 3. More specifically, predecoder 850 includes four AND circuits AN1 to AN4. AND circuit AN1 receives address bits /AX0 and /AX1 and generates a signal ALPH0'. AND circuit AN2 receives address bits AX0 and /AX1 and generate a signal ALPH1'. AND circuit AN3 receives address bits AX0 and AX1 and generates a signal ALPH2'. AND circuit AN4 receives address bits /AX0 and AX1 and generates a signal ALPH3'.

Referring to FIG. 45, combinations of the states of address bits AX1 and AX0 when the signals ALPH0' to ALPH3' attain to the high level are indicated corresponding to respective signals. As for the signals ALPH0' to ALPH3' in FIG. 45, the address bits corresponding to adjacent signals have the Hamming distance of 1. Therefore, two signals can be raised to the high level simultaneously, in accordance with the output from row address buffer 124 having address converting function, at the time of programming before erasure.

Figure 46:
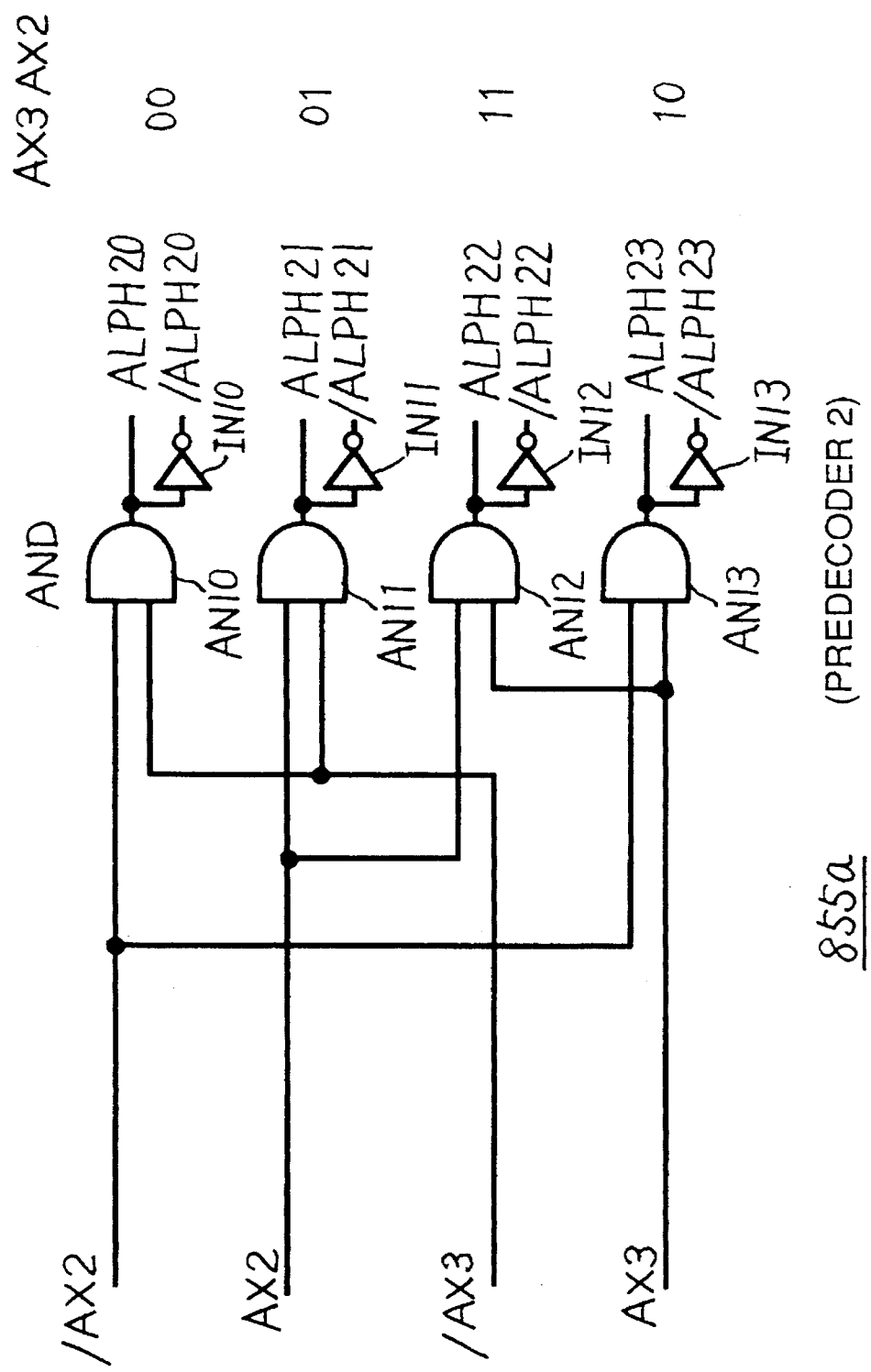
FIG. 46 shows a specific example of predecoders 2, 3 and 4 shown in FIG. 44.

FIG. 46 shows a specific structure of predecoder 855 shown in FIG. 44. Predecoder 855 includes a predecoder 855a provided for address bits A2, /A2, A3 and /A3 from address buffer 124, a predecoder 855b provided for address bits A4, /A4, A5 and /A5 from address buffer 124, and a predecoder 855c provided for address bits A6, /A6, A7 and /A7 from address buffer 124. Since predecoders 855a to 855c have identical structures, FIG. 46 shows predecoder 855a only as a representative. Predecoder 855a includes four 2-input AND circuits AN10 to AN13, and inverter circuits IN10 to IN13 provided for AND circuits AN10 to AN13, respectively.

AND circuit AN10 receives address bits /AX2 and /AX3 and generates a signal ALPH20. Inverter circuit IN10 receives an output from AND circuit AN10 and generates a signal /ALPH20. AND circuit AN11 receives address bits AX2 and /AX3 and generates a signal ALPH21. Inverter circuit IN11 receives an output from AND circuit AN11 and generates a signal /ALPH21.

AND circuit AN12 receives address bits AX2 and AX3 and generates a signal ALPH22. Inverter circuit IN12 receives an output from AND circuit AN12 and generates a signal /ALPH22. AND circuit AN13 receives address bits AX2 and AX3 and generates a signal ALPH23. Inverter circuit IN13 receives an output from AND circuit AN13 and generates a signal /ALPH23.

FIG. 46 shows combinations of states of address bits AX2 and AX3 when respective signals are set to the selected state (when the output from AND circuit is at the high level and the output from the inverter circuit is at the low level). In this case also, address bits AX2 and AX3 change successively, while maintaining the Hamming distance of 1. The structure of the predecoder 855a shown in FIG. 46 differs from the structure of predecoder 201-2 to 201-4 shown in FIGS. 3 and 4 only in that complementary signals /ALPH20 to /ALPH23 are generated.

Figure 47:
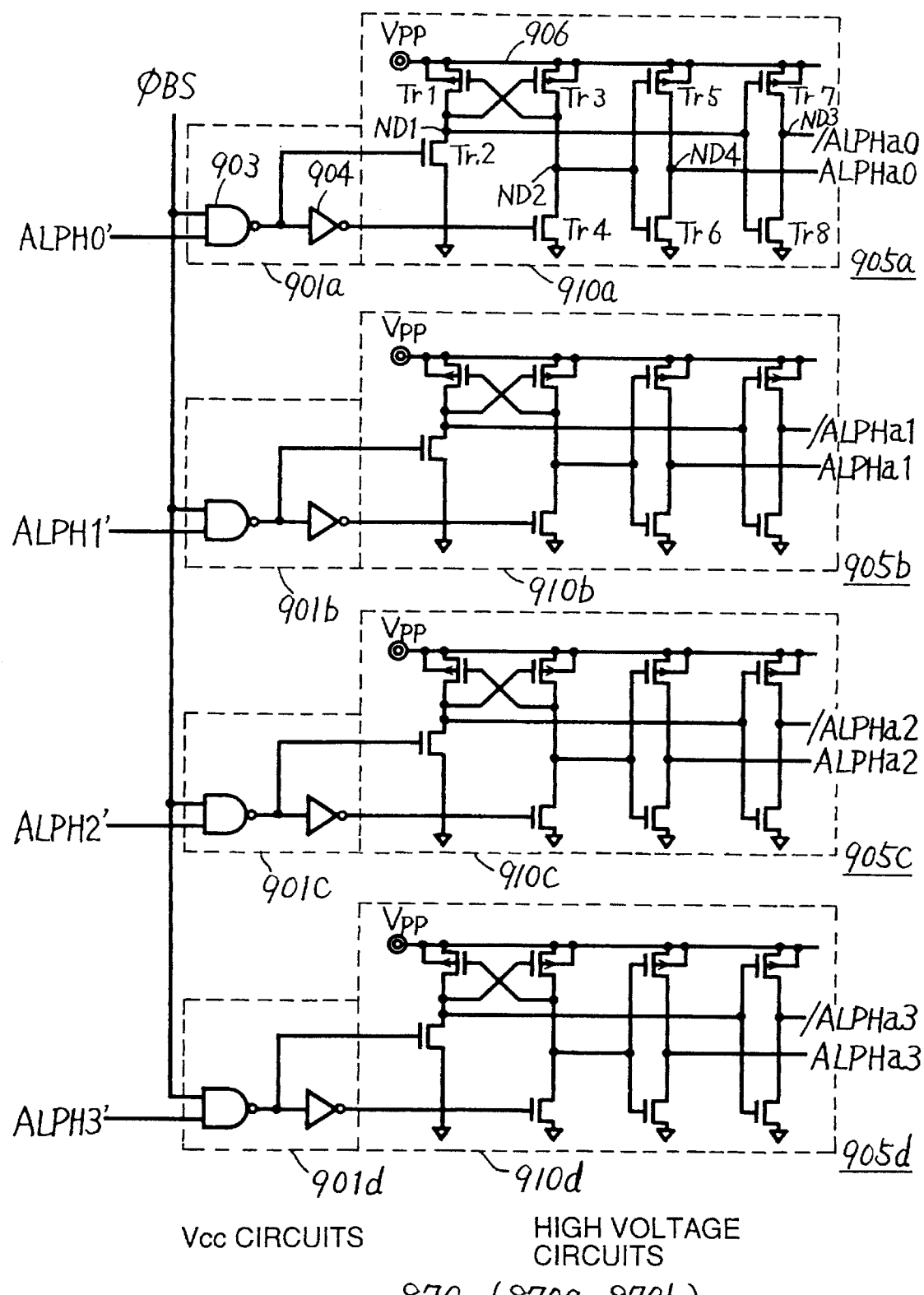
FIG. 47 shows a specific example of a 4 way decoder shown in FIG. 44.

FIG. 47 shows a specific structure of the 4 way decoder shown in FIG. 44. In FIG. 47, since 4 way decoders 870a and 870b have the same structure, only one 4 way decoder is shown, denoted by reference numeral 870.

Referring to FIG. 47, the 4 way decoder 870 includes way decode circuits 905a to 905d provided for predecode signals ALPH0 to ALPH3' from predecoder 850, respectively. Way decode circuit 905a to 905d have identical structures, and converts a signal at the level of the operational supply voltage Vcc to a signal of the level of the programming high voltage Vpp (in programming). Way decode circuits 905a to 905d are activated when the block designating signal φBS from block decoder is at the active state, and carries out level conversion of the output signal from the corresponding predecoder.

Way decoder circuit 905a includes a signal input portion 901a for receiving the block designating signal φBS and the predecode signal ALPH0', and a level converting portion 910a for converting the level of the output signal from the signal input portion 901a. Signal input portion 901a includes a 2-input NAND circuit 903 receiving a block selecting signal φBS and a predecode signal ALPH0', and an inverter circuit 904 receiving the output from NAND circuit 903. Signal input portion 901a operates using the operational supply voltage Vcc as one operational supply voltage. The high level of the predecode signal applied from the predecoder is at the level of the operational supply voltage Vcc, and the low level of the signal is at the ground potential level. Therefore, this signal input portion has a signal at the level of operational supply voltage Vcc as its input, and generates complementary signals which are at the operational supply voltage level and the ground potential level.

Level converting portion 910a operates using the voltage Vpp/vcc (shown as Vpp in FIG. 47) from Vpp/Vcc generating circuit as one operational supply voltage and the ground potential as the other supply potential, and converts a signal at the level of the operational supply voltage Vcc to the level of the programming high voltage Vpp.

Level converting portion 910a includes a P channel MOS transistor Tr1 connected between a power line 906 and a node ND1, a p channel MOS transistor Tr3 provided between a node ND2 and power line 906, a p channel MOS transistor Tr2 connected between node ND1 and the ground potential, an n channel MOS transistor Tr4 provided between node ND2 and the ground potential, a p channel MOS transistor Tr5 and an n channel MOS transistor Tr6 connected complementarily between power line 906 and the ground potential, and a p channel MOS transistor Tr7 and an n channel MOS transistor Tr8 complementarily connected between power line 906 and the ground potential.

MOS transistor Tr1 has its gate connected to node ND2, while p channel MOS transistor Tr3 has its gate connected to node ND1. MOS transistor Tr2 has its gate connected to receive an output from NAND circuit 903 of signal input portion 901a. MOS transistor Tr4 has its gate connected to receive the output from inverter circuit 904. MOS transistor Tr5 and Tr6 have their gates connected to node ND2. MOS transistors Tr7 and Tr8 have their gates connected node ND1. The signal /ALPHa0 is output from node ND3, while a signal ALPHa0 is output from ND4. A voltage Vpp (Vpp/Vcc) is transmitted to power line 906. Other way decode circuits 905b to 905d have the same structure as way decode circuit 905a, and include signal input portions 901b to 901d and level converting portions 910b to 910d, respectively.

Way decode circuit 905b generates signals /ALPHa1 and ALPHa1 from predecode signal ALPH1'. Way decode circuit 905c generates signals /ALPHa2 and ALPHa2 from predecode signal ALPH2'. Way decode circuit 905d generates signals /ALPHa3 and ALPHa3 from predecode signal ALPH3'. The operation will be briefly described.

4 way decoders 870a and 870b are activated when the block designated signal φBS from the block decoder is at the high level. Since operations of way decode circuits 905a to 905d are similar to each other, way decode circuit 905a will be described as an example.

When the block designating signal φBS is at the high level and the predecode signal APLH0' is at the high level, a low level signal, which corresponds to the ground potential level, is provided from NAND circuit 903. A high level signal, which corresponds to the operational supply voltage Vcc, is provided from inverter circuit 904. At level converting portion 910a, MOS transistor Tr4 is turned on to discharge node ND2 to the ground potential level, in response to the high level signal from inverter circuit 904. In response, p channel MOS transistor Tr1 turns on, and charges node ND1 to the voltage Vpp level on power line 906.

Since the output from NAND circuit 903 is at the low level, MOS transistor Tr2 is off. Therefore, node ND1 is charged to the level of the high voltage Vpp. Since node ND2 is at the low level, which corresponds to the ground potential level, MOS transistor Tr6 is off, MOS transistor Tr5 is on, and node ND4 is charged to the level of the high voltage Vpp.

Meanwhile, since node ND1 is at the high voltage Vpp, MOS transistor Tr7 turns off, and node ND3 is discharged to the ground potential level. Therefore, the signal ALPH0' which is at the level of the operational supply voltage Vcc is converted to a signal ALPHa0 which is at the high level, which corresponds to the high voltage Vpp.

When the predecoder signal ALPH0' is at the ground potential level, the signal ALPHa0 is at the low level or the ground potential level, and the signal /ALPHa0 attains to the high voltage Vpp level.

The high voltage Vpp applied to power line 906 is applied from Vpp/Vcc generating circuit 865 shown in FIG. 44. In normal operation and in erasure operation, a signal at the level of the operational supply voltage Vcc is transmitted.

Figure 48:
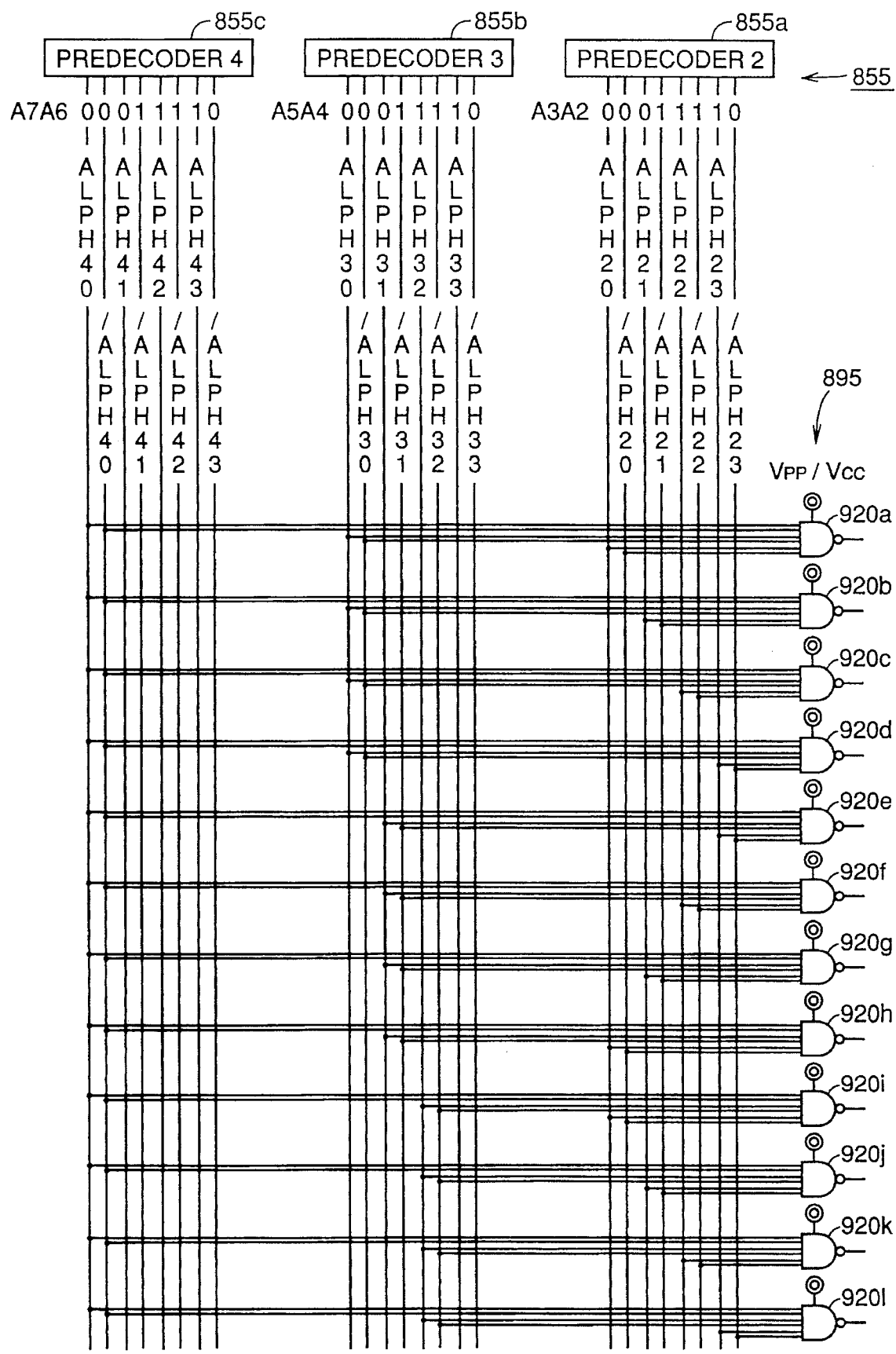
FIG. 48 shows an example of the structure of the 3-input NAND portion shown in FIG. 44.

FIG. 48 shows connection between output signal lines from predecoder 955 and input portions of NAND circuits at 3-input NAND portion 895. Referring to FIG. 48, 3-input NAND circuit portion 895 includes 3-input NAND circuits. In FIG. 48, 12 NAND circuits 920a to 920l are shown as representatives. Allocation of output signal lines of predecoder 855 to the NAND circuits corresponds to the connection between predecoder 201 and NAND circuit NA shown in FIG. 4. The structure of FIG. 4 differs from the structure of FIG. 48 in that predecoders 855a to 855c each provide complementary signal pair, and that the signal provided from predecoder 855 is set to the high level or the high voltage Vpp level at the programming operation (including programming before erasure).

NAND circuit 920a operates using the voltage Vpp/Vcc generated from the Vpp/Vcc generating circuit as one operational supply voltage. Therefore, the high level of the signals provided from NAND circuits 920a to 920l corresponds to the voltage Vpp/Vcc level. The high level/low level of the input signal to the Z decoder, which is the last stage of the row decoder, corresponds to Vpp level/ground potential level, and therefore the high voltage switch becomes unnecessary. Since level conversion of signals is carried out by the predecoder, it becomes possible to fabricate MOS transistors, which are the components, with sufficiently wide area, and therefore MOS transistors having sufficient breakdown voltages can be fabricated with no suffer from area restriction.

In NAND circuits 920a to 920l, complementary signals constituting a pair are applied to the same NAND circuit. The necessity of generating complementary signal pair arises from the structure of the 3-input NAND circuit, which will be described in the following.

Figure 49:
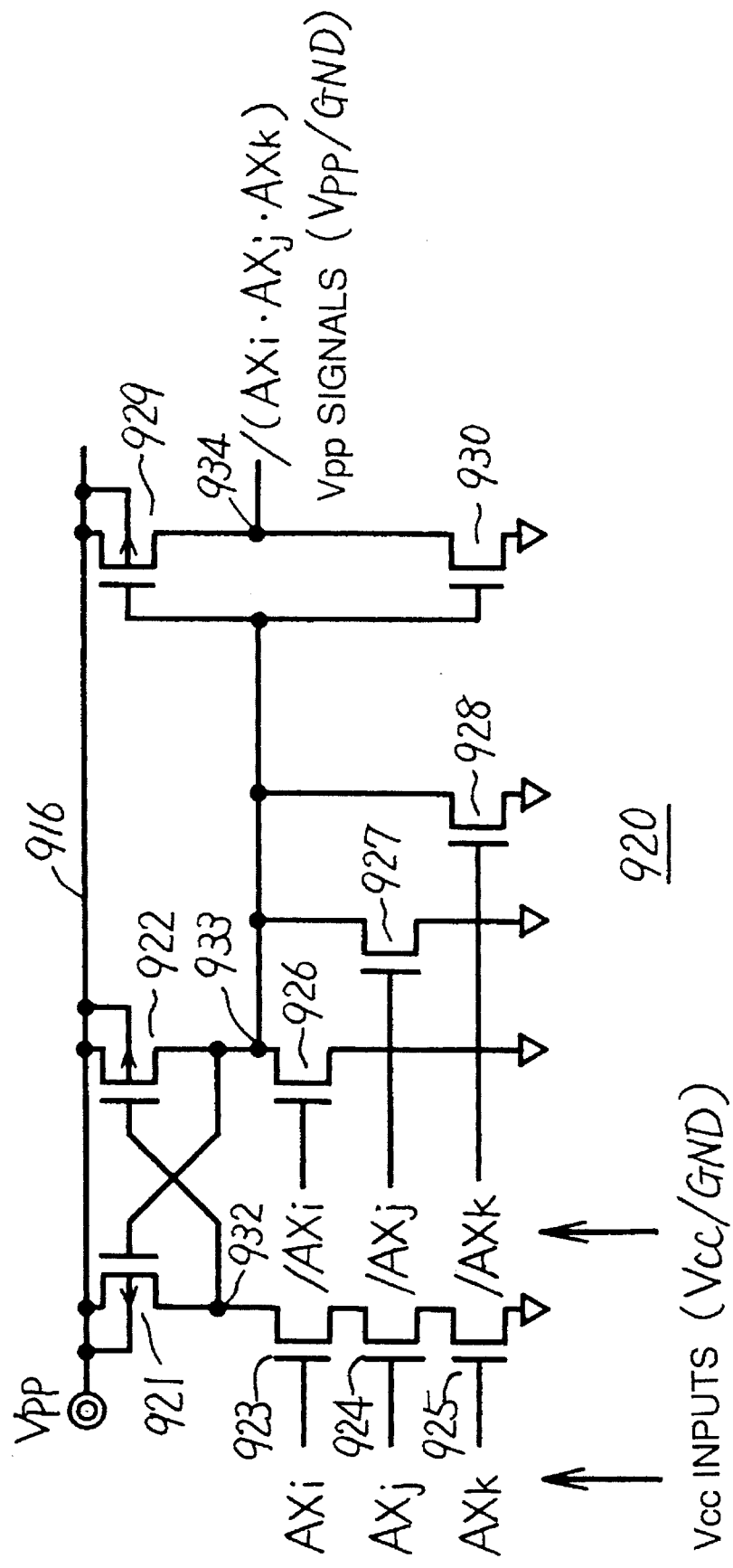
FIG. 49 shows a specific example of the 3-input NAND circuit shown in FIG. 48.

FIG. 49 shows a specific structure of the NAND circuit included in the 3-input NAND portion.

Referring to FIG. 49, 3-input NAND circuit 920 includes a p channel MOS transistor 921 provided between supply line 916 and node 932, a p channel MOS transistor 922 provided between a node 933 and a supply line 916, n channel MOS transistors 923, 924 and 925 connected in series between node 932 and the ground potential, and N channel MOS transistors 926, 927 and 928 provided parallel to each other between the ground potential and node 933.

MOS transistor 921 has its gate connected to node 933, and MOS transistor 922 has its gate connected to node 932. Predecode signals AXi, AXj and AXk are respectively applied to the gates of MOS transistors 923, 924 and 925. Here, signals AXi, AXj and AXk represent the predecode signal ALPHij (i=2 to 4, j=0 to 3). Predecode signals AXi, AXj and AXk are generated from different predecoders.

Signals /AXi, /AXj and /AXk are applied to the gates of MOS transistors 926, 927 and 928.

3-input NAND circuit 920 further includes a p channel MOS transistor 929 and an n channel MOS transistor 930 connected complementarily between supply line 916 and the ground potential. MOS transistors 929 and 930 have their gates connected to node 933. A signal /(AXi·AXj·AXk) indicating the result of NAND operation is provided from node 934 (connection between transistors 929 and 930). The operation will be briefly described.

When the signals AXi, AXj and AXk are all at the high level of the supply potential Vcc, MOS transistors 923, 924 and 925 are all on. At this time, since the signals /AXi, /AXj and /AXk are at the low level corresponding to the ground potential level, MOS transistors 926, 927 and 928 are all turned off. Consequently, node 932 is discharged to the ground potential level, MOS transistor 922 is turned on, and node 933 is charged to the high voltage Vpp level through transistor 922. When node 933 is charged to the level of the high voltage Vpp, MOS transistor 929 is turned off, transistor 930 is turned on, and the node 934 therebetween attains to the low level, which corresponds to the ground potential level.

When any of the signals AXi, AXj and AXk is at the low level, any of the MOS transistors 923, 924 and 925 is turned off, and therefore there is no path of current flowing from node 932 to the ground potential. Meanwhile, since any of the MOS transistors 926, 927 and 928 is turned on, the node 933 is discharged through the MOS transistor which is on. In response, MOS transistor 921 turns on, node 932 is charged so that its potential rises, and MOS transistor 922 is turned off. By this feedback operation, when MOS transistor 922 is completely turned off, node 933 attains to the low level of the ground potential level. At this state, MOS transistor 929 is on, and MOS transistor 930 is off. Therefore, node 934 attains to the high level or the high voltage Vpp level.

By using the 3-input NAND circuit having the above described structure, a signal at the level of Vcc/ground potential can be converted to a signal having the level of high voltage Vpp/ground potential. The predecoder 850 is required to provide complementary signals in order to carry out level conversion by utilizing a differential amplifying circuit constituted by MOS transistors 922 and 921, as shown in FIG. 49.

Figure 50:
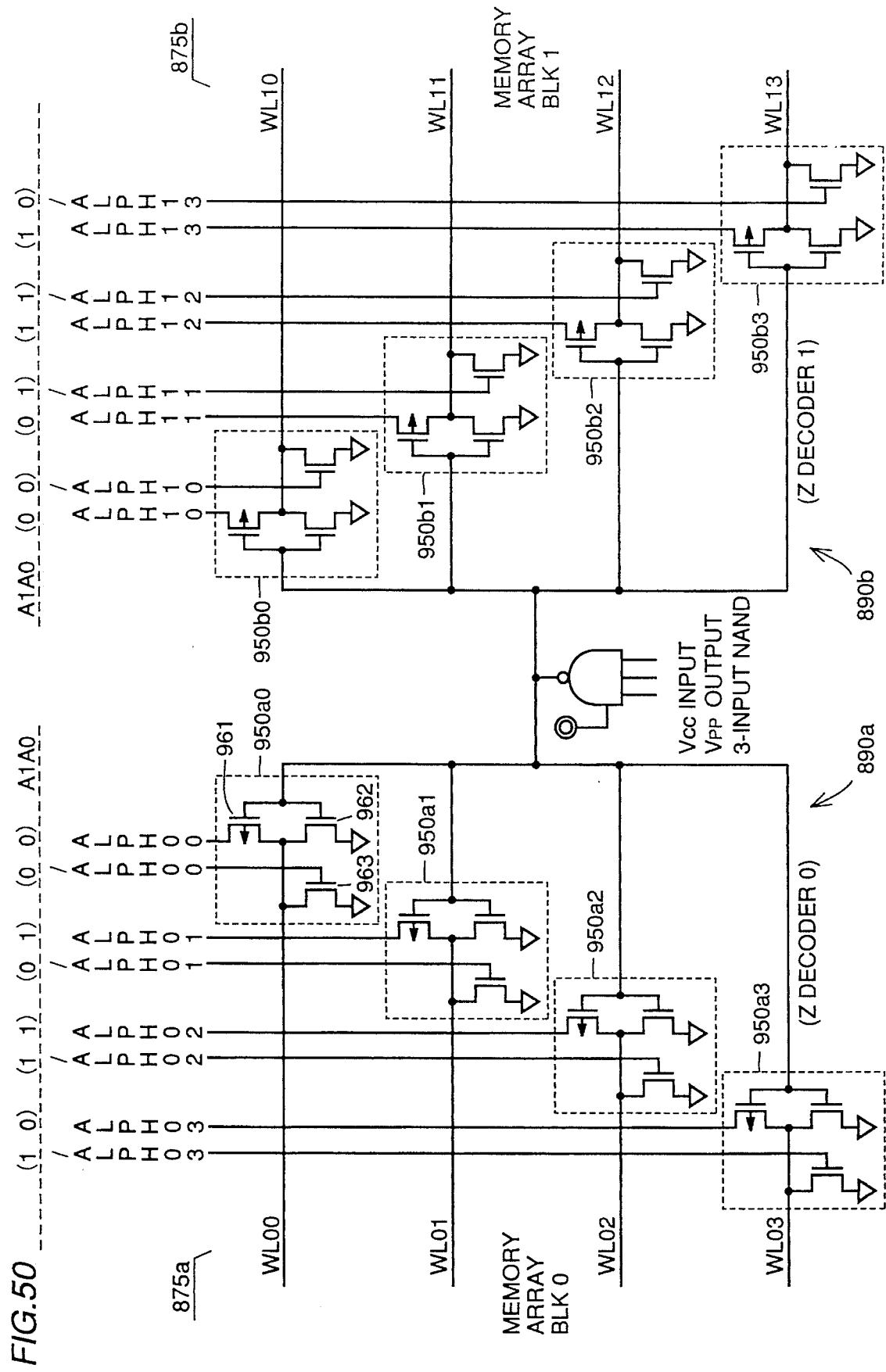
FIG. 50 shows a specific example of the row decoder shown in FIG. 44.

FIG. 50 shows a structure of the Z decoder. FIG. 50 shows a structure of a Z decoder related to one 3-input NAND circuit. NAND circuit 920 is shared by two memory array blocks 875a and 875b. One NAND circuit 920 is provided for four word lines in one memory array block. FIG. 50 shows an example in which NAND circuit 920 is provided for four word lines WL00, WL01, WL02 and WL03 in memory array block 875a and for four word lines WL10, WL11, WL12 and WL13 in memory array block 875b.

For word lines WL00 to WL03, Z decoder circuits 950a0 to 950a3 for transmitting a predecode signal (Vpp/ground potential level) from predecoder 855 to the corresponding word line in accordance with the output from NAND circuit 920 are provided, respectively. Similarly, for word lines WL10 to WL13, Z decode circuits 950b0, 950b1, 950b2 and 950b3 are provided respectively for transmitting the predecode signal from predecoder circuit 855 to the corresponding word line in accordance with the output from NAND circuit 920.

Different predecoder signals having their levels converted from 4 way decoder are applied to respective Z decode circuits 950a0 to 950a3. Similarly, different predecode signals having their levels converted from the 4 way decoder are respectively applied to Z decode circuits 950b0 to 950b3. Complementary signal pair is applied to one Z decode circuit 950 (generically refers to 950a0 to 950a3, 950b0 to 950b3). For example, to Z decoder circuit 950a0, predecode signals ALPH00 and /ALPH00 are applied. Numerals allotted to the signals ALPH correspond to the numerals allotted to the word lines.

Z decode circuits 950a0 to 950a3 and 950b0 to 950b3 have identical structures. As an example, the structure of the Z decode circuit 950a0 will be described.

Z decode circuit 950a0 includes a p channel MOS transistor 961 receiving at one conduction terminal the signal ALPH00 and at its gate the output from NAND circuit 920, an n channel MOS transistor 962 connected between the word line WL00 and the ground potential and receiving at its gate the output from NAND circuit 920, and an n channel MOS transistor 963 provided between word line WL00 and the ground potential and receiving at its gate the signal /ALPH00. The operation will be described.

When it is selected, the output of NAND circuit 920 is at the low level, which corresponds to the ground potential level. Assume that the signal ALPH00 is at the high voltage Vpp level and the signal /ALPH00 is at the low level of the ground potential. At this state, in Z decode circuit 950a0, p channel MOS transistor 961 is on, and MOS transistors 962 and 963 are both off. Therefore, a signal ALPH00 at the high voltage Vpp level is transmitted to word line WL00 as the word line driving signal, whereby the word line WL00 has its potential raised to the level of the programming high voltage Vpp.

When the signal ALPH00 is at the low level which corresponds to the ground potential and the signal /ALPH00 is at the high level, which corresponds to the programming high voltage Vpp, and if the output of NAND circuit 920 is at the low level of the ground potential level, then MOS transistors 961 and 962 are both turned off, and MOS transistor 963 is turned on. Consequently, word line WL00 is kept at the low level or the ground potential level. Therefore, when the NAND circuit 920 is at the selected state, corresponding word lines are set to the selected/non-selected state, by the signals ALPH00 to ALPH03 and /ALPH00 to /ALPH03.

In which of the memory array blocks 875a and 875b the word lines are to be selected is set by the block designating signal φBS. For the non-selected memory array block, the block designating signal φBS is at the low level, which corresponds to the ground potential level, and the signal ALPHa0 (see FIG. 47) is at the low level, which corresponds to the ground potential level. Therefore, all MOS transistors 963 are turned on, word lines are kept at the ground potential level, and the word lines are kept at the non-selected state.

In normal data reading operation, the output from 4 way decoder is at the level of the supply potential Vcc. Therefore, the potential of the selected word line corresponds to the operational supply voltage Vcc level.

Also in this structure of Embodiment 6, by using a row address buffer having address converting function, a plurality of adjacent word lines can be set to the selected state simultaneously in programming before erasure, and therefore, memory cells can be programmed before erasure without fail.

In the structure of Embodiment 6, since there is not a high voltage switch provided for boosting the word line to the level of the programming high voltage Vpp, the circuit scale can be significantly reduced.

In the structures of Embodiments 1 to 6, an operation of injecting electrons to the floating gate is referred to as "programming", while an operation of extracting electrons from the floating gate is referred to as "erasure". These may be reversed, that is, the operation of injecting electrons to the floating gate may be "erasure", while the operation of extracting electrons from the floating gate may be "programming".

In Embodiments 1 to 6 described above, a plurality of adjacent word lines are set to the selected state simultaneously only in the programming before erasure operation. In a nonvolatile memory cell of a sector erasure type, when one word line is used as the unit of a sector, by setting a plurality of adjacent word lines to the selected state simultaneously, two sectors can be erased simultaneously. Therefore, the structure for simultaneously selecting a plurality of adjacent word lines can be applied not only to "programming before erasure" but also to a sector erasure type nonvolatile semiconductor memory device in which erasure is carried out sector by sector.

Figure 51:
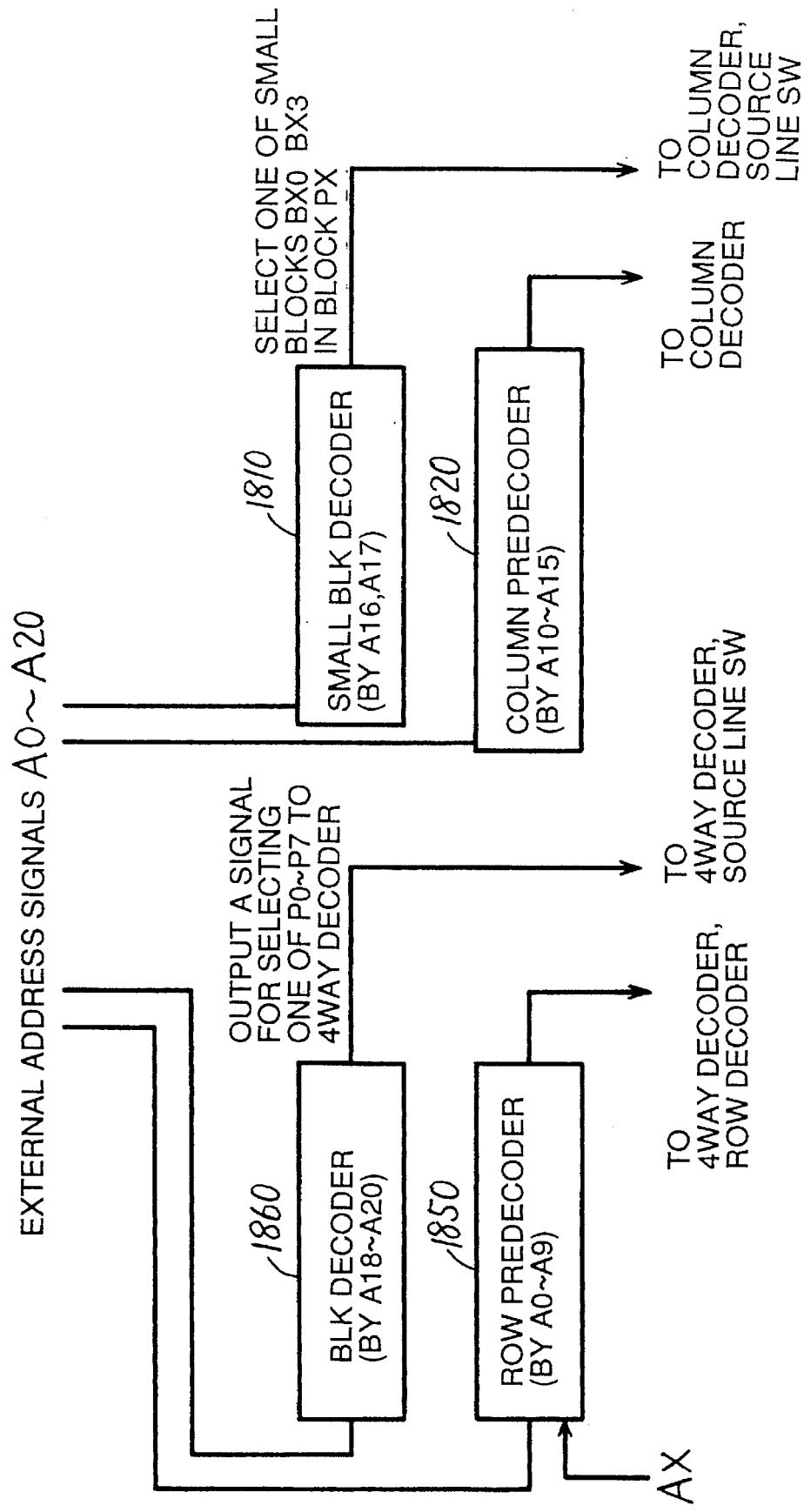
FIG. 51 shows a structure of an address signal predecode portion of a 16M bit collective erasure type nonvolatile semiconductor memory device.
Figure 52:
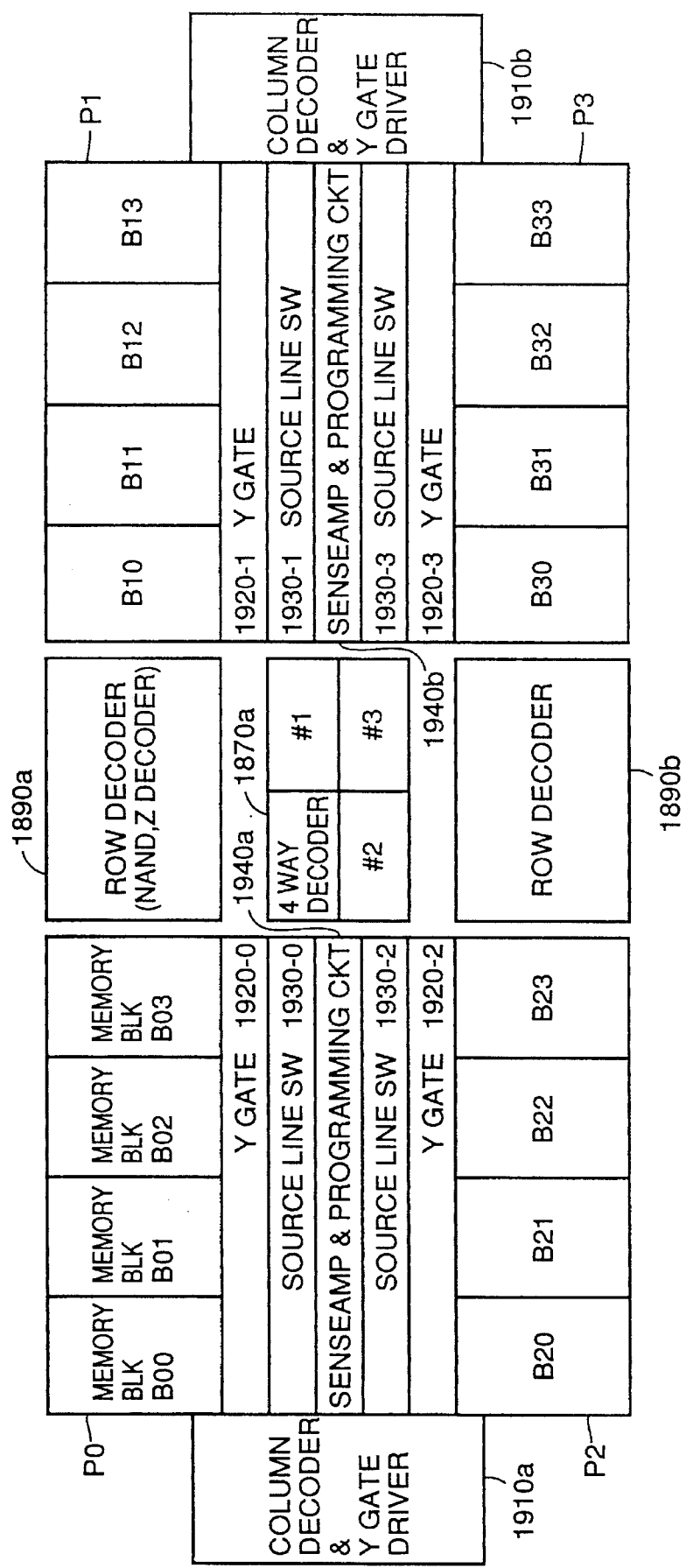
FIG. 52 shows functional structure of a memory array portion used with the predecode circuit shown in FIG. 51.
Figure 53:
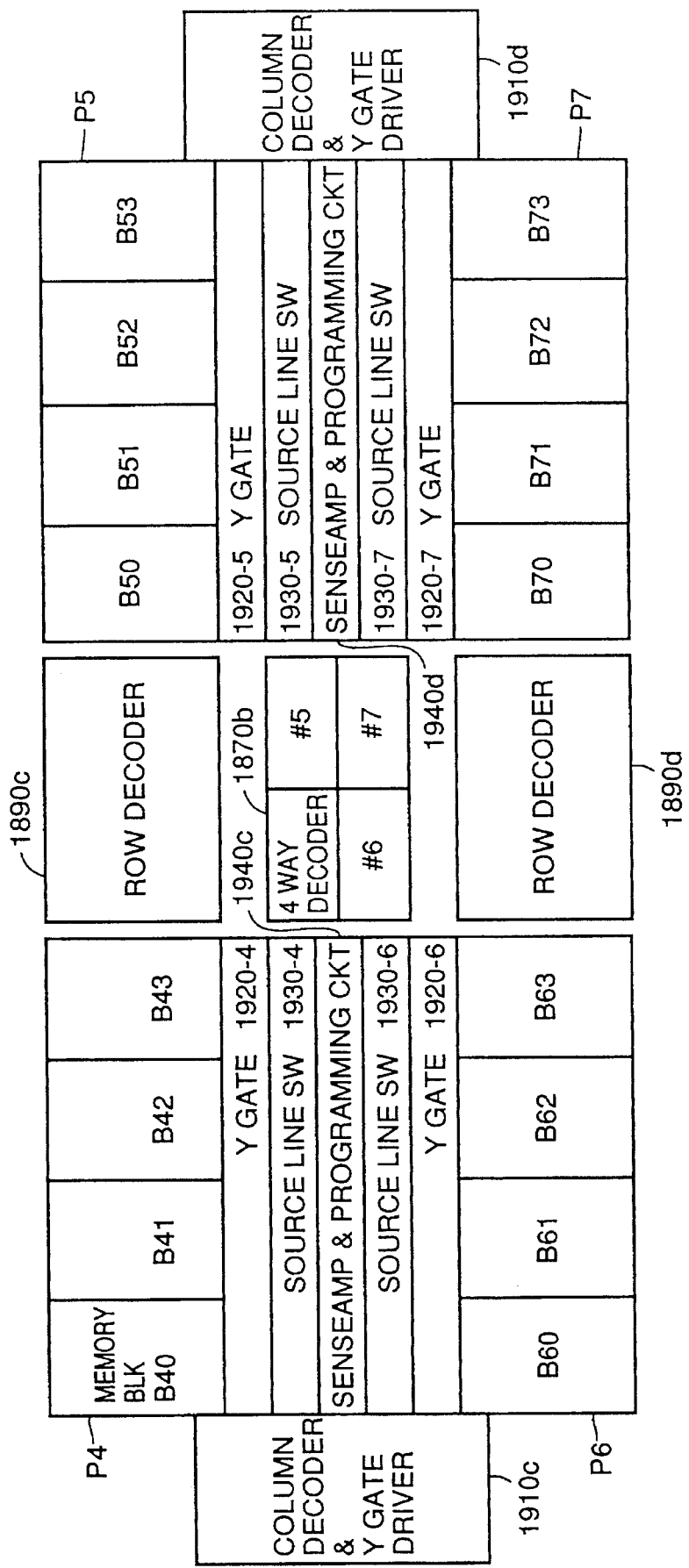
FIG. 53 functionally shows the structure of the memory array portion used together with the structure of FIG. 52.

FIGS. 51 to 53 show an example of the whole structure of a nonvolatile semiconductor memory device. In FIGS. 51 to 53, a structure of a 16M bit collective erasure type nonvolatile semiconductor memory device is shown as an example. Referring to FIGS. 51 to 53, the nonvolatile semiconductor memory device includes 8 large memory blocks P0 to P7 (see FIGS. 52 and 53). Each of the large memory blocks P0 to P7 includes 4 memory blocks Bj0 to Bj3, where j=0 to 7. Erasing operation is carried out on the basis of small memory block Bjk (where k=0 to 3).

A row decoder 890a is positioned between memory blocks P0 and P1; row decoder 1890b is positioned between larger memory blocks P2 and P3; and a row decoder 1890c is positioned between large memory blocks P4 and P5. A row decoder 1890d is positioned between large memory blocks P6 and P7. Row decoders 1890a to 1890d each include Z decoders 890a and 890b as well as 3-input NAND portion 895 shown in FIG. 44.

Each of the row decoders 1890a to 1890d corresponds to the row decoder 880 shown in FIG. 44. In the large memory block Pj, word lines are shared by small memory blocks Bj0 to Bj3. The small memory block Bjk includes 64K bits x8 (I/O) bits=512 Kbits of memory cells. The nonvolatile semiconductor memory device stores multibit data of x 8 bits. A 4 way decoder 1870a is positioned between row decoders 1890a and 1890b, while a 4 way decoder 1870b is positioned between row decoders 1890c and 1890d. 4 way decoders 1870a includes 4 way decoder circuits #0 to #3 provided for large memory blocks P0 to P3, respectively. 4 way decoders 1870b includes 4 way decoder circuits #4 to #7 provided for large memory blocks P4 to P7.

Y gates 1920-0 to 1920-7 and source line switches 1930-0 to 1930-7 are provided for large memory blocks P0 to P7, respectively. A sense amplifier and programming circuit 1940a is provided to be shared by large memory blocks P0 and P2; a sense amplifier/programming circuit 1940b is provided to be shared by large memory blocks P1 and P3; a sense amplifiers/programming circuit 1940c is provided to be shared by large memory blocks P4 and P6; and a sense amplifier/programming circuit 1940d is provided to be shared by large memory blocks P5 and P7.

A source line is commonly connected in the small memory block Bjk. Source line switches 1930-0 to 1930-7 include switch circuits which can be driven independently by the unit of the small memory block. Source line switches 1930-0 to 1930-7 provide either a high voltage or the ground potential to the source line of the corresponding small memory block Bjk in accordance with the operation mode and a small memory block selecting signal.

Y gates 1920-0 to 1920-7 connect the selected bit line of the small memory block designated by the small memory block selecting signal to the corresponding sense amplifier/ programming circuit 1940x.

Since the nonvolatile semiconductor memory device has a x 8 bits structure, eight Y gates are rendered conductive at one time. For column selection, a column decoder/Y gate driver 1910a is provided for large memory block P0 and P2, and a column decoder/Y gate driver 1910b is provided for large memory blocks P1 and P3. A column decoder/Y gate driver 1910c is provided for large memory block P4 and P6. A column decoder/Y gate driver 1910d is provided for large memory blocks P5 and P7. Since the bit line potential differs dependent on the operation mode, Y gate driver increases the voltage to be applied to the Y gate, when a high voltage is applied to the bit line. The column decoder transmits a Y gate selecting signal only to the designated small memory block, in accordance with the small memory block selecting signal.

As shown in FIG. 51, the external address signal includes address bits A0 to A20. Address signal bits A18 and A20 are applied to block decoder 1860. The block decoder 1860 corresponds to block decoder 860 shown in FIG. 44. Block decoder 1860 decodes 3 bits of address signals A18 and A20, and applies the result of decoding to 4 way decoders 1870a and 1870b. Only one 4 way decoder circuit out of eight 4 way decoder circuit #0 to #7 is activated. This corresponds to the structure of FIG. 44 in which only one 4 way decoder is activated. The decode signal from block decoder 1860 is also applied to the source line switch. Thus, the source line switch corresponding to the designated large memory block is set to the selected state.

Address signal bits A0 to A9 are applied to the row predecoder 1850. The row predecoder 1850 corresponds to predecoders 850 and 855 of the structure shown in FIG. 44. An internal address signal AX generated internally at the time of programming before erasure is applied to row predecoder 1850 (through an address determining circuit). The output of row predecoder 1850 is applied to 4 way decoders 1870a and 1870b as well as to row decoders 1890a to 1890d, as shown also in FIG. 44. Those applied to 4 way decoders 1870a and 1870b correspond to the output of predecoder 1850 shown in FIG. 44.

Address signal bits A16 and A17 are applied to a small block decoder 1810. Small block decoder 1810 is used for selecting one small memory block from four small memory blocks Bx0 to Bx3 included in the selected large memory block. The output from the small block decoder 1910 is applied to column decoders 1910a to 1910d as well as to source line switches 1930-0 to 1930-7. Consequently, in the selected large memory block, only the source line switch provided for the selected small memory block is activated. Column decoders 1910a to 1910b generate a column selecting signal only for the selected small memory block.

Address signal bits A10 to A15 are applied to column predecoder 1820. An output from column predecoder 1820 is applied to column decoders 1910a to 1910d. By an address signal of 6 bits, the column decoder simultaneously sets 8 bits of memory cells, that is eight Y gates to the selected state simultaneously, in the selected small memory block. The operation at the time of erasure will be described.

The erasing operation is carried out on the basis of small memory block. An operation of erasing for a block B00 will be described. At the time of erasure, all word lines are kept at "L". The source line switch provided corresponding to the small memory block B00 selected by block decoder 1860 and small block decoder 1810 is activated. At this time, the high voltage generated from the high voltage generating circuit is applied to the source line of the small memory block B00 through the source line switch circuit provided corresponding to the selected small memory block B00. In other small memory blocks, source lines are kept at the ground potential through the corresponding source line switches. Consequently, only in the block B00, a high electric field is applied between the control gate (word line) and the source of the memory cells. Electrons in the floating gate are extracted and thus erasure is completed.

As described above, even when collective erasure is carried out on the basis of small memory block, by setting the internal address signal INTAX to the both selected state by means of the address determining circuit and by applying the same as the address signal AX of the both selected state to row predecoder 1850 before erasure, a row redundancy circuit for repairing defective word lines can be used.

[Embodiment 7]

Figure 57:
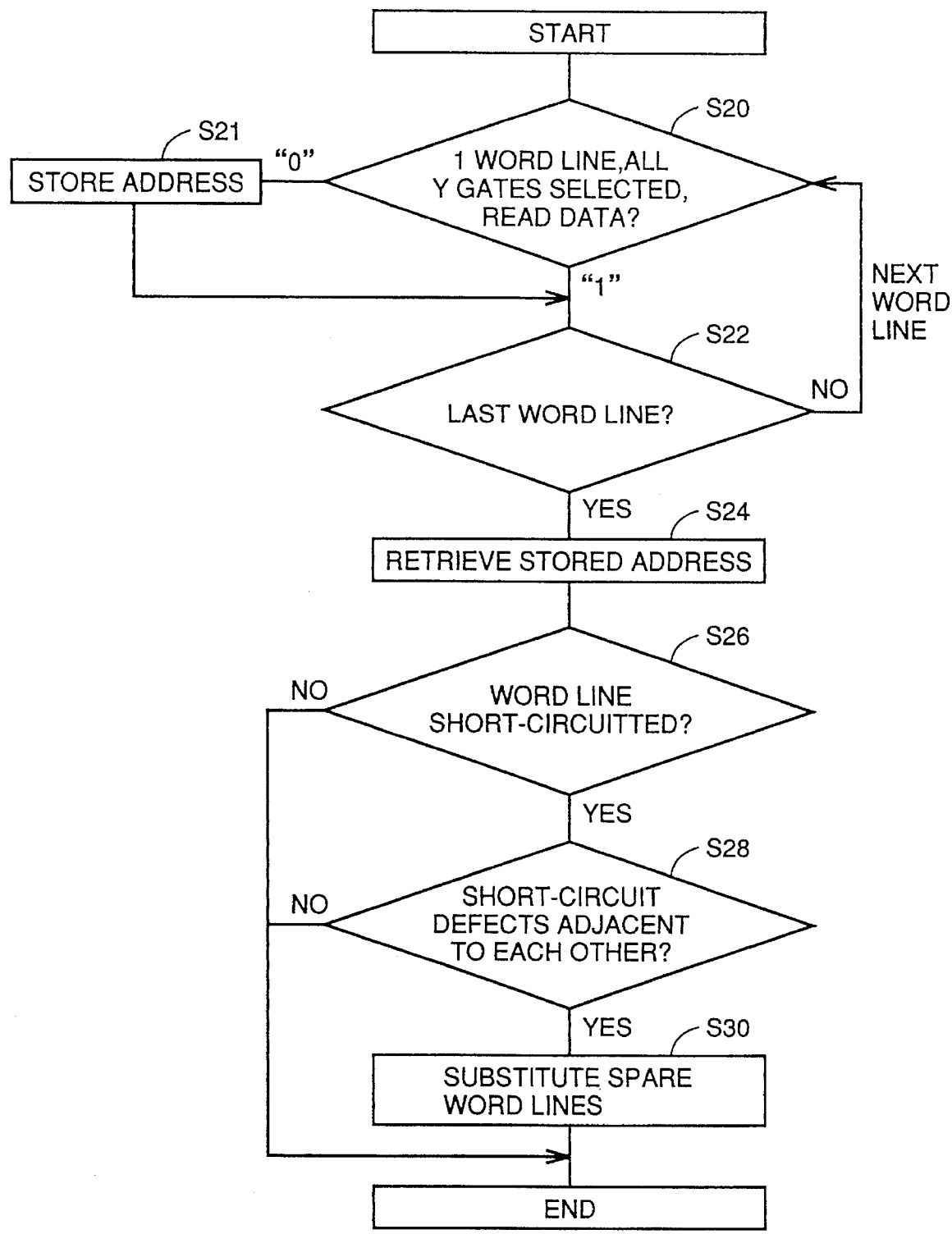
FIG. 57 is a flow chart showing a method of repairing a defective word line in the present invention.

FIG. 57 shows a structure of the column selecting portion of the memory array of a nonvolatile semiconductor memory device. The memory array of the nonvolatile semiconductor memory device shown in FIG. 54 corresponds to one IO block included in one small memory block of the nonvolatile semiconductor memory device shown in FIGS. 51 to 53. When the memory cell array has a x 8 bit structure, eight such array structures as shown in FIG. 54 are provided in one small memory block.

Figure 54:
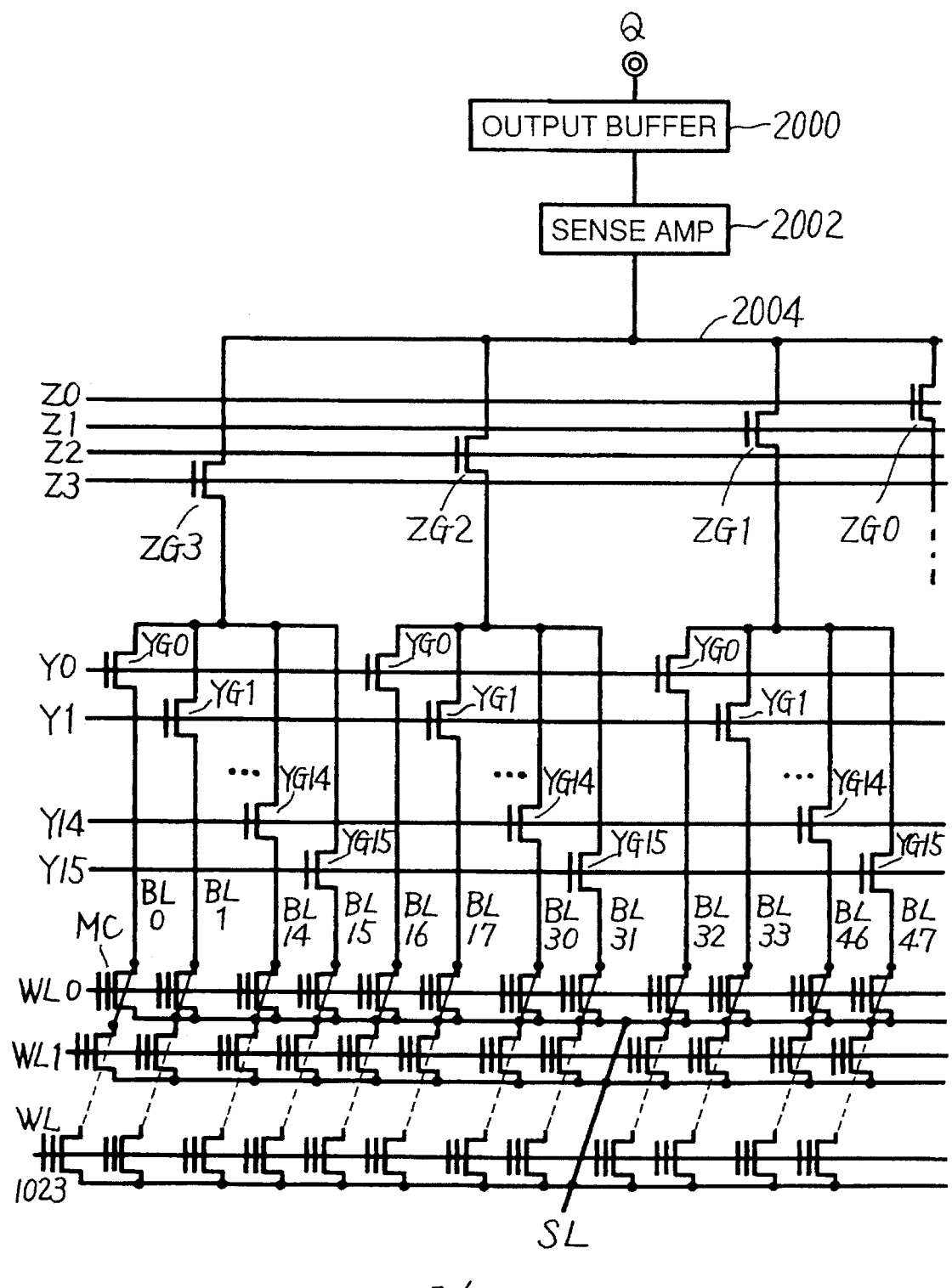
FIG. 54 schematically shows the internal structure of an IO block.

Referring to FIG. 54, the memory cell array includes a plurality of nonvolatile memory cells MC arranged in a matrix of rows and columns. For each row of the memory cells MC, word lines WL0 to WL1023 are arranged. To each of the word lines WL0 to WL1023, control gates of the memory cells of the corresponding row are connected.

Bit lines are arranged corresponding to respective columns of the memory cells MC. To each bit line BL, drains of the transistors of the corresponding column of memory cells MC are connected. 16 bit lines are arranged as one set. In order to select one bit line out of the set of 16 bit lines, Y gate transistors YG0 to YG15 are provided. To the gates of Y gate transistors YG0 to YG15, Y selecting signals Y0 to Y15 are applied. Therefore, Y gate transistor YGi is provided for every 16 bit lines. In the structure shown in FIG. 54, there are four sets of 16 bit lines.

In order to select one set of bit lines from four sets of bit lines, Z gate transistors ZG0 to ZG3 are provided. Z selecting signals Z0 to Z3 are applied to the gates of Z gate transistors ZG0 to ZG3. Z gate transistors ZG0 to ZG3 connect the selected bit lines to internal data lines 2004. Data on the internal data line 2004 is detected by a sense amplifier 2002, and a data signal indicative of the result of detection is applied to an output buffer 2000. Output data Q is provided from an output buffer 2000.

In the memory cell array, source lines are arranged parallel to the word lines WL3 to WL1023, and these source lines are connected to a main source line SL to be connected to a source line switch circuit provided corresponding to the memory cell array (small memory block).

Figure 55:
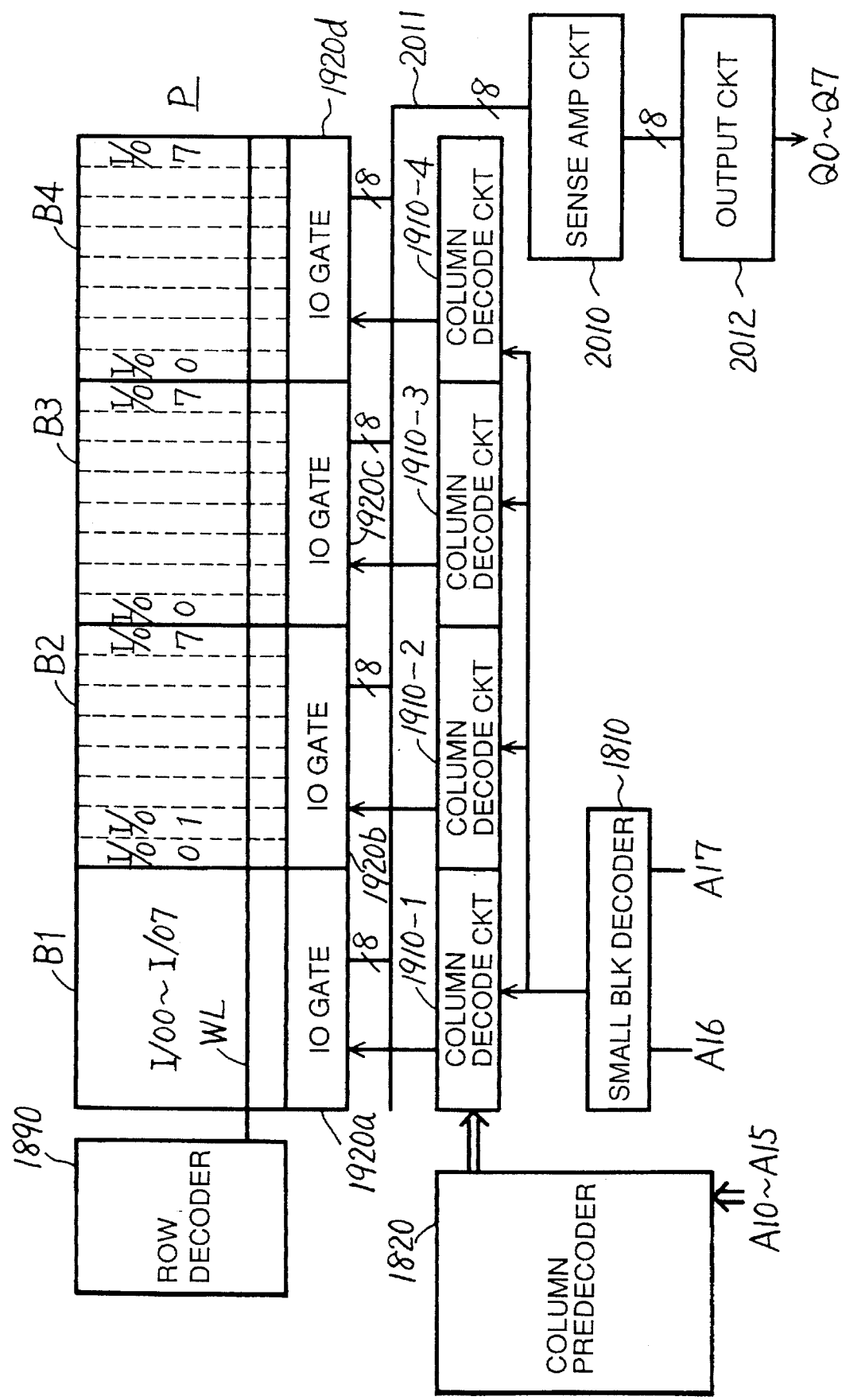
FIG. 55 shows schematically a structure of a circuit related to one large memory block.

FIG. 55 shows a structure of a portion related to one large memory block. The large memory block P includes four small memory blocks B1 to B4. Each of the small memory blocks B1 to B4 includes eight IO blocks I/O0 to I/O7. Word lines WL are shared by small memory blocks B1 to B4. A row selecting signal from row decoder 1890 is transmitted to the word line WL. IO gates 1920a, 1920b, 1920c and 1920d are provided for small memory blocks B1 to B4, respectively. Each of the IO gates 1920a to 1920d includes both the Z gate transistors and Y gate transistors shown in FIG. 54.

Column decode circuits 1910-1 to 1910-4 are provided corresponding to the small memory blocks, respectively. Each of the column decode circuits 1910-1 to 1910-4 is activated in response to the block selecting signal from small block decoder 1810, decodes the predecode signal applied from the column predecoder 1820, and selects 1 bit of memory cell from each of the IO blocks I/O0 to I/O7 in the corresponding small memory block (at normal operation). Small block decoder 1810 and column predecoder 1820 have similar structures as those shown in FIG. 51. Small block decoder 1810 decodes address signals A16 and A17, and generates a signal for selecting one small memory block out of four small memory blocks B1 to B4. Column predecoder 1820 predecodes address signals A10 to A15 and applies a predecode signal to column decode circuits 1910-1 to 1910-4.

The data of 8 bits of memory cells selected by IO gate 1920 (1920a–1920d) are applied to a sense amplifier circuit 2010 through an internal data bus 2011 having the width of 8 bits. Sense amplifier circuit 2010 includes eight sense amplifiers 2002 shown in FIG. 54. Internal read data of 8 bits is generated from sense amplifier circuit 2010. Output circuit 2012 buffers the 8 bits of internal read data from sense amplifier circuit 2010 and generates 8 bits of external read data Q0 to Q7.

Figure 56:
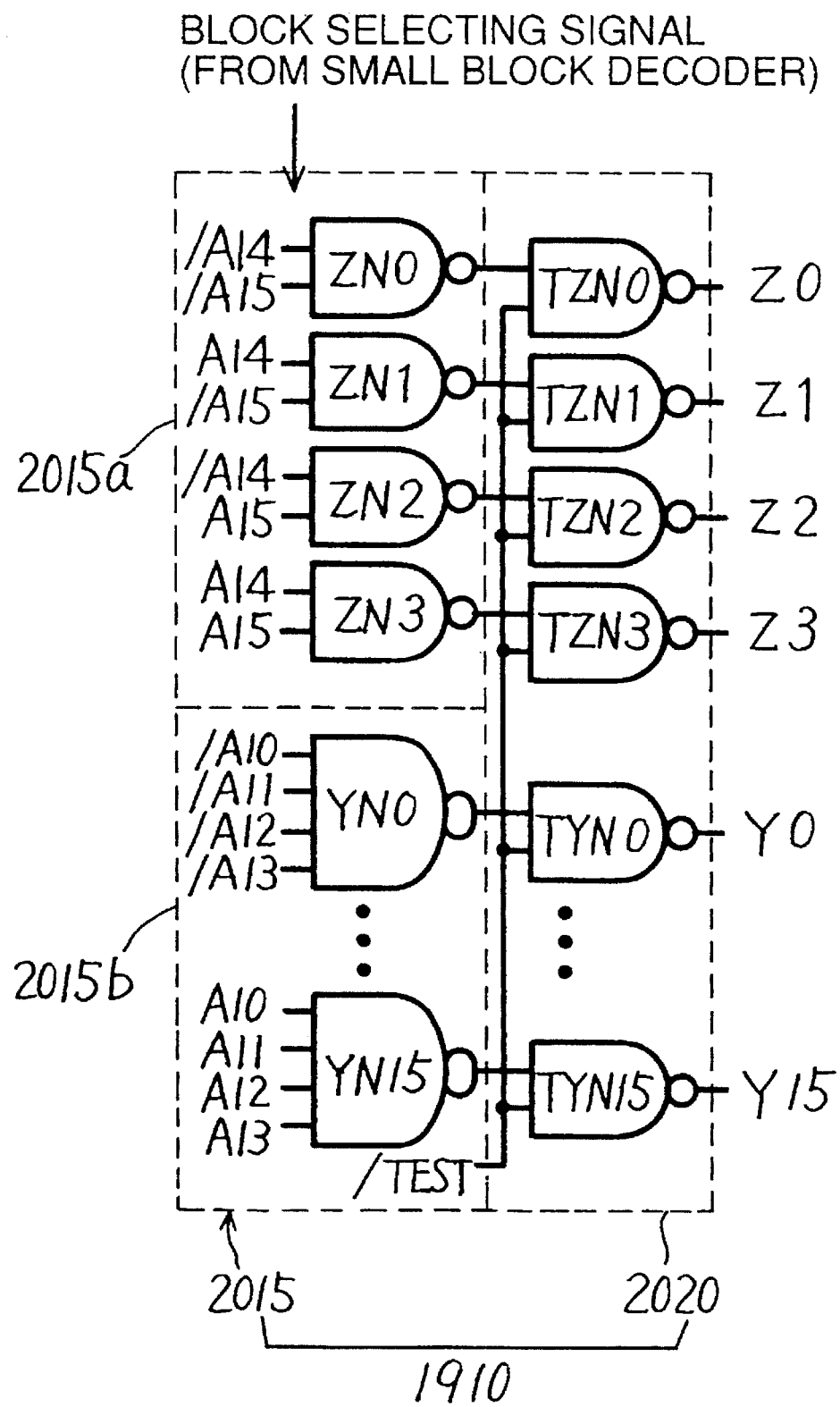
FIG. 56 shows a schematic structure of a column decode circuit shown in FIG. 55.

FIG. 56 shows a structure of a column decoder circuit provided corresponding to one small memory block shown in FIG. 1. Referring to FIG. 56, column decode circuit 1910 includes a decode stage 2015 for decoding address signals A10 to A15 as well as /A10 to /A15, and an output control stage 2020 for setting all outputs from the decode stage 2015 to the selected state in accordance with a test mode designating signal /TEST, which is activated (attains to the low level) in the test mode operation. To the column decode circuit 1910, the predecode signal is applied from column predecoder 1820 (see FIG. 55). However, in FIG. 56, in order to clarify correspondence between each of the address signals, Z signal and the Y signal, internal address signals from the address buffer are shown as applied to the decode stage 2015. Decode stage 2015 is activated in response to the block selecting signal from small block decoder 1810 shown in FIG. 55. For simplicity of drawings, the block selecting signal applied from small block decoder 1810 is shown only to be applied to the whole decode stage 2915.

Decode stage 2015a includes 2-input NAND gate ZN0 to ZN3 for decoding address signals A14 and A15.

NAND gate ZN0 is selected when address signals /A15 and /A15 are both "H", and it outputs a signal of "L". NAND gate ZN1 provides a signal of "L" when address signals A14 and /A15 are both at "H". When address signals A15 and /A14 are both "H", NAND gate ZN2 output a signal of "L". NAND gate ZN3 outputs a signal of "L" when address signals A14 and A15 are both at "H".

Y decode stage 2015b includes 16 4-input NAND gates YN0 to YN15 for selecting one of 16 Y gate transistors in accordance with address signals A10 to A13. NAND gate YN0 provides a signal at "L" when address signals /A10, /A11, /A12, and /A13 are all at "H". NAND gate YN15 provides a signal at "L" when address signals A10 to A13 are all at "H".

The block selecting signal is applied to the NAND gates ZN0 to ZN3 and YN0 to YN15. The block selecting signal attains to "H" when selected, and activates the decode stage 2015.

Output control stage 2020 includes 2-input NAND gates TZN0 to TZN3 and TYN0 to TYN15 provided for NAND gates ZN0 to ZN3 and YN0 to YN15 of the decode stage 2015, respectively. At one input of each of NAND gates TZN0 to TZN3 and TYN0 to TYN15, output from the corresponding NAND gates of the decode stage 2015 are applied, and at the other input, a test designation signal /TEST is applied commonly. Z selecting signals Z0 to Z3 are provided from NAND gates TZN0 to TZN3, respectively. Y selecting signals Y0 to Y15 are output from NAND gates TYN0 to TYN15, respectively.

In the output control stage 2020, when test mode designating signal /TEST is at "H", NAND gates TZN0 to TZN3 and TYN0 to TYN15 all function as inverters. When the test designating signal /TEST is at "L" designating the test mode operation, Z selecting signals Z0 to Z3 and Y0 to Y15 all attain "H" (regardless of the state of the block selecting signal). The operation of the circuit shown in FIGS. 54 to 56 will be described with reference to FIG. 57, which is a flow chart of the operation.

After the completion of manufacturing of the nonvolatile semiconductor memory device, at first whether word lines are defective or not is tested. At this state, memory cells MC (see FIG. 54) are all at the erased state, and the memory cell MC has a small positive threshold voltage Vth. At first, a test address is externally or internally generated. In accordance with the test address, a word line WL is set to the selected state in one large memory block T2 by row decoder 1890 shown in FIG. 55, in accordance with the test address. At this time, together with the word line selecting operation, the test mode designating signal /TEST is set to active "L". Consequently, as shown in FIG. 56, Z selecting signals Z0 to Z3 as well as Y selecting signals Y0 to Y15 are all set to "H", so that Z gate transistors ZT0 to ZT3 and Y gate transistors YG0 to YG15 are all rendered conductive. Consequently, data of all memory cells are read to the internal data bus line 2004. When there is no defect in the selected word line, the potential of the selected word line WL rises to the potential level, for example, of 5 V. Memory cells MC are all at the erased state. Therefore, there flows a read current through at least one memory cell, so that internal read data indicative of data "1" is generated from sense amplifier 2002 (see FIG. 54), and read data "1" is provided outside the device through output buffer 2000.

When there is a short-circuit defect at the selected word line WL, the potential of the selected word line WL cannot sufficiently be increased. Therefore, memory cells connected to the selected word line WL are all turned off, and there is no leak current flowing through the memory cells to any of the bit lines. Therefore, in that case, internal read data indicative of data "0" is output from sense amplifier 2002, and output data Q of "0" is provided through output buffer 2000 (step S20).

In the structure shown in FIG. 55, 8 bits of data Q0 to Q7 are output from sense amplifier circuit 2021 and output circuit 2012. When all of these 8 bits of data Q0 to Q7 are "0", it is considered that there is a short-circuit defect in the word line WL, and the address of the word line is stored (step S21). As for the storage of address of the defective word line, when the test address is externally applied, the address is stored in an external storage device. A structure may be used in order to determine the defect in which an NOR of the read data Q0 to Q7 output from output circuit 201 (see FIG. 55) is provided so as to determine presence/absence of a short-circuit defect of the word line.

When at least one of the read data Q0 to Q7 is "1", it is not a short-circuit defect of the word line, but may be a word line open-circuit defect. Therefore, whether or not the selected word line is the last word line is determined (step S22). At this time, also, after the step 21 for storing the address of the defective word line is completed, the determining operation of step S22 is carried out.

If it is not the last word line, the word line address is incremented or decremented to select the next word line, and the operation of step S20 is repeated.

In step S22, when it is determined to be the last word line, the address stored in step S21 is retrieved, and analysis of the stored address is carried out (step S24). Based on the result of retrieval and of analysis, whether or not there is a short-circuit defect of the word line is determined (step S26). When there is a short-circuit defect of the word line, the address of the defective word line is stored in step S21. Presence/absence of the short-circuit defect of the word line may be determined based on whether or not there is such stored address. A flag indicating a short-circuit defect of the word line may be set when the address of the defective word line is stored in step S21.

In step S26, when it is determined that there is not a short-circuit defect of the word line, this operation of detecting short-circuit defect of the word line is completed.

When it is determined that there is a short-circuit defect of the word line, the stored addresses are analyzed, and whether or not the short-circuit defects of the word line exist at adjacent word lines is determined (step S28). When there are a plurality of short-circuit defects of word lines and the defective word lines are not adjacent to each other, the nonvolatile semiconductor memory device is discarded as a defective product. This is because row redundancy for repairing word line can repair only the adjacent word lines, since adjacent four word lines are selected as one set by the row decoder. At this time when there is only one short-circuit defect of the word line, it is impossible to increase the potential of the word line at which the short-circuit defect occurs because the short-circuit is that to the ground, and therefore the nonvolatile semiconductor memory device is discarded as a defective product, in this case also. When there are short-circuit defects at adjacent word lines, the word lines are replaced by spare word lines (step S30). This substitution is carried out by using the repair address setting circuit and repair use fuse shown in FIG. 25. Whether or not the short-circuit defects are on adjacent word lines can be readily recognized from physical addresses. If the short-circuit defects on adjacent word lines are not a short-circuit between adjacent word lines, the memory can be identified as defective in subsequent read/write test of the memory cell data.

By the above described series of operations, testing operation of short-circuit defect of word lines is completed. Other than in the test operation for detecting short-circuit defects of word lines, the test operation mode designating signal /TEST is set to "H". At this state, column decode circuit 1910 selects one bit line (per 1 IO block) in accordance with the applied address signals A10 to A15.

In accordance with this method of detecting a short-circuit defects of the word lines, short-circuit defect of the word line can be detected by carried out by data reading once per one word line, and therefore the time necessary for the test can be significantly reduced.

The test operation mode designation signal /TEST may be set to the active "L" during the operation for detecting the short-circuit defect of the word lines. When determination as to whether there is a short-circuit defect is done after data reading and there is a period in which word lines are all set to the non-selected state until the address is stored in accordance with the result of determination, the test mode designating signal /TEST may be activated in synchronization with the word line selecting operation. When an external address is used, the test mode designating signal /TEST may be set to the active state of "L" in synchronization with the application of the test address.

As a matter of course, in the test for detecting short-circuit defect of word lines, in one large memory block P, source lines SL (see FIG. 54) are all connected to the ground potential through the source line switches. The output from the small block data shown in FIG. 51 are all set to the selected state at the testing operation. This can be implemented by similar structure as that shown in FIG. 56.

Figure 58:
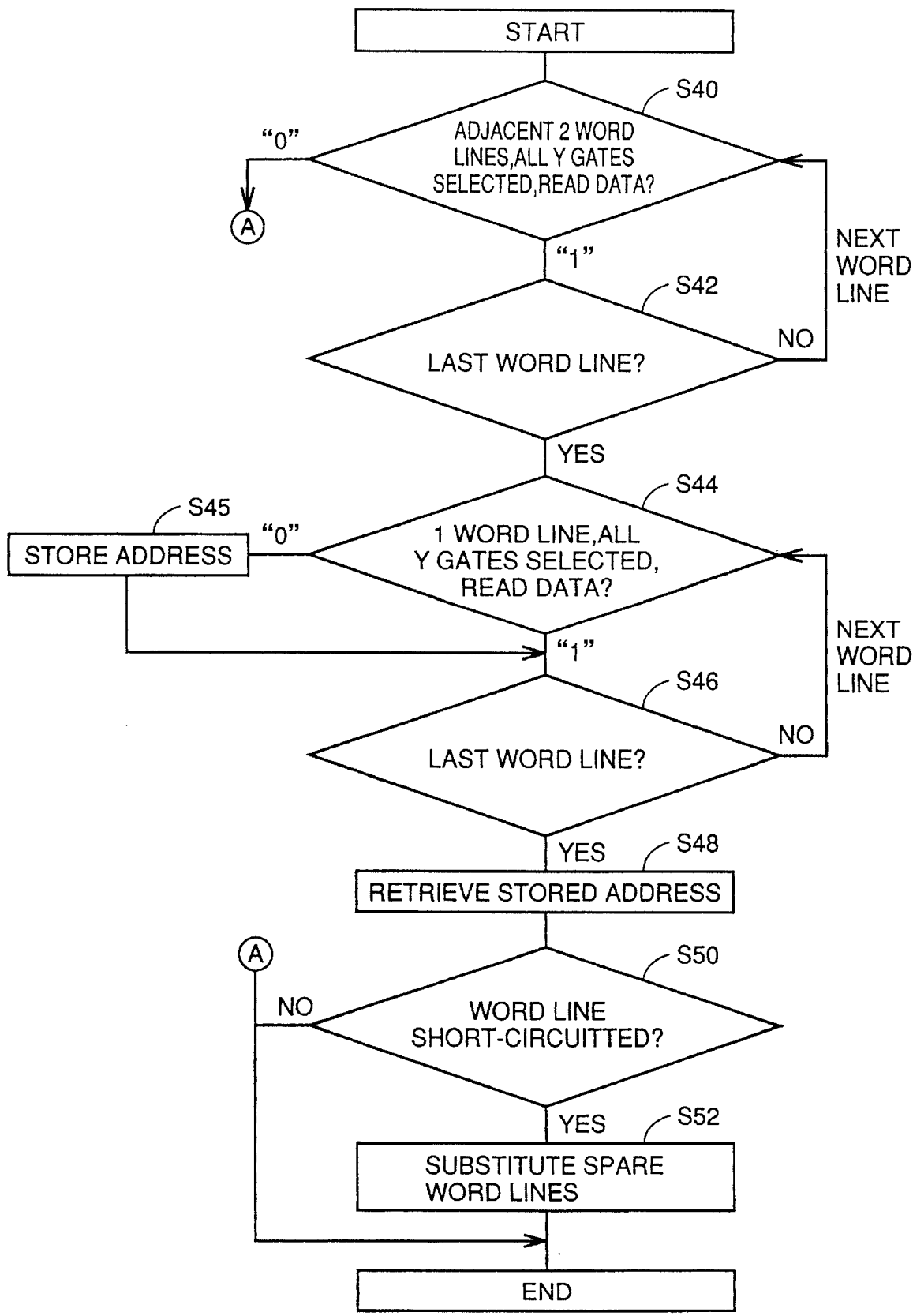
FIG. 58 shows another flow of operation for repairing a defective word line in the present invention.
Figure 59:
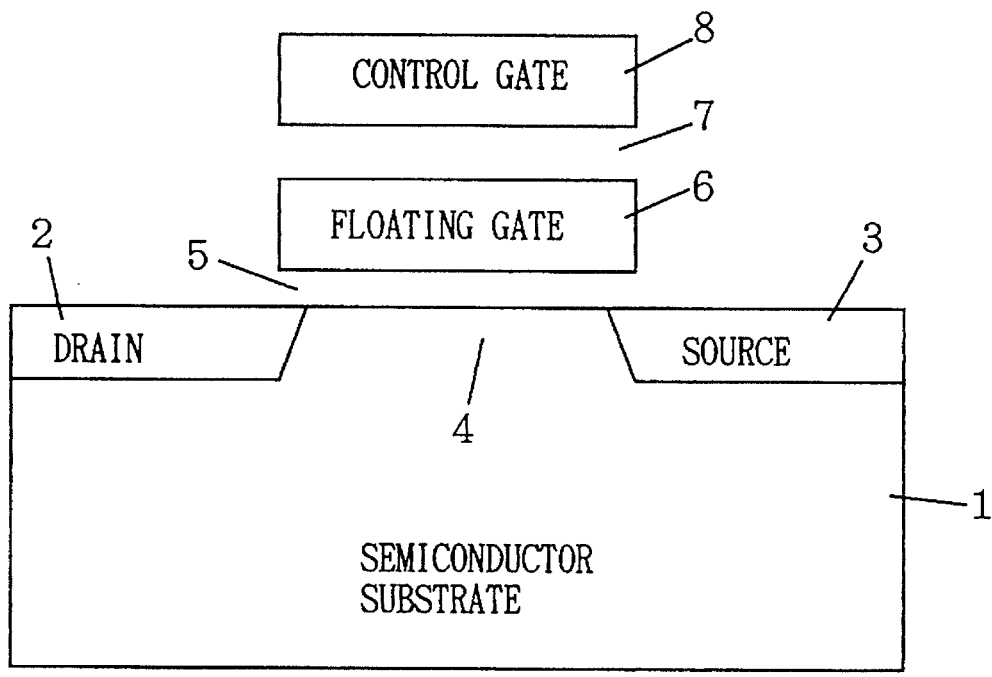
FIG. 59 schematically shows a cross sectional structure of a conventional nonvolatile memory cell.
Figure 60:
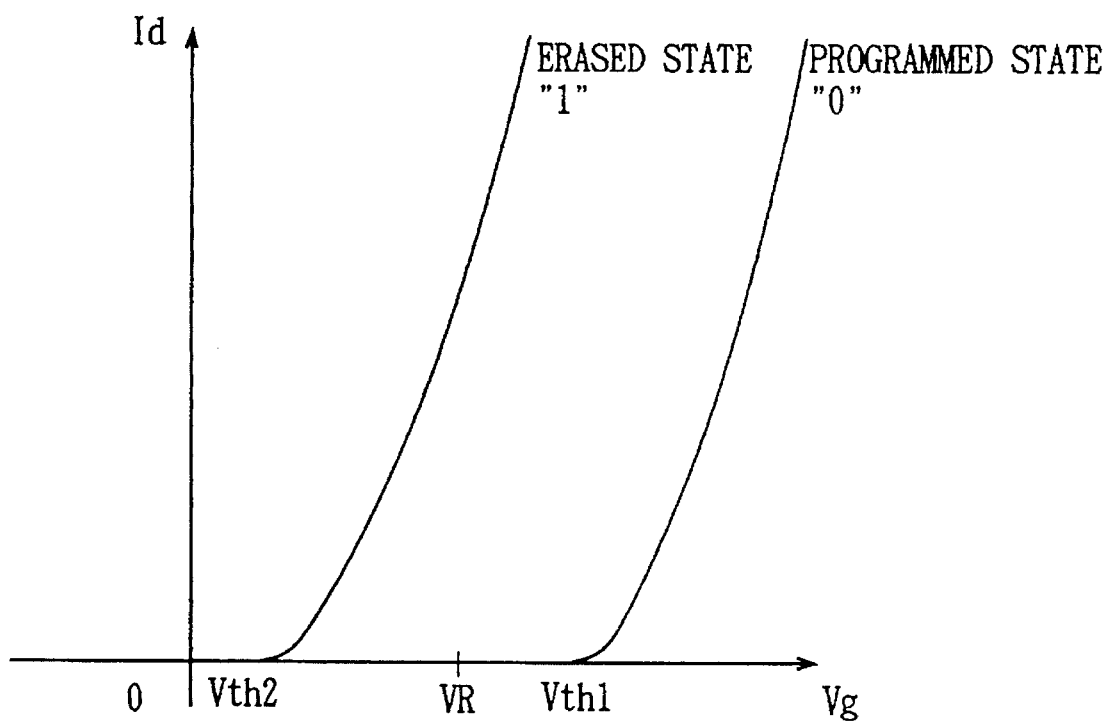
FIG. 60 shows a manner of storing information in a conventional nonvolatile memory cell.

FIG. 58 shows another method of detecting a defect of word line. The operation for detecting short-circuit defect of the word lines will be described with reference to FIG. 58.

In the operation for detecting short-circuit defect of word lines shown in FIG. 58, two adjacent word lines are simultaneously set to the selected state. Y gate transistors and Z gate transistors are all rendered conductive. This is similar to the flow of operation shown in FIG. 57. As in the flow of FIG. 57, data is read at this state, and whether the read data is "0" or "1" is determined (step S40). When two adjacent word lines are simultaneously selected and there is no short-circuit between these two adjacent word lines, a current flows through at least 1 bit of memory cell. Therefore, in this case, the read data will be "1". If the read data Q (Q0 to Q7) is "0", it means that both of the adjacent two word lines are short-circuited with other signal line or the ground line. In that case, word lines cannot be repaired. Therefore, when data "0" is read, the nonvolatile semiconductor memory device is discarded as a defective product.

When data "1" is read, it is determined whether or not these two selected word lines include the last word line (step S42). If the last word line has not yet been selected, the word line address is again incremented or decremented, and the operation of step S40 is repeated.

In step S42, when it is determined that the last word line is selected, word lines are selected one by one thereafter. More specifically, when adjacent two word lines are selected simultaneously and then all IO gates are rendered conductive simultaneously for reading data, if data "1" is read in every set of adjacent two word lines, it means that at least one of the selected word lines has its potential raised. Namely, by the operations of steps S40 and S42, nonvolatile semiconductor memory device having word line defect which cannot be repaired is identified and excluded.

In step S44, one word line is selected as in the flow of FIG. 57, IO gates are all selected simultaneously, data is read and whether the read data is "0" or "1" is determined. If data "0" is read, the address of the word line is stored (step S45). After steps S44 and S45, whether or not the last word line has been selected is determined (step S46). If it is not the last word line, the flow returns to the step S44, and the next word line is selected and all IO gates (Y gates) are rendered conductive.

In step S46, if it is determined that the last word line has been selected, the flow proceeds to step S48 in which the stored address is retrieved (S48).

Thereafter, whether or not there is a short-circuit defect of word lines is determined (S50). More specifically, when there is not an address of the defective word line stored, there is not a short-circuit defect of word lines which means that the nonvolatile semiconductor memory device is acceptable, and therefore detection of short-circuit defect of word lines and repair of word lines are not necessary. Thus, the testing operation is completed.

Meanwhile, if there is a short-circuit defect and the word lines including the defect are adjacent to each other, it means that the adjacent word lines are short-circuited between each other. Therefore, the addresses of the word lines suffering from short-circuits between them can be specified without complicated analysis of the stored address. By using the specific addresses of defective word lines, replacement by the spare word line is carried out (step S52). Other short-circuit defects of word line cannot be repaired, and therefore the device is discarded as defective product.

As for the method of simultaneously selecting two adjacent word lines in step S40, the method shown in Embodiments 1 to 5 may be directly applied. In steps S40 and S42, it is not necessary to specify the address of the defective word line, and what is necessary is only to read data by selecting word line by using address counter. In steps S44 to S52, word lines are successively selected one by one. Therefore, in this example, a structure in which address is generated by using a common binary counter is utilized.

In the structure shown in FIG. 58 also, it is not necessary to determine whether or not there is short-circuit defect between adjacent word lines by analyzing the addresses of the defective word lines. Since IO gates (Y gates and Z gates) are all selected simultaneously, whether or not the word lines are defective or not can be determined at high speed.

As described above, according to the present invention, since a plurality of adjacent word lines (including spare word line and normal word lines) are selected simultaneously in a prescribed operation mode such as programming before erasure, even those memory cells on a defective word line can be programmed before erasure. Consequently, the problem of over erasure of memory cells of the defective word line can be solved. A redundant structure in which defective word lines are replaced by spare word lines can be utilized for the word lines, and therefore production yield can be significantly improved.

In accordance with the present invention, since IO gates are all selected simultaneously and whether the word line is defective or not is detected in accordance with the value of the read data, short-circuit defect of the word line can be detected at high speed. This enables replacement of the defective word lines by spare word lines, which leads to significant improvement of the production yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined normal operation mode designation signal for selecting and driving into a selected state always at least two, but not all physically adjacent word lines simultaneously, the physically adjacent word lines each having an entire portion thereof driven into the selected state.

2. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state at least two physically adjacent word lines simultaneously, wherein said word line selection means includes address generation means for generating a row address signal designating a word line, address conversion means in response to said predetermined operation mode designating signal for converting said row address signal into a converted address signal designating a plurality of physically adjacent word lines at a time, and decode means for decoding said converted address signal to generate word line selection signals specifying word lines designated by said converted address signal.

3. The device according to claim 2, wherein said word lines have multi-bit row addresses such that row addresses of any two physically adjacent word lines have k bits different in value, where k is a natural number, and said address conversion means includes means for identifying positions of said k bits in said row address signal comprised of multi address bits to set the identified k bits into an invalidated state in which true and complementary address bits of an address bit are set into an active state.

4. The device according to claim 1, wherein said predetermined operation mode designation signal is activated in a programming before erasure mode of operation in which a threshold voltage of a floating gate type nonvolatile memory cell transistor is once shifted to a higher voltage side before extracting electrons from a floating gate of every active floating gate type memory cell transistor.

5. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state at least two physically adjacent word lines simultaneously, wherein each of said word lines has a multi-bit row address allotted thereto in such a manner that Hamming distance between row addresses of any two physically adjacent word lines is 1, and wherein said word line selection means includes address generation means for generating a multi-bit row address of complementary bits having a pair of complementary bits having the same logical value at a particular bit position, and decode means for decoding the multi-bit row address signal to generate a row designation signal designating a corresponding word line.

6. The device according to claim 5, wherein said address generation means includes counter means for counting a clock to generate a multi-bit row address signal, and control means responsive to a count up signal from said counter means for setting a particular count bit to an invalid state in which complementary bits of the particular count bit are both set to a logical true state.

7. The device according to claim 6, wherein said control means includes means for setting a next lower order count bit adjacent to the particular count bit to the logical true state and for setting a second next lower order count bit adjacent to the next lower order count bit to a logical false state.

8. The device according to claim 5, wherein said address generation means includes;

a plurality of signal generators provided corresponding to row address bits and each responsive to a first clock for latching and outputting data of a logical product of outputs of two lower order adjacent signal generators, a plurality of control signal generators provided corresponding to the row address bits and each responsive to outputs of a corresponding and two successively adjacent lower order signal generators for generating a control signal determining a state of a corresponding address bit;

a plurality of incrementors provided corresponding to the row address bits and each responsive to an output of the signal generator corresponding to two bit lower order row address bit and to an output of an incrementor at one bit lower order position for generating a second clock as the output thereof and responsive to a second clock from a one bit lower order incrementor for generating an internal address bit, and a plurality of address determinators provided corresponding to the row address bits and each responsive to a control signal from a corresponding control signal generators for modifying an internal address bit from a corresponding incrementor to generate complementary row address bits.

9. The device according to claim 8, wherein a true address bit of the most significant complementary row address bits is supplied as said first clock.

10. The device according to claim 8, further comprising an extra signal generator receiving logical true state signals at inputs and responsive to said first clock for providing an output to incrementors at the least and next least significant row address bits, and wherein the signal generator at the least significant row address bit receives the logical true state signal and the output of said extra signal generator.

11. The device according to claim 8, wherein each signal generator includes:

an input latch responsive to a first level of the first clock for receiving data of the logical product and responsive to a second level of the first clock for latching the received data, and an output latch responsive to the second level of the first clock for receiving and outputting data from the input latch and responsive to the first level of the first clock for latching the received data for outputting.

12. The device according to claim 8, wherein each of said incrementors includes a divider for dividing by 2 a frequency of the second clock to generate the internal row address bit.

13. The device according to claim 12, wherein said divider includes a latch responsive to the second clock for latching an inversion of an output thereof.

14. The device according to claim 13, wherein said latch includes;

an input latch responsive to a first level of the second clock for receiving the inversion of the output and responsive to a second level of the second clock for latching the received signal, and an output latch responsive to the first level of the second clock for receiving and outputting the signal from the input latch and responsive to the second level of the second clock for latching and outputting the received signal.

15. The device according to claim 8, wherein each of said control signal generators includes;

a first gate for performing a negative logical sum operation on outputs of the corresponding and one bit lower order signal generators, a second gate for performing a negative logical product operation on outputs of said first gate and the two bit lower order signal generator to generate a first control signal for setting both complementary address bits to the logical true state, a third gate for performing a negative logical product operation on the outputs of associated three signal generators to generate a second control signal for setting a corresponding true address bit to a logical false state, and a fourth gate for performing the negative logical product operation on an inversion of the output of the corresponding signal generator and outputs of the two associated lower order signal generators to generate a third control signal for setting the corresponding true address bit to a logical true state.

16. The device according to claim 5, wherein said plurality of word lines includes normal word lines and redundant word lines for repairing a defective normal word line, and wherein said word line selection means further includes;

determination means for determining whether an applied address signal designates a redundant word line, first selection means responsive to said predetermined operation mode designating signal for selecting physically adjacent redundant word lines simultaneously while ignoring the output of said determination means and inhibiting operation of selecting a normal word line, and second selection means responsive to the multi-bit row address signal for selecting and driving to an active state corresponding normal word lines while inhibiting the operation of said first selection means.

17. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state at least two physically adjacent word lines simultaneously, further comprising another word line selection means provided separately from said word line selection means for selecting a word line according to an external row address in an operation mode other than said predetermined operation mode.

18. The device according to claim 5, wherein said word line selection means further includes;

first predecode means operating with a first level potential as an operating power supply potential, for predecoding the multi-bit row address signal to generate a predecoded signal, second predecode means operating with a second level potential higher than said first level potential as an operating power supply potential, for predecoding a predetermined number of least significant bits of said multi-bit row address signal to generate a predecode/drive signal of multi-bits, decoder means operating with the second level potential as an operating power supply potential for decoding the other bits of the multi-bit row address signal to generate a row group designation signal, and drive means responsive to said row group designation signal for transferring different bits of said predecode/drive signal onto different word lines in the designated row group.

19. The device according to claim 18, further comprising boost means responsive to said predetermined operation mode designating signal for generating a boosted high voltage higher than a normal operating power supply potential to said drive means so that said drive means drives corresponding word lines to said boosted high voltage.

20. The device according to claim 19, wherein each said memory cell includes one and another spaced apart impurity regions formed on a semiconductor substrate region, and wherein said device further includes means for applying a reference low level potential to said substrate region while holding said one and another impurity regions in an electrically floating state.

21. The device according to claim 20, wherein said reference low level potential is a negative potential.

22. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state always at least two physically adjacent word lines simultaneously, wherein said word line selection means includes:

a plurality of internal nodes provided corresponding to said plurality of word lines, means responsive to said predetermined operation mode designating signal for setting respective internal nodes to a selected state potential level, and drive means provided corresponding to said plurality of word lines and responsive to the selected state potential of corresponding internal nodes for driving corresponding word lines to a selected state.

23. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state always at least two physically adjacent word lines simultaneously, wherein said word line selection means includes;

a plurality of shift latch means provided corresponding to said plurality of word lines and responsive to a clock for latching data and shifting latched data to shift latch means adjacent in a predetermined direction, drive means provided corresponding to said plurality of word lines and responsive to latch data in corresponding shift latch means for driving corresponding word lines to a selected state, and means responsive to said predetermined operation mode designation signal for setting data indicating a selected state into a predetermined number of successively adjacent shift latch means.

24. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state always at least two physically adjacent word lines simultaneously, said at least two physically adjacent work lines each having an entire portion thereof driven into the select state, wherein said predetermined operation mode is a test mode of operation for detecting a defective word line.

25. The device according to claim 24, further including means responsive to said predetermined operation mode designating signal for simultaneously selecting all the columns intersecting the selected word line to simultaneously read data thereon.

26. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state at least two physically adjacent word lines simultaneously, wherein said word line selection means includes, counter means for generating a multi-bit address signal, logical/physical conversion means for converting said multi-bit address signal into a binary coded multi-bit address signal regarding said multi-bit address signal as a gray coded address signal, increment means for incrementing the binary coded address signal by one, physical/logical conversion means for converting the incremented binary coded address signal into a gray coded incremented address signal, detection means for detecting a bit position different in value between said multi-bit address signal from said counter means and said gray coded address signal from said physical/logical conversion, address determination means responsive to said detection means for setting a bit at said bit position detected by detection means in said multi-bit address signal into a both selected state in which bits complementary to each other are brought into a selected state, to generate a multi-bit address signal of complementary bits, decode means for decoding said multi-bit address signal of complementary bits to generate a word line selecting signal, and drive a selected word line into a selected state.

27. The device according to claim 26, wherein said increment means includes carry generation means for generating carries for respective digits of addition of said binary coded address signal and said one, and said physical/logical conversion means and detection means comprise non-coincidence detection means for detecting non-coincidence between carries of adjacent digits to detect said bit position.

28. A nonvolatile semiconductor memory device, comprising:

a plurality of nonvolatile memory cells arranged in rows and columns;

a plurality of word lines provided corresponding to said rows, each said word line connecting nonvolatile memory cells arranged on a corresponding row; and word line selection means responsive to a predetermined operation mode designation signal for selecting and driving into a selected state at least two physically adjacent word lines simultaneously, wherein said memory cells are divided into a plurality of blocks, and each said block includes a source line commonly connecting sources of memory cell transistors included therein.

29. The device according to claim 28, wherein each of said source lines are separately and independently provided.

30. A nonvolatile semiconductor memory device, comprising:

a plurality of word lines each having such an address allotted thereto that Hamming distance between addresses of any successively adjacent word lines is 1;

a plurality of bit lines arranged crossing with said plurality of word lines;

a plurality of memory cells arranged at respective crossings of said word lines and said bit lines, each said memory cell comprising a memory transistor having a first state in which the memory transistor maintains non-conductive regardless of selection and non-selection of an associated word line in a normal operation mode;

word line selection means for simultaneously selecting a plurality of successively adjacent word lines, said word line selection means including means for generating a row address signal bits with a selected address signal bit invalidated;

bit line selection means responsive to a column address signal for selecting a bit line; and means for bringing a memory transistor of memory cell at each crossing of the selected word lines and the selected bit line.

31. A nonvolatile semiconductor memory device, comprising:

a plurality word lines arranged in a row direction;

a plurality of bit lines arranged in a column direction;

a plurality of memory cells arranged at respective crossings of said word lines and said bit lines, each said memory cell comprising a memory transistor having a first state in which the memory transistor maintains non-conductive even when an associated word line is brought into a selected state in a normal operation mode;

row decode means having a plurality of output nodes and responsive to an address signal for generating a word line selecting signal for selecting a word line;

signal generation means provided corresponding to the outputs nodes of said row decoder means and activated in a predetermined operation mode different from said normal operation mode for generating a signal for bringing a set of successively adjacent word lines into a selected state sequentially on a set-by-set basis, instead of outputs of said row decoder means;

word line drive means responsive to an output of one of said signal generation means and said row decoder means for driving a word line into a selected state;

bit line selection means responsive to a column address signal for selecting a bit line; and means for transferring onto the word line driven by said drive means and the bit line selected by said bit line selection means voltage bringing the memory transistor into the first state in said predetermined operation mode.

32. A nonvolatile semiconductor memory device, comprising:

a plurality of word lines;

a plurality of bit lines arranged crossing said plurality of word lines;

a plurality of memory cell transistors arranged at respective crossings of said word lines and said bit lines each said memory cell transistor having a first state in which the memory cell transistor maintains non-conductive even when an associated word line is selected in a normal operation mode;

first word line selection means responsive to a row address signal for selecting a word line;

bit line selection means responsive to a column address signal for selecting a bit line;

second word line selection means provided separately from said first row selection means and for simultaneously selecting successively adjacent word lines in a predetermined operation mode different from said normal operation mode; and means for bringing a memory cell transistor at a crossing of a word line selected by said second word line selection means and a bit line selected by said bit line selection means into the first state in said predetermined operation mode.

33. A nonvolatile semiconductor memory device, comprising:

a plurality of nonvolatile memory cells arranged in rows and columns;

a plurality of word lines arranged corresponding to said rows, each said word line connecting nonvolatile memory cells on a corresponding row;

address conversion means operating with a first level voltage as an operating power supply voltage, for converting an address signal such that adjacent word lines are simultaneously selected in a first operation mode; and drive means for selecting and driving into a selected state a word line in response to an output of said address conversion means, said drive means including means operating with a second level voltage in said first operation mode and with the first level voltage in a second operation mode as an apparition power supply voltage, for level converting a signal received from the address conversion means and transmitting onto the selected word line a level converted signal.

34. A nonvolatile semiconductor memory device, comprising:

a plurality of memory cells arranged in a matrix of rows and columns;

a plurality of word lines provided corresponding to said rows, to each of which memory cells of a corresponding row are connected and to each of which a gray coded address is allotted in incrementing or decrementing manner;

address generating means for generating a gray coded address signal at a prescribed operation mode;

converting means for converting the gray coded address signal generated by said address generating means such that a plurality of physically adjacent word lines are designated simultaneously; and means for decoding an output from said converting means and for driving a corresponding word line to a selected state.

35. A nonvolatile semiconductor memory device, comprising:

a plurality of memory cells arranged in a matrix rows and columns;

a plurality of word lines arranged corresponding to said rows, to each of which memory cells of a corresponding row are connected;

a plurality of bit lines arranged corresponding to said columns, to each of which memory cells of a corresponding column are connected;

word line selection means for selecting a word line in accordance with an address signal;

means for simultaneously selecting and connecting to an internal data line at least two bit lines of said plurality of bit lines in a test operation mode; and means for reading a data signal on said internal data line.

36. The nonvolatile semiconductor memory device according to claim 35, wherein said word line selecting means includes means for simultaneously selecting a plurality of physically adjacent word lines in said test operation mode.

37. The device according to claim 22, further comprising boost means responsive to said predetermined operation mode designating signal for generating a boosted high voltage higher than a normal operating power supply potential to said drive means so that said drive means drives corresponding word lines to said boosted high voltage.

38. The device according to claim 22, wherein each said memory cell includes one and another spaced apart impurity regions formed on a semiconductor substrate region, and wherein said device further includes means for applying a reference low level potential to said substrate region while holding said one and another impurity regions in an electrically floating state.

39. The device according to claim 38, wherein said reference low level potential is a negative potential.

* * * * *